(12) United States Patent
Ryan et al.

(10) Patent No.: US 11,562,284 B1
(45) Date of Patent: Jan. 24, 2023

(54) GATE FORMATION FOR A QUANTUM PROCESSOR

(71) Applicant: Rigetti & Co, LLC, Berkeley, CA (US)

(72) Inventors: Colm Andrew Ryan, Albany, CA (US); Eric Christopher Peterson, Miami, FL (US); Marcus Palmer da Silva, Lafayette, CA (US); Michael Justin Gerchick Scheer, Oakland, CA (US); Deanna Margo Abrams, Oakland, CA (US)

(73) Assignee: Rigetti & Co, LLC, Berkeley, CA (US)

( * ) Notice: Subject to any disclaimer, the term of this patent is extended or adjusted under 35 U.S.C. 154(b) by 257 days.

(21) Appl. No.: 17/074,124

(22) Filed: Oct. 19, 2020

Related U.S. Application Data

(60) Provisional application No. 62/944,494, filed on Dec. 6, 2019, provisional application No. 62/923,275, filed on Oct. 18, 2019.

(51) Int. Cl.
  *G06N 10/00* (2022.01)
  *H03K 19/195* (2006.01)
  (Continued)

(52) U.S. Cl.
  CPC .......... *G06N 10/00* (2019.01); *G06F 9/4843* (2013.01); *G06F 16/2379* (2019.01); *H03K 19/195* (2013.01)

(58) Field of Classification Search
  CPC ... G06F 9/4843; G06F 16/2379; G06N 10/00; H03K 19/195
  See application file for complete search history.

(56) References Cited

U.S. PATENT DOCUMENTS

| | | | |
|---|---|---|---|
| 10,862,465 B1 * | 12/2020 | Cohen | G06N 10/00 |
| 11,108,398 B2 * | 8/2021 | Sete | H03K 19/195 |
| 2021/0232960 A1 * | 7/2021 | Scott N. | G06N 10/00 |

OTHER PUBLICATIONS

McKay, David C., et al., "A universal gate for fixed-frequency qubits via a tunable bus", arXiv:1604.03076v3 [quant-ph], Dec. 19, 2016, 12 pages.

(Continued)

*Primary Examiner* — Kurtis R Bahr
(74) *Attorney, Agent, or Firm* — Henry Patent Law Firm PLLC

(57) ABSTRACT

In a general aspect, a gate is formed for a quantum processor. In some implementations, an arbitrary program is received. The arbitrary program includes a first sequence of quantum logic gates, which includes a parametric XY gate. A native gate set is identified, which includes a set of quantum logic gates associated with a quantum processing unit. A second sequence of quantum logic gates corresponding to the parametric XY gate is identified, which includes a parametric quantum logic gate. Each of the quantum logic gates in the second sequence is selected from the native gate set. A native program is generated. The native program includes a third sequence of quantum logic gates. The third sequence of quantum logic gates corresponds to the first sequence of quantum logic gates and includes the second sequence of quantum logic gates. The native program is provided for execution by the quantum processing unit.

33 Claims, 18 Drawing Sheets

(51) Int. Cl.
　　　*G06F 9/48*　　　(2006.01)
　　　*G06F 16/23*　　(2019.01)

(56) References Cited

OTHER PUBLICATIONS

McKay, et al., "Universal Gate for Fixed-Frequency Qubits via a Tunable Bus", Phys. Rev. Applied 6, 064007, 2016, 10 pgs.
Merkel, et al., "Self-consistent quantum process tomography", Phys. Rev. A 87, Jun. 24, 2013, 9 pgs.
Merkel, et al., "Self-Consistent Quantum Process Tomography", arxiv:1211.0322v1, Nov. 1, 2012, 10 pgs.
Mundada, et al., "Suppression of Qubit Crosstalk in a Tunable Coupling Superconducting Circuit", arxiv:1810.04182v2, May 31, 2019, 11 pgs.
Naik, et al., "Publisher Correction: Random access quantum information processors using multimode circuit quantum alectrodynamics". Nature Communications 9, 172, Dec. 4, 2017, 1.
Naik, R. K., et al., "Random access quantum information processors", arXiv:1705.00579v1 [quant-ph], May 1, 2017, 7 pages.
Niskanen, et al., "Quantum Coherent Tunable Coupling of Superconducting Qubits", Science 316, 723, 2007, 5 pgs.
O'Gorman, et al., "Generalized swap networks for near-term quantum computing", arxiv:1905.05118v1, May 13, 2019, 16 pgs.
Otterbach, "Unsupervised Machine Learning on a Hybrid Quantum Computer", arXiv:1712.05771v1, Dec. 15, 2017, 17 pgs.
Paz-Silva, et al., "Fault Tolerance with Noisy and Slow Measurements and Preparation", Physical Review Letters 105, 100501, Sep. 2010, 4 pgs.
Peterson, et al., "Fixed-Depth Two-Qubit Circuits and the Monodromy Polytope", arxiv:1904.10541v1, Apr. 23, 2019, 24 pgs.
Preskill, "quantum Computing in the NISQ era and beyond", arXiv:1801.00862v2, Jan. 27, 2018, 22 pgs.
Preskill, "Quantum Computing in the NISQ era and beyond", Quantum, vol. 2, pp. 79, Jul. 30, 2018, 21 pgs.
Qiang, et al., "Large-scale silicon quantum photonics implementing arbitrary two-qubit processing", Nature photonics 12, Aug. 20, 2018, 6 pgs.
Qiang, et al., "Large-scale silicon quantum photonics implementing arbitrary two-qubit processing", arxiv:1809.09791v1, Sep. 26, 2018, 23 pgs.
Reed, et al., "Realization of three-qubit quantum error correction with superconducting circuits", Nature 482, Feb. 16, 2012, 4 pgs.
Reed, et al., "Realization of Three-Qubit Quantum Error Correction with Superconducting Circuits", arxiv:1109.4948v1, Sep. 22, 2011, 10 pgs.
Roth, et al., "Analysis of parametrically driven exchange-type (iSWAP) and two-photon (bSWAP) interactions between superconducting qubits", arxiv:1708.02090v1, Aug. 7, 2017, 10 pgs.
Roth, et al., "Analysis of parametrically driven exchange-type (iSWAP) and two-photon (bSWAP) interactions between superconducting qubits", Phys. Rev. A 96, Aug. 8, 2017, 10 pgs.
Schindler, et al., "Experimental Repetitive Quantum Error Correction", Science, 332:1059, May 27, 2011, 3 pgs.
Schuch, et al., "Natural two-qubit gate for quantum computation using the XY interaction", Phys. Rev. A 67, 032301, 2003, 8 pgs.
Schuch, et al., "Natural two-qubit gate for quantum computation using the XY interaction", arXiv:quant-ph/0209035v2, Apr. 4, 2003, 8 pgs.
Sheldon, et al., "Procedure for systematically tuning up crosstalk in the cross resonance gate", Phys. Rev. A 93, 060302, Mar. 15, 2016, 5 pgs.
Shende, et al., "Synthesis of Quantum Logic Circuits", arXiv:quant-ph/0406176v5, Apr. 18, 2006, 19 pgs.
Siewert, et al., "Quantum Algorithms for Josephson Networks", PhysRevLett 87, 257905, Dec. 3, 2001, 4 pgs.
Smith, R. S., et al., "A Practical Quantum Instruction Set Architecture", arXiv: 1608.03355v2 [quant-ph], Feb. 17, 2017, 15 pages.
Strauch, Frederick W., et al., "Quantum Logic Gates for Coupled Superconducting Phase Qubits", Physical Review Letters, vol. 91, No. 167005, Oct. 16, 2003, 4 pages.
Strauch, et al., "Quantum logic gates for coupled superconducting phase qubits", arXiv:quant-ph/0303002v2, Oct. 21, 2003, 4 pgs.
Vaughan, et al., "A Simple, Low Power, Multiple Pulse NMR Spectrometer", The Review of Scientific Instruments, 43, 9, Sep. 1972, 9 pgs.
Verdon, et al., "Learning to learn with quantum neural networks via classical neural networks", arxiv: 1907.05415v1, Jul. 11, 2019, 12 pgs.
Wang, et al., "Quantum approximate optimization algorithm for MaxCut: A fermionic view", Phys. Rev. A 97, 022304, Feb. 5, 2018, 11 pgs.
Wang, et al., "XY-mixers: analytical and numerical results for QAOA", arxiv:1904.09314v1, Apr. 19, 2019, 17 pgs.
Yan, et al., "A tunable coupling scheme for implementing high-fidelity two-qubit gates", arXiv: 1803.09813v1, Mar. 26, 2018, 10 pgs.
Zhang, et al., "A geometric theory of non-local two-qubit operations", arXiv:quant-ph/0209120v2, Sep. 24, 2002, 22 pgs.
"New in Forest 2—Parametric Programs", http://docs.rigetti.com/en/stable/migration3-declare.html, Oct. 2, 2019, 14 pgs.
"The @rigetti optimizing Quil compiler", https://github.com/rigetti/quilc, May 28, 2019, 5 pgs.
Abrams, et al., "Methods for Measuring Magnetic Flux Crosstalk Between Tunable Transmons", arXiv: 1908.11856v2, Sep. 5, 2019, 10 pgs.
Andersen, et al., "Entanglement Stabilization using Parity Detection and Real-Time Feedback in Superconducting Circuits", arXiv:1902.06946v2, Feb. 20, 2019, 12 pgs.
Babbush, et al., "Low Depth Quantum Simulation of Electronic Structure", arxiv:1706.00023v3, Jan. 14, 2018, 41 pgs.
Babbush, "Low-Depth Quantum Simulation of Materials", Phys. Rev. X 8, 011044, Mar. 21, 2018, 40 pgs.
Barenco, Adriano, et al., "Elementary gates for quantum computation", Physical Review A, vol. 52, No. 5, Nov. 1, 1995, 11 pgs.
Barends, et al., "Diabatic gates for frequency-tunable superconducting qubits", arXiv: 1907.02510, Jul. 2019, 9 pgs.
Barends, R., et al., "Logic gates at the surface code threshold: Superconducting qubits poised for fault-tolerant quantum computing", Nature 508, 500-503, 2014, 18 pages.
Barends, et al., "Logic gates at the surface code threshold: Superconducting qubits poised for fault-tolerant quantum computing", 1402.4848 [quant-ph], Feb. 19, 2014, 17 pgs.
Bertet, P., et al., "Parametric coupling for superconducting qubits", Physical Review B 73, 064512, Feb. 14, 2006, 6 pages.
Bertet, et al., "Parametric coupling for superconducting qubits", arXiv:cond-mat/0509799v2 [cond-mat.mes-hall], Mar. 16, 2006, 6 pgs.
Birnbaum, et al., "A distribution-free upper conficence bound for Pr{Y<X}, based on independent samples of X and Y", Ann. Math. Statist. 29(2), Jun. 1958, 11 pgs.
Bravyi, et al., "Classical algorithms for quantum mean values", arXiv:1909.11485v1, Sep. 25, 2019, 29 pgs.
Caldwell, et al., "Parametrically Activated Entangling Gates Using Transmon Qubits", arXiv:1706.06562v2 [quant-ph], Dec. 8, 2017, 7 pgs.
Caldwell, et al., "Parametrically Activated Entangling Gates Using Transmon Qubits", Physical Review Applied 10, 034050, Sep. 24, 2018, 8 pgs.
Cory, et al., "Experimental Quantum Error Correction", Phys.Rev. Lett. 81, 10, Sep. 7, 1998, 4 pgs.
Cowtan, et al., "Phase Gadget Synthesis for Shallow Circuits", arxiv:1906.01734v1, Jun. 4, 2019, 16 pgs.
Crooks, "Performance of the Quantum Approximate Optimization Algorithm on the Maximum Cut Problem", arxiv:1811.08419v1, Nov. 20, 2018, 6 pgs.
Dalzell, et al., "How many qubits are needed for quantum computational supremacy", arxiv:1805.05224v2, Sep. 18, 2018, 17 pgs.
Dewes, et al., "Characterization of a Two-Transmon Processor with Individual Single-Shot Qubit Readout", Physical Review Letters 108, 057002, Feb. 3, 2012, 5 pgs.

(56) References Cited

OTHER PUBLICATIONS

Dewes, et al., "Characterization of a two-transmon processor with individual single-shot qubit readout", arxiv:1109.6735v1, Sep. 30, 2011, 9 pgs.

Didier, et al., "AC flux sweet spots in parametrically-modulated superconducting qubits", arXiv:1807.01310v1, Jul. 3, 2018.

Didier, et al., "Analytical modeling of parametrically-modulated transmon qubits", Phys. Rev. A 97, 022330, Feb. 23, 2018, 17 pgs.

Didier, et al., "Analytical modeling of parametrically-modulated transmon qubits", arXiv: 1706.06566v2 [quant-ph], Jan. 12, 2018, 16 pgs.

Divincenzo, "Quantum gates and circuits", Proc. R. Soc. Lond. A 454, 261-276, 1998, 16 pgs.

Dvoretzky, et al., "Asymptotic Minimax Character of the Sample Distribution Function and of the Classical Multinomial Estimator", Ann. Math. Statist. 27, 642-669, 1955, 28 pgs.

Echternach, et al., "Universal Quantum Gates for Single Cooper Pair Box Based Quantum Computing", Quantum Info. Comput.1, 2001, 8 pgs.

Echternach, et al., "Universal Quantum Gates for Single Cooper Pair Box Based Quantum Computing", arxiv:quant-ph/0112025V2, Dec. 8, 2001, 8 pgs.

Farhi, et al., "A Quantum Approximate Optimization Algorithm", arXiv:1411.4028v1, Nov. 14, 2014, 16 pgs.

Fedorov, et al., "Implementation of a Toffoli Gate with Superconducting Circuits", Nature 481, Jan. 12, 2012, 3 pgs.

Ganzhorn, et al., "Gate-Efficient Simulation of Molecular Eigenstates on a Quantum Computer", Phys. Rev. Applied 11, Apr. 30, 2019, 7 pgs.

Ganzhorn, et al., "Gate-efficient simulation of molecular eigenstates on a quantum computer", arxiv:1809.05057v1, Sep. 13, 2018, 20 pgs.

Hadfield, et al., "From the quantum approximate optimization algorithm to a quantum alternating operator ansatz", Algorithms 12.2, p. 34, Feb. 12, 2019, 45 pgs.

Hong, et al., "Demonstration of a Parametrically-Activated Entangling Gate Protected from Flux Noise", arXiv:1901.08035v3, Dec. 17, 2019, 8 pgs.

Karalekas, et al., "Fast hybrid programming with Quantum Cloud Services", https://medium.com/rigetti/fast-hybrid-programming-with-quantum-cloud-services-7573f48b93b5, Jan. 30, 2019, 5 pgs.

Kempe, et al., "Encoded Universality from a Single Physical Interaction", Quantum Info. Comput. 1, 33-55, 2001, 20 pgs.

Kempe, et al., "Encoded Universality from a Single Physical Interaction", arxiv:quant-ph/0112013v1, Dec. 3, 2001, 20 pgs.

Kimmel, et al., "Robust calibration of a uniersal single-qubit gate set via robust phase estimation", Phys. Rev. A 92, Dec. 8, 2015, 13 pgs.

Kivlichan, et al., "Quantum Simulation of Electronic Structure with Linear Depth and Connectivity", arxiv:1711.04789v2, Feb. 3, 2018, 8 pgs.

Kivlichan, et al., "Quantum Simulation of Electronic Structure with Linear Depth and Connectivity", PhysRevLett 120, Mar. 13, 2018, 6 pgs.

Knill, et al., "An algorithmic benchmark for quantum information processing", Nature, 404, 368, 2000, 3 pgs.

Magesan, et al., "Efficient measurement of quantum gate error by interleaved randomized benchmarking", Phys.Rev.Lett.109. 080505, Aug. 2012, 5 pgs.

Majer, J., et al., "Coupling superconducting qubits via a cavity bus", Nature 449, pp. 443-447, Sep. 27, 2007, 5 pages.

Majer, et al., "Coupling Superconducting Qubits via a Cavity Bus", arXiv:0709.2135v1, Sep. 13, 2007, 6 pgs.

Mariantoni, "Implementing the Quantum von Neumann Architecture with Superconducting Circuits", Science, 334, Oct. 7, 2011, 5 pgs.

Massart, "The Tight Constant in the Dvoretzky-Kiefer-Wolfowitz Inequality", The Annals of Probability, vol. 18, No. 3, 1990, 15 pgs.

McCaskey, et al., "Quantum Chemistry as a Benchmark for Near-Term Quantum Computers", arXiv:1905.01534v1, May 4, 2019, 10 pgs.

McClean, et al., "Barren plateaus in quantum neural network training landscapes", Nature Communications 9, 4812, 2018, 6 pgs.

McClean, et al., "Barren plateaus in quantum neural network training landscapes", arXiv:1803.11173v1, Mar. 29, 2018, 7 pgs.

* cited by examiner

| | Qubit $f_{01}$ (GHz) | Tunability (GHz) | $T_1$ (μs) | $T_2^*$ (μs) | $\tilde{T}_1$ (μs) | $\tilde{T}_2^*$ (μs) | Readout Fidelity (%) | 1Q Gate Fidelity (%) |
|---|---|---|---|---|---|---|---|---|
| Q1 | 3.821 | — | 27 ± 2 | 11 ± 1 | 24 ± 2 | 13 ± 1 | 93.8 ± 0.1 | 99.83 ± 0.01 |
| Q2 | 4.759 | 0.767 | 7 ± 4 | 8 ± 1 | 26 ± 4 | 14 ± 1 | 96.3 ± 0.1 | 99.84 ± 0.02 |

FIG. 6

GATE FORMATION FOR A QUANTUM PROCESSOR

CROSS REFERENCE TO RELATED APPLICATIONS

This application claims priority to U.S. Provisional Patent Application No. 62/923,275, filed Oct. 18, 2019, entitled "Gate Formation on a Quantum Processor;" and U.S. Provisional Patent Application No. 62/944,494, filed Dec. 6, 2019, entitled "Gate Formation for a Quantum Processor." All of the above-referenced priority documents are incorporated herein by reference in their entirety.

BACKGROUND

The following description relates to gate formation for a quantum processor.

Quantum computers can perform computational tasks by storing and processing information within quantum states of quantum systems. For example, qubits (i.e., quantum bits) can be stored in and represented by an effective two-level sub-manifold of a quantum coherent physical system. A variety of physical systems have been proposed for quantum computing applications. Examples include superconducting circuits, trapped ions, spin systems, and others.

BRIEF DESCRIPTION OF THE DRAWINGS

FIG. 6 is a table showing relevant parameters for two example qubits.

DETAILED DESCRIPTION

Figure 1:
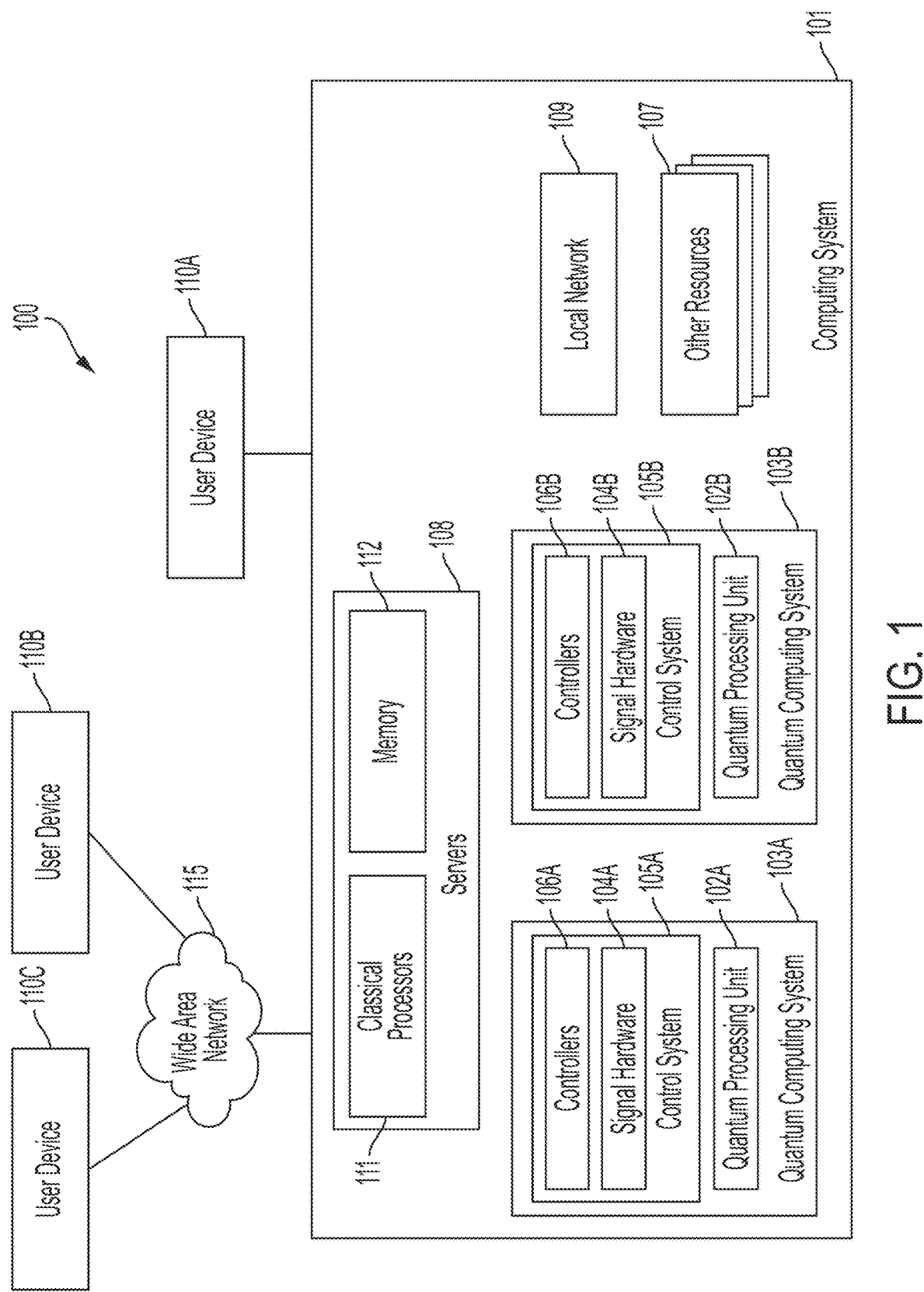
FIG. 1 is a block diagram of an example computing system.

Noisy Intermediate-Scale Quantum (NISQ) devices have the potential to solve useful problems more efficiently than current classical computing approaches. It is expected that the depth of implementable circuits is an important determinant of a NISQ device's computational power. For these pre-fault-tolerant devices, the depth to which one can compute is limited by the accumulation of errors from imperfect individual gates; and indeed, most early demonstrations of hybrid quantum-classical algorithms, such as VQE or QAOA, have been limited by gate error rates. Furthermore, in systems with restricted connectivity between qubits, many SWAPs may be required to interact distant qubits, therefore imposing stronger limits on the fidelity of algorithms implemented in these NISQ systems. One approach to tackling this scaling problem is to decrease circuit depth by leveraging a more expressive gate set.

Typically, arbitrary single-qubit rotations have very low error rates and in some instances, they are almost "error free". However, two-qubit entangling gates generally may have greater error rates, which may limit their applications. When a variety of entangling gates is available, a customer quantum circuit (e.g., a user program with a sequence of quantum logic gates) containing non-native unitary operations can be compiled in to a native quantum circuit (e.g., a native program containing a sequence of quantum logic gates). For example, an arbitrary two-qubit gate can be compiled with some fixed set of entangling gates. Any arbitrary two-qubit gate can be expressed with at most 3 controlled-Zs (CZs) or 3 iSWAPs in addition to single-qubit rotations. Therefore, while having one of iSWAP or CZ does not offer any compilation advantages in the worst case, the average circuit depth of generic circuits can benefit greatly from the availability of both—e.g., an iSWAP requires two CZs and vice-versa. Furthermore, the generic SWAP gate can be implemented using the combination of one CZ and one iSWAP rather than three CZs or three iSWAPs. This reduction in SWAP overhead is particularly relevant in architectures with nearest-neighbour interactions, as generic NISQ algorithms may require data movement through SWAPs in these architectures.

In some examples, $XY(\beta, \theta)$ gates can be implemented in a superconducting qubit architecture. High fidelity gates for arbitrary $\theta$ can be validated using a randomized benchmarking scheme. A gate decomposition strategy that leverages precise control over the phase $\beta$ is used in order to achieve arbitrary entangling strength while only requiring calibration of a single pulse. In order to attain precise control over the phase $\beta$, several circuit identities that describe how to properly track and update $\beta$ can be used. These updates are necessary in systems where single-qubit control is performed in abstract oscillating rotating frames with Z rotations implemented as frame updates. Specifically, because the XY interaction does not commute with local Z rotations on single qubits, implementation of an XY gate requires careful treatment of the interactions of these abstract frames. In some implementations, the gate decomposition scheme presented here can be generalized to multi-qubit quantum logic gates.

In some instances, optimized circuit implementations can be used to minimize gate depth and therefore mitigate the impact of gate errors in NISQ computers. More expressive gate sets can significantly reduce the gate depth of generic circuits. Similarly, structured algorithms can benefit from a gate set that more directly matches the symmetries of the problem. In certain instances, the XY interaction generates a family of gates that provides expressiveness well tailored to quantum chemistry as well as to combinatorial optimization problems, while also offering reductions in circuit depth for more generic circuits. In some implementations, the full family of XY gates are implemented in a transmon-based superconducting qubit architecture. A composite pulse scheme that requires calibration of only a single flux pulse and maintains constant gate time for all members of the family can be used. A high fidelity implementation of the gate across all entangling angles can be maintained. The average fidelity of gates sampled from this family ranges from 95.67±0.60% to 99.01±0.15%, with a median fidelity of 97.35±0.17%, which approaches the coherence-limited gate fidelity of a qubit pair. The XY gates can be used in a quantum approximation optimization to reduce circuit depth as compared to the CZ only case.

In some implementations, the systems and techniques described here can provide technical advantages and improvements. For example, the systems and methods presented here enable a compilation of any arbitrary $XY(\theta)$ gate in the XY gate family by performing a single calibration of a first flux pulse and configuring a phase ($\theta$) on a second flux pulse. For example, the systems and methods presented here enable high fidelity operation using a single calibrated iSWAP pulse to perform an operation within the XY gate family. This implementation only requires a calibration of the iSWAP pulse once. In some instances, the systems and methods presented here enable the ability to selectively perform any operation within the XY gate family by controlling the relative phase between two $\sqrt{iSWAP}$ pulses. This implementation only requires calibrating a single flux pulse (e.g., a first $\sqrt{iSWAP}$ pulse), and controlling the phase of a second flux pulse (e.g., a second $\sqrt{iSWAP}$ pulse). In some instances, calibration of the single flux pulse can be performed only once without a need for recalibration during the gate formation or compilation process. In certain instances, performing a recalibration may be triggered by events, such as, when a significantly change in fidelity is observed, when a user program specifically identifies a recalibration process, or in another manner.

In some implementations, the systems and methods can maintain constant gate time for all entangling angles $\theta$, easing pulse shaping requirements on the control system. The median gate fidelity across the sampled XY gates is 97.35±0.17%, supporting the hypothesis that gate fidelity is insensitive to entangling angle. A framework for properly tracking the phases of several abstract rotating frames as they interact through the XY interaction can be utilized. Hardware able to maintain phase stability across several output channels can be employed in order to take advantage of the framework. In some implementations, the systems and methods presented here are applicable to various multi-qubit quantum logic gates, allowing for an expressive gate set through calibration of a small number of flux pulses.

FIG. 1 is a block diagram of an example computing environment 100. The example computing environment 100 shown in FIG. 1 includes a computing system 101 and user devices 110A, 110B, 110C. A computing environment may include additional or different features, and the components of a computing environment may operate as described with respect to FIG. 1 or in another manner.

The example computing system 101 includes classical and quantum computing resources and exposes their functionality to the user devices 110A, 110B, 110C (referred to collectively as "user devices 110"). The computing system 101 shown in FIG. 1 includes one or more servers 108, quantum computing systems 103A, 103B, a local network 109, and other resources 107. The computing system 101 may also include one or more user devices (e.g., the user device 110A) as well as other features and components. A computing system may include additional or different features, and the components of a computing system may operate as described with respect to FIG. 1 or in another manner.

The example computing system 101 can provide services to the user devices 110, for example, as a cloud-based or remote-accessed computer system, as a distributed computing resource, as a supercomputer or another type of high-performance computing resource, or in another manner. The computing system 101 or the user devices 110 may also have access to one or more other quantum computing systems (e.g., quantum computing resources that are accessible through the wide area network 115, the local network 109 or otherwise).

The user devices 110 shown in FIG. 1 may include one or more classical processor, memory, user interfaces, communication interfaces, and other components. For instance, the user devices 110 may be implemented as laptop computers, desktop computers, smartphones, tablets, or other types of computer devices. In the example shown in FIG. 1, to access computing resources of the computing system 101, the user devices 110 send information (e.g., programs, instructions, commands, requests, input data, etc.) to the servers 108; and in response, the user devices 110 receive information (e.g., application data, output data, prompts, alerts, notifications, results, etc.) from the servers 108. The user devices 110 may access services of the computing system 101 in another manner, and the computing system 101 may expose computing resources in another manner.

In the example shown in FIG. 1, the local user device 110A operates in a local environment with the servers 108 and other elements of the computing system 101. For instance, the user device 110A may be co-located with (e.g., located within 0.5 to 1 km of) the servers 108 and possibly other elements of the computing system 101. As shown in FIG. 1, the user device 110A communicates with the servers 108 through a local data connection.

The local data connection in FIG. 1 is provided by the local network 109. For example, some or all of the servers 108, the user device 110A, the quantum computing systems 103A, 103B, and the other resources 107 may communicate with each other through the local network 109. In some implementations, the local network 109 operates as a communication channel that provides one or more low-latency communication pathways from the server 108 to the quantum computer systems 103A, 103B (or to one or more of the elements of the quantum computer systems 103A, 103B). The local network 109 can be implemented, for instance, as a wired or wireless Local Area Network, an Ethernet connection, or another type of wired or wireless connection. The local network 109 may include one or more wired or wireless routers, wireless access points (WAPs), wireless mesh nodes, switches, high-speed cables, or a combination of these and other types of local network hardware elements. In some cases, the local network 109 includes a software-defined network that provides communication among virtual resources, for example, among an array of virtual machines operating on the server 108 and possibly elsewhere.

In the example shown in FIG. 1, the remote user devices 110B, 110C operate remote from the servers 108 and other elements of the computing system 101. For instance, the user devices 110B, 110C may be located at a remote distance (e.g., more than 1 km, 10 km, 100 km, 1,000 km, 10,000 km, or farther) from the servers 108 and possibly other elements of the computing system 101. As shown in FIG. 1, each of the user devices 110B, 110C communicates with the servers 108 through a remote data connection.

The remote data connection in FIG. 1 is provided by a wide area network 115, which may include, for example, the Internet or another type of wide area communication network. In some cases, remote user devices use another type of remote data connection (e.g., satellite-based connections, a cellular network, a virtual private network, etc.) to access the servers 108. The wide area network 115 may include one or more internet servers, firewalls, service hubs, base stations, or a combination of these and other types of remote networking elements. Generally, the computing environment 100 can be accessible to any number of remote user devices.

The example servers 108 shown in FIG. 1 can manage interaction with the user devices 110 and utilization of the quantum and classical computing resources in the computing system 101. For example, based on information from the user devices 110, the servers 108 may delegate computational tasks to the quantum computing systems 103A, 103B and the other resources 107; the servers 108 can then send information to the user devices 110 based on output data from the computational tasks performed by the quantum computing systems 103A, 103B and the other resources 107.

As shown in FIG. 1, the servers 108 are classical computing resources that include classical processors 111 and memory 112. The servers 108 may also include one or more communication interfaces that allow the servers to communicate via the local network 109, the wide area network 115, and possibly other channels. In some implementations, the servers 108 may include a host server, an application server, a virtual server, or a combination of these and other types of servers. The servers 108 may include additional or different features, and may operate as described with respect to FIG. 1 or in another manner.

The classical processors 111 can include various kinds of apparatus, devices, and machines for processing data, including, by way of example, a microprocessor, a central processing unit (CPU), a graphics processing unit (GPU), an FPGA (field programmable gate array), an ASIC (application specific integrated circuit), or combinations of these. The memory 112 can include, for example, a random-access memory (RAM), a storage device (e.g., a writable read-only memory (ROM) or others), a hard disk, or another type of storage medium. The memory 112 can include various forms of volatile or non-volatile memory, media, and memory devices, etc.

Each of the example quantum computing systems 103A, 103B operates as a quantum computing resource in the computing system 101. The other resources 107 may include additional quantum computing resources (e.g., quantum computing systems, quantum virtual machines (QVMs) or quantum simulators) as well as classical (non-quantum) computing resources such as, for example, digital microprocessors, specialized co-processor units (e.g., graphics processing units (GPUs), cryptographic co-processors, etc.), special purpose logic circuitry (e.g., field programmable gate arrays (FPGAs), application-specific integrated circuits (ASICs), etc.), systems-on-chips (SoCs), etc., or combinations of these and other types of computing modules.

In some implementations, the servers 108 generate programs, identify appropriate computing resources (e.g., a QPU or QVM) in the computing system 101 to execute the programs, and send the programs to the identified resources for execution. For example, the servers 108 may send programs to the quantum computing system 103A, the quantum computing system 103B or any of the other resources 107. The programs may include classical programs, quantum programs, hybrid classical/quantum programs, and may include any type of function, code, data, instruction set, etc.

In some instances, programs can be formatted as source code that can be rendered in human-readable form (e.g., as text) and can be compiled, for example, by a compiler running on the servers 108, on the quantum computing systems 103, or elsewhere. In some instances, programs can be formatted as compiled code, such as, for example, binary code (e.g., machine-level instructions) that can be executed directly by a computing resource. Each program may include instructions corresponding to computational tasks that, when performed by an appropriate computing resource, generate output data based on input data. For example, a program can include instructions formatted for a quantum computer system, a quantum virtual machine, a digital microprocessor, co-processor or other classical data processing apparatus, or another type of computing resource.

In some cases, a program may be expressed in a hardware-independent format. For example, quantum machine instructions may be provided in a quantum instruction language such as Quil, described in the publication "A Practical Quantum Instruction Set Architecture," arXiv: 1608.03355v2, dated Feb. 17, 2017, or another quantum instruction language. For instance, the quantum machine instructions may be written in a format that can be executed by a broad range of quantum processing units or quantum virtual machines. In some cases, a program may be expressed in high-level terms of quantum logic gates or quantum algorithms, in lower-level terms of fundamental qubit rotations and controlled rotations, or in another form.

In some cases, a program may be expressed in terms of control signals (e.g., pulse sequences, delays, etc.) and parameters for the control signals (e.g., frequencies, phases, durations, channels, etc.). In some cases, a program may be expressed in another form or format.

In some implementations, the servers 108 include one or more compilers that convert programs between formats. For example, the servers 108 may include a compiler that converts hardware-independent instructions to binary programs for execution by the quantum computing systems 103A, 103B. In some cases, a compiler can compile a program to a format that targets a specific quantum resource in the computer system 101. For example, a compiler may generate a different binary program (e.g., from the same source code) depending on whether the program is to be executed by the quantum computing system 103A or the quantum computing system 103B.

In some cases, a compiler generates a partial binary program that can be updated, for example, based on specific parameters. For instance, if a quantum program is to be executed iteratively on a quantum computing system with varying parameters on each iteration, the compiler may generate the binary program in a format that can be updated with specific parameter values at runtime (e.g., based on feedback from a prior iteration, or otherwise). In some cases, a compiler generates a full binary program that does not need to be updated or otherwise modified for execution.

In some implementations, the servers 108 generate a schedule for executing programs, allocate computing resources in the computing system 101 according to the schedule, and delegate the programs to the allocated computing resources. The servers 108 can receive, from each computing resource, output data from the execution of each program. Based on the output data, the servers 108 may generate additional programs that are then added to the schedule, output data that is provided back to a user device 110, or perform another type of action.

In some implementations, all or part of the computing environment operates as a cloud-based quantum computing (QC) environment, and the servers 108 operate as a host system for the cloud-based QC environment. The cloud-based QC environment may include software elements that operate on both the user devices 110 and the computer system 101 and interact with each other over the wide area network 115. In certain instances, the cloud-based QC environment may provide a remote user interface, for example, through a browser or another type of application on the user devices 110. The remote user interface may include, for example, a graphical user interface or another type of user interface that obtains input provided by a user of the cloud-based QC environment. In some cases the remote user interface includes, or has access to, one or more application programming interfaces (APIs), command line interfaces, graphical user interfaces, or other elements that expose the services of the computer system 101 to the user devices 110.

In some cases, the cloud-based QC environment may be deployed in a "serverless" computing architecture. For instance, the cloud-based QC environment may provide on-demand access to a shared pool of configurable computing resources (e.g., networks, servers, storage, applications, services, quantum computing resources, classical computing resources, etc.) that can be provisioned for requests from user devices 110. Moreover, the cloud-based computing systems 104 may include or utilize other types of computing resources, such as, for example, edge computing, fog computing, etc.

In an example implementation of a cloud-based QC environment, the servers 108 may operate as a cloud provider that dynamically manages the allocation and provisioning of physical computing resources (e.g., GPUs, CPUs, QPUs, etc.). Accordingly, the servers 108 may provide services by defining virtualized resources for each user account. For instance, the virtualized resources may be formatted as virtual machine images, virtual machines, containers, or virtualized resources that can be provisioned for a user account and configured by a user. In some cases, the cloud-based QC environment is implemented using a resource such as, for example, OPENSTACK®. OPENSTACK® is an example of a software platform for cloud-based computing, which can be used to provide virtual servers and other virtual computing resources for users.

In some cases, the server 108 stores quantum machine images (QMI) for each user account. A quantum machine image may operate as a virtual computing resource for users of the cloud-based QC environment. For example, a QMI can provide a virtualized development and execution environment to develop and run programs (e.g., quantum programs or hybrid classical/quantum programs). When a QMI operates on the server 108, the QMI may engage either of the quantum processing units 102A, 102B, and interact with a remote user device (110B or 110C) to provide a user programming environment. The QMI may operate in close physical proximity to and have a low-latency communication link with the quantum computing systems 103A, 103B. In some implementations, remote user devices connect with QMIs operating on the servers 108 through secure shell (SSH) or other protocols over the wide area network 115.

In some implementations, all, or part of the computing system 101 operates as a hybrid computing environment. For example, quantum programs can be formatted as hybrid classical/quantum programs that include instructions for execution by one or more quantum computing resources and instructions for execution by one or more classical resources. The servers 108 can allocate quantum and classical computing resources in the hybrid computing environment, and delegate programs to the allocated computing resources for execution. The quantum computing resources in the hybrid environment may include, for example, one or more quantum processing units (QPUs), one or more quantum virtual machines (QVMs), one or more quantum simulators, or possibly other types of quantum resources. The classical computing resources in the hybrid environment may include, for example, one or more digital microprocessors, one or more specialized co-processor units (e.g., graphics processing units (GPUs), cryptographic co-processors, etc.), special purpose logic circuitry (e.g., field programmable gate arrays (FPGAs), application-specific integrated circuits (ASICs), etc.), systems-on-chips (SoCs), or other types of computing modules.

In some examples, hybrid classical/quantum algorithms may employ a variational execution model in order to accomplish tasks such as, for example, solving combinatorial optimization problems or simulating quantum chemistry. To execute hybrid classical/quantum algorithms according to this model, the server 108 can generate an initial quantum program (e.g., based on a proposed solution to a problem, starting with an initial guess, etc.), and send the initial quantum program to quantum computer resource (e.g., the quantum computer system 103A, the quantum computer system 103B, a QVM, or a combination of them) for execution. Then, from the output of executing the initial quantum program, a classical optimizer running on the server 108 (or another classical computer resource) may update the quantum program for the next round of iteration on the quantum computer resource. Depending on the difficulty of the problem, the quality of the quantum computer resource, and other factors, the iteration loop may be repeated many times before completing the computational task. In some implementations, low-latency hybrid classical/quantum computing can be achieved, for example, when a QMI operates on a classical machine that is physically located close to a QPU.

In some cases, the servers 108 can select the type of computing resource (e.g., quantum or classical) to execute an individual program, or part of a program, in the computing system 101. For example, the servers 108 may select a particular quantum processing unit (QPU) or other computing resource based on availability of the resource, speed of the resource, information or state capacity of the resource, a performance metric (e.g., process fidelity) of the resource, or based on a combination of these and other factors. In some cases, the servers 108 can perform load balancing, resource testing and calibration, and other types of operations to improve or optimize computing performance.

Each of the example quantum computing systems 103A, 103B shown in FIG. 1 can perform quantum computational tasks by executing quantum machine instructions (e.g., a binary program compiled for the quantum computing system). In some implementations, a quantum computing system can perform quantum computation by storing and manipulating information within quantum states of a composite quantum system. For example, qubits (i.e., quantum bits) can be stored in and represented by an effective two-level sub-manifold of a quantum coherent physical system. In some instances, quantum logic can be executed in a manner that allows large-scale entanglement within the quantum system. Control signals can manipulate the quantum states of individual qubits and the joint states of multiple qubits. In some instances, information can be read out from the composite quantum system by measuring the quantum states of the qubits. In some implementations, the quantum states of the qubits are read out by measuring the transmitted or reflected signal from auxiliary quantum devices that are coupled to individual qubits.

In some implementations, a quantum computing system can operate using gate-based models for quantum computing. For example, the qubits can be initialized in an initial state, and a quantum logic circuit including a series of quantum logic gates can be applied to transform the qubits and extract measurements representing the output of the quantum computation. Individual qubits may be controlled by single-qubit quantum logic gates, and pairs of qubits may be controlled by two-qubit quantum logic gates (e.g., entangling gates that are capable of generating entanglement between the pair of qubits). In some implementations, a quantum computing system can operate using adiabatic or annealing models for quantum computing. For instance, the qubits can be initialized in an initial state, and the controlling Hamiltonian can be transformed adiabatically by adjusting control parameters to another state that can be measured to obtain an output of the quantum computation.

In some models, fault-tolerance can be achieved by applying a set of high-fidelity control and measurement operations to the qubits. For example, quantum error correcting schemes can be deployed to achieve fault-tolerant quantum computation. Other computational regimes may be used; for example, quantum computing systems may operate in non-fault-tolerant regimes. In some implementations, a quantum computing system is constructed and operated according to a scalable quantum computing architecture. For example, in some cases, the architecture can be scaled to a large number of qubits to achieve large-scale general-purpose coherent quantum computing. Other architectures may be used; for example, quantum computing systems may operate in small-scale or non-scalable architectures.

The example quantum computing system 103A shown in FIG. 1 includes a quantum processing unit 102A and a control system 105A, which controls the operation of the quantum processing unit 102A. Similarly, the example quantum computing system 103B includes a quantum processing unit 102B and a control system 105B, which controls the operation of a quantum processing unit 102B. A quantum computing system may include additional or different features, and the components of a quantum computing system may operate as described with respect to FIG. 1 or in another manner.

In some instances, all or part of the quantum processing unit 102A functions as a quantum processor, a quantum memory, or another type of subsystem. In some examples, the quantum processing unit 102A includes a quantum circuit system. The quantum circuit system may include qubit devices, readout devices and possibly other devices that are used to store and process quantum information. In some cases, the quantum processing unit 102A includes a superconducting circuit, and the qubit devices are implemented as circuit devices that include Josephson junctions, for example, in Superconducting QUantum Interference Device (SQUID) loops or other arrangements, and are controlled by radio-frequency signals, microwave signals, and bias signals delivered to the quantum processing unit 102A. In some cases, the quantum processing unit 102A includes an ion trap system, and the qubit devices are implemented as trapped ions controlled by optical signals delivered to the quantum processing unit 102A. In some cases, the quantum processing unit 102A includes a spin system, and the qubit devices are implemented as nuclear or electron spins controlled by microwave or radio-frequency signals delivered to the quantum processing unit 102A. The quantum processing unit 102A may be implemented based on another physical modality of quantum computing.

The quantum processing unit 102A may include, or may be deployed within, a controlled environment. The controlled environment can be provided, for example, by shielding equipment, cryogenic equipment, and other types of environmental control systems. In some examples, the components in the quantum processing unit 102A operate in a cryogenic temperature regime and are subject to very low electromagnetic and thermal noise. For example, magnetic shielding can be used to shield the system components from stray magnetic fields, optical shielding can be used to shield the system components from optical noise, thermal shielding and cryogenic equipment can be used to maintain the system components at controlled temperature, etc.

In some implementations, the example quantum processing unit 102A can process quantum information by applying control signals to the qubits in the quantum processing unit 102A. The control signals can be configured to encode information in the qubits, to process the information by performing quantum logic gates or other types of operations, or to extract information from the qubits. In some examples, the operations can be expressed as single-qubit quantum logic gates, two-qubit quantum logic gates, or other types of quantum logic gates that operate on one or more qubits. A quantum logic circuit, which includes a sequence of quantum logic operations, can be applied to the qubits to perform a quantum algorithm. The quantum algorithm may correspond to a computational task, a hardware test, a quantum error correction procedure, a quantum state distillation procedure, or a combination of these and other types of operations.

The example control system 105A includes controllers 106A and signal hardware 104A. Similarly, control system 105B includes controllers 106B and signal hardware 104B. All or part of the control systems 105A, 105B can operate in a room-temperature environment or another type of environment, which may be located near the respective quantum processing units 102A, 102B. In some cases, the control systems 105A, 105B include classical computers, signaling equipment (microwave, radio, optical, bias, etc.), electronic systems, vacuum control systems, refrigerant control systems or other types of control systems that support operation of the quantum processing units 102A, 102B.

The control systems 105A, 105B may be implemented as distinct systems that operate independent of each other. In some cases, the control systems 105A, 105B may include one or more shared elements; for example, the control systems 105A, 105B may operate as a single control system that operates both quantum processing units 102A, 102B. Moreover, a single quantum computer system may include multiple quantum processing units, which may operate in the same controlled (e.g., cryogenic) environment or in separate environments.

The example signal hardware 104A includes components that communicate with the quantum processing unit 102A. The signal hardware 104A may include, for example, waveform generators, amplifiers, digitizers, high-frequency sources, DC sources, AC sources, etc. The signal hardware may include additional or different features and components. In the example shown, components of the signal hardware 104A are adapted to interact with the quantum processing unit 102A. For example, the signal hardware 104A can be configured to operate in a particular frequency range, configured to generate and process signals in a particular format, or the hardware may be adapted in another manner.

In some instances, one or more components of the signal hardware 104A generate control signals, for example, based on control information from the controllers 106A. The control signals can be delivered to the quantum processing unit 102A during operation of the quantum computing system 103A. For instance, the signal hardware 104A may generate signals to implement quantum logic operations, readout operations, or other types of operations. As an example, the signal hardware 104A may include arbitrary waveform generators (AWGs) that generate electromagnetic waveforms (e.g., microwave or radiofrequency) or laser systems that generate optical waveforms. The waveforms or other types of signals generated by the signal hardware 104A can be delivered to devices in the quantum processing unit 102A to operate qubit devices, readout devices, bias devices, coupler devices or other types of components in the quantum processing unit 102A.

In some instances, the signal hardware 104A receives and processes signals from the quantum processing unit 102A. The received signals can be generated by the execution of a quantum program on the quantum computing system 103A. For instance, the signal hardware 104A may receive signals from the devices in the quantum processing unit 102A in response to readout or other operations performed by the quantum processing unit 102A. Signals received from the quantum processing unit 102A can be mixed, digitized, filtered, or otherwise processed by the signal hardware 104A to extract information, and the information extracted can be provided to the controllers 106A or handled in another manner. In some examples, the signal hardware 104A may include a digitizer that digitizes electromagnetic waveforms (e.g., microwave or radio-frequency) or optical signals, and a digitized waveform can be delivered to the controllers 106A or to other signal hardware components. In some instances, the controllers 106A process the information from the signal hardware 104A and provide feedback to the signal hardware 104A; based on the feedback, the signal hardware 104A can in turn generate new control signals that are delivered to the quantum processing unit 102A.

In some implementations, the signal hardware 104A includes signal delivery hardware that interfaces with the quantum processing unit 102A. For example, the signal hardware 104A may include filters, attenuators, directional couplers, multiplexers, diplexers, bias components, signal channels, isolators, amplifiers, power dividers, and other types of components. In some instances, the signal delivery hardware performs preprocessing, signal conditioning, or other operations to the control signals to be delivered to the quantum processing unit 102A. In some instances, signal delivery hardware performs preprocessing, signal conditioning, or other operations on readout signals received from the quantum processing unit 102A.

The example controllers 106A communicate with the signal hardware 104A to control operation of the quantum computing system 103A. The controllers 106A may include classical computing hardware that directly interface with components of the signal hardware 104A. The example controllers 106A may include classical processors, memory, clocks, digital circuitry, analog circuitry, and other types of systems or subsystems. The classical processors may include one or more single- or multi-core microprocessors, digital electronic controllers, special purpose logic circuitry, e.g., an FPGA (field programmable gate array) or an ASIC (application specific integrated circuit), or other types of data processing apparatus. The memory may include any type of volatile or non-volatile memory or another type of computer storage medium. The controllers 106A may also include one or more communication interfaces that allow the controllers 106A to communicate via the local network 109 and possibly other channels. The controllers 106A may include additional or different features and components.

In some implementations, the controllers 106A include memory or other components that store quantum state information, for example, based on qubit readout operations performed by the quantum computing system 103A. For instance, the states of one or more qubits in the quantum processing unit 102A can be measured by qubit readout operations, and the measured state information can be stored in a cache or other type of memory system in one or more of the controllers 106A. In some cases, the measured state information is subsequently used in the execution of a quantum program, a quantum error correction procedure, a quantum processing unit (QPU) calibration or testing procedure, or another type of quantum process.

In some implementations, the controllers 106A include memory or other components that store a quantum program containing quantum machine instructions for execution by the quantum computing system 103A. In some instances, the controllers 106A can interpret the quantum machine instructions and perform hardware-specific control operations according to the quantum machine instructions. For example, the controllers 106A may cause the signal hardware 104A to generate control signals that are delivered to the quantum processing unit 102A to execute the quantum machine instructions.

In some instances, the controllers 106A extract qubit state information from qubit readout signals, for example, to identify the quantum states of qubits in the quantum processing unit 102A or for other purposes. For example, the controllers may receive the qubit readout signals (e.g., in the form of analog waveforms) from the signal hardware 104A, digitize the qubit readout signals, and extract qubit state information from the digitized signals. In some cases, the controllers 106A compute measurement statistics based on qubit state information from multiple shots of a quantum program. For example, each shot may produce a bitstring representing qubit state measurements for a single execution of the quantum program, and a collection of bitstrings from multiple shots may be analyzed to compute quantum state probabilities.

In some implementations, the controllers 106A include one or more clocks that control the timing of operations. For example, operations performed by the controllers 106A may be scheduled for execution over a series of clock cycles, and clock signals from one or more clocks can be used to control the relative timing of each operation or groups of operations. In some implementations, the controllers 106A may include classical computer resources that perform some or all of the operations of the servers 108 described above. For example, the controllers 106A may operate a compiler to generate binary programs (e.g., full or partial binary programs) from source code; the controllers 106A may include an optimizer that performs classical computational tasks of a hybrid classical/quantum program; the controllers 106A may update binary programs (e.g., at runtime) to include new parameters based on an output of the optimizer, etc.

The other quantum computer system 103B and its components (e.g., the quantum processing unit 102B, the signal hardware 104B, and controllers 106B) can be implemented as described above with respect to the quantum computer system 103A; in some cases, the quantum computer system 103B and its components may be implemented or may operate in another manner.

In some implementations, the quantum computer systems 103A, 103B are disparate systems that provide distinct modalities of quantum computation. For example, the computer system 101 may include both an adiabatic quantum computer system and a gate-based quantum computer system. As another example, the computer system 101 may include a superconducting circuit-based quantum computer system and an ion trap-based quantum computer system. In such cases, the computer system 101 may utilize each quantum computing system according to the type of quantum program that is being executed, according to availability or capacity, or based on other considerations.

In some aspects of operation, the computing environment 100 shown in FIG. 1 includes one or more compilers that can form a quantum logic gate by composing a sequence of quantum logic operations. For instance, a quantum logic gate representing a unitary operation applied to one or more qubits may be decomposed into a series of quantum logic gates (that represents the same unitary operation applied to the same qubits, up to a global phase). In some cases, the series of quantum logic gates are composed to utilize a native gate set of the target device, to provide an improvement in the performance of the quantum program, or to achieve another type of technical advantage. For instance, the compiler may generate a compiled program (e.g., a binary program) from a source program to be executed by a target device (e.g., a target quantum processor or a class of target quantum processors), and the compiled program may include a series of native quantum logic gates that can be applied by the target device to execute an individual quantum logic gate in the source program. In some implementations, the quantum logic gate (e.g., in the source program) to be formed is a parametric gate, and the series of quantum logic gates (e.g., in the compiled program) that is composed by the compiler includes one or more parametric gates. For instance, the quantum logic gate to be formed, and the series of quantum logic gates composed by the compiler, may generally include any type of single-qubit parametric rotation, any type of two-qubit parametric interaction, a controlled (or a controlled-controlled) single-qubit parametric rotation, a controlled (or a controlled-controlled) two-qubit parametric interaction, or another type of parametric quantum logic gate. In some cases, the composed series of quantum logic gates also includes non-parametric gates.

In some implementations, a compiler that runs within the quantum computing system (or in a local environment of the quantum computing system) forms the quantum logic gates for execution by a quantum processor. For instance, quantum logic gates may be formed by a "just-in-time" compiler, as in the example process flow shown in FIG. 2. In the context of FIG. 1, the just-in-time compiler may be executed on the servers 108 (e.g., by the classical processors 111), by the controllers 106A, 106B of the quantum computing systems 103A, 103B, by the other resources 107, etc. For example, one or more compilers running on the servers 108 may have access to a library of parametric circuits that can be used to form parametric quantum logic gates that are expressed in programs provided by the user devices 110A, 110B, 110C. The library of parametric circuits can be generated (and updated, modified, etc.) by a provider or an administrator of the computer system 101, and users need not be aware of, or have direct access to, the library of parametric circuits (though in some cases, users may be aware of or have access to the parametric circuits).

In some implementations, a compiler that runs outside the local environment of the quantum computing system (e.g., at a remote data center, at a user device, etc.) forms the quantum logic gates for execution by the quantum processor. For instance, quantum logic gates may be formed by a "userland" compiler, as in the example process flow shown in FIG. 3. In the context of FIG. 1, the userland compiler may be executed on the user devices 110A, 110B, 110C, by a data center or server that communicates with the user devices 110A, 110B, 110C over the wide area network 115, etc. For example, one or more compilers running on the user device 110A may have access to routines for parametric decomposition that can be used to form parametric quantum logic gates expressed in user programs. The routines for parametric decomposition can be generated (and updated, modified, etc.) by the user or an administrator of the user device 110A, and the computing system 101 need not have direct access to the routines (though in some cases, the computing system 101 has access to the routines).

In some aspects of operation, a compiler in the computing environment 100 receives a source quantum program that includes a first parametric quantum logic gate, for example, within a larger quantum circuit specified in the source quantum program. The compiler generates a compiled quantum program that corresponds to the source quantum program and is configured for a target quantum processor. In certain examples, the compiled quantum program is a binary quantum program formatted for execution by control electronics associated with the target quantum processor. In some cases, the compiled quantum program can be an updated version of the source quantum program, for example, that expresses the quantum logic circuit in terms of a native gate set of the target quantum processor. To generate the compiled quantum program, the compiler identifies a series of quantum logic gates that are logically equivalent to the first parametric quantum logic gate (e.g., the series corresponds to the same unitary operation, up to a global phase), and the series of quantum logic gates includes one or more second, different parametric quantum logic gates. In some instances, the one or more second parametric quantum logic gates (in the compiled quantum program) are selected from the native gate set of the target quantum processor, and the first parametric quantum logic gate is not included in the native gate set. In some instances, the compiler obtains the series of quantum logic gates from a library of quantum circuits. In some examples, the compiler generates the series of quantum logic gates by executing a parametric decomposition process. The compiler can be a userland compiler, a just-in-time compiler, or another type of compiler; and the compilation may be performed by multiple compilers (e.g., one or more userland compilers, one or more just-in-time compilers, etc.).

Parametric gates are a useful gate type for various quantum processors types and architectures. (See Section 5 and Theorem 3 of https://arxiv.org/pdf/quant-ph/0209120.pdf) However, certain parametric gate compilation frameworks are limited to gates of a particular form, such as RZ gates or PHASE gates, and CPHASE gates (in the case of the latter because there is a decomposition for CPHASE gates into RZ gates). One of the challenges in developing a generic interaction is that the decomposition process is mathematically intensive (e.g., it may involve matrix diagonalization), and so generating a new circuit on-the-fly is typically challenging for control electronics to do apace with the execution of a typical program on the quantum processor.

In some examples of the systems and techniques described here, a much wider class of interactions can be made available for running in the parametric gate compilation framework, where the class of interactions can be any single-parameter family U(t) in a form of $U(t)=e^{itH}$ for a time-independent Hamiltonian H. These systems and techniques generally may utilize more basic gates. In some examples, a generic static single-qubit interaction can be modeled with (at most) 3 RZs and 2 RXs, whereas a parametric decomposition would give (at most) 5 RZs and 4 RXs. In further examples, a generic static two-qubit interaction can be modeled with (at most) 3 CZs, 18 RZs, and 16 RXs, whereas a parametric decomposition would give (at most) 7 CZs, 39 RZs, and 36 RXs. The parametric decomposition approach represented here can be advantageous in a variety of circumstances, for instance, when gate fidelities are good enough that it is preferable to apply CZ 4 more times rather than spend time on recompiling a program.

In addition to the parametric compilation processes, such as described in the blog post https://medium.com/rigetti/fast-hybrid-programming-with-quantum-cloud-services-7573f48b93b5, the pyQuil documentation https://pyquil-docs.rigetti.com/en/stable/migration3-declare.html and the repo https://github.com/rigetti/quilc, which involve the formal manipulation of instruction parameters (e.g., transformations like RZ(a)*RZ(b)|->RZ(a+b) where one or both of a and b are unknown at compile time), there are also parametric compilation processes that rely on the formal manipulation of instruction definitions. For example, a gate defined as the exponential of a fixed Hermitian operator with a variable timescale can be diagonalized independently of the timescale, so that only the resulting diagonal gate has parametric entries. In turn, the diagonal gate can then be compiled using another member from this class of processes: a diagonal operator acting on any number of qubits can be expressed in terms of CNOTs and RZs, whose parameters depend explicitly on the original diagonal components (See Theorem 7 in Shende, Bullock, and Markov, Synthesis of Quantum Logic Circuits, available at https://arxiv.org/pdf/quant-ph/0406176.pdf, viewed Oct. 18, 2019.). Finally, we can remit the resulting circuit to the first class of processes, such as RZ(a)*RZ(b)|->RZ(a+b), which can be employed to reduce the overall gate count now that a parametric circuit has been generated. The inclusion of both of these types of processes thereby permit compilers to effectively process a wide class of parametric gates without direct inspection of the precise gate involved.

An example of input and output of a compilation routine described above is provided below. An example input including a first sequence of quantum logic gates defined as a user program is shown below. The first sequence defines an arbitrary interaction in a form of $U(t)=e^{itH}$ by describing H and invokes it for a duration which is not determined at compile time.

```
DECLARE time REAL # a placeholder for the unknown duration
    value DEFGATE U(% t) p q AS PAULI-SUM:

XX(3.0*% t) p q      # These terms and weights were picked at random,
YY(5.0*% t) p q      # solely for demonstration.
ZZ(11.0*% t) p q
XZ(-0.3*% t) p q     # The important thing is that the parameters are
XY(-0.4*% t) p q     # constant multiples of the timescale % t
U(t) 1 0             # Run for a duration drawn from classical memory.
```

An output including a second sequence of quantum logic gates from the compilation routine described above is shown below. The second sequence contains a number of single-qubit quantum logic gates, e.g., RZ and RX, some of which are supplied with static parameters and some of which involve the unknown parameter time. The only multi-qubit quantum logic gates are CZs, which do not involve the unknown parameter time (e.g., t). The second sequence includes five invocations of the CZ gate including a static parameter.

RZ(2.9751271567424853) 0
RX($\pi$/2) 0
RZ(0.008155761148759473) 0
RX(-$\pi$/2) 0
RZ(1.694295726891391) 1
RX($\pi$/2) 1
RZ(1.5750417888968615) 1
RX(-$\pi$/2) 1
RZ(-0.02920642762589587) 1
CZ 1 0
RZ(0.24008626295337443) 0
RX($\pi$/2) 0
RZ(0.0985968367338268) 0
RX(-$\pi$/2) 0
RZ(-$\pi$/2) 1
RX($\pi$/2) 1
CZ 1 0
RX($\pi$/2) 0
RZ(-$\pi$/2+0.024992888650574585+-
    2.0*11.004426429835265*t) 1
RX($\pi$/2) 1
RZ(-$\pi$/2) 1
CZ 1 0
RZ($\pi$+1.4722109929164544+2.0*-
    2.984013520603422*t) 0
RZ(-$\pi$/2) 1
RX(-$\pi$/2) 1
RZ(2.0*5.024764895912947*t+0.0985968367338268) 1

RX(-π/2) 1
CZ 0 1
RZ(-1.4722109929164544) 0
RX(π/2) 0
RX(π/2) 1
RZ(0.024992888650573697) 1
RX(-π/2) 1
CZ 0 1
RZ(-1.3307100638414302) 0
RX(π/2) 0
RZ(3.133436892441036) 0
RX(-π/2) 0
RZ(-2.975127156742399) 0
RZ(-1.5750436002412362) 1
RX(π/2) 1
RZ(1.6000024911387505) 1
RX(-π/2) 1
RZ(-0.12362342977341445) 1

As shown in the second sequence above, the second sequence of quantum logic gates encodes the original two-qubit interaction described by U(t) and it does not depend on knowing the value of time t at compile-time. For the sake of comparison, a third sequence which instantiates U at a randomly chosen value of time t=0.09361097960597964 is shown below, which allows the compiler to make further reductions of the number of quantum logic gates. In particular, the third sequence contains only 3 invocations of CZ (as well as no further reference to the no-longer-unknown value of time).

```
RZ(0.07362844782583933) 0    # Entering rewiring: #(0 1)
RX(π/2) 0
RZ(1.5628744985058662) 0
RX(-π/2) 0
RZ(1.5688569570125677) 0
RZ(-1.447296926698403) 1
RX(π/2) 1
RZ(1.5665508646929227) 1
RX(-π/2) 1
RZ(-1.5415898991690011) 1
CZ 0 1
RZ(-π/2) 0
RX(-π/2) 0
RZ(-π/2) 1
RX(π/2) 1
RZ(1.8672792893818464) 1
RX(-π/2) 1
CZ 0 1
RZ(0.5750133401700146) 0
RX(π/2) 0
RX(π/2) 1
RZ(-1.5837804391525463) 1
RX(-π/2) 1
CZ 0 1
RZ(2.9015063906362806) 0
RX(π/2) 0
RZ(0.008155761148760179) 0
RX(-π/2) 0
RZ(0.16646549684745882) 0
RZ(1.6000027544207924) 1
RX(π/2) 1
RZ(1.5750417888968713) 1
RX(-π/2) 1
RZ(1.4472969266984004) 1
```

Figure 2:
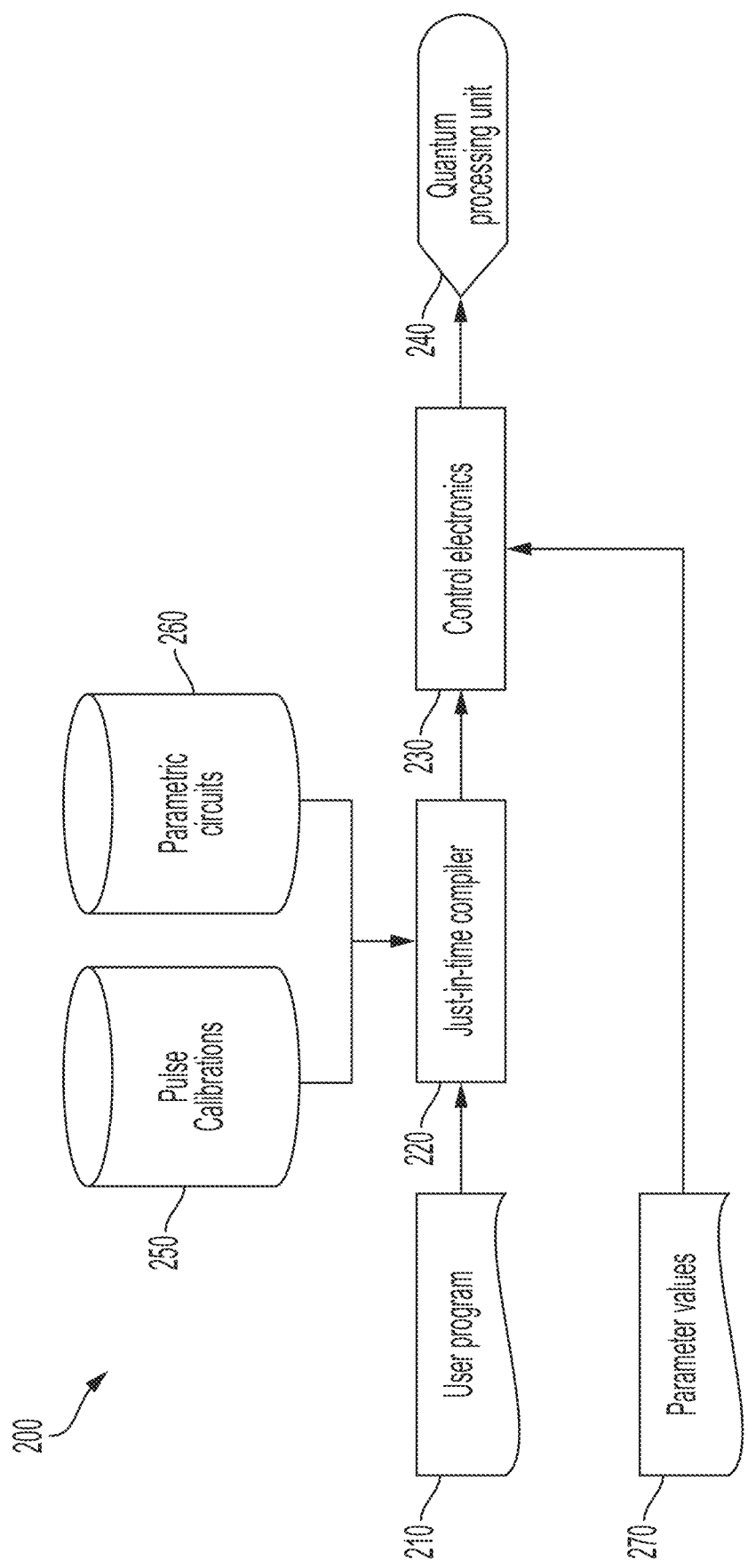
FIG. 2 is a block diagram showing aspects of an example process.

FIG. 2 is a block diagram showing aspects of an example process 200. The example process 200 is used to compile a user program 210 to a binary program which can be directly executed on a set of qubits in a quantum processing unit 240, for example, in a quantum computing system. In some implementations, the example process 200 may be used for gate compilation and gate formation. In some implementations, the quantum processing unit 240 may be implemented as the quantum processing unit 102 in the quantum computing system 103 in FIG. 1. As shown in FIG. 2, the compilation of the user program 210 is performed by a just-in-time compiler 220. In some implementations, the just-in-time compiler 220 can be operated in a computing system, for example on the servers 108, on the quantum computing systems 103, or elsewhere in the computing system 101 as shown in FIG. 1. The example process 200 may include additional or different operations, including operations performed by additional or different components, and the operations may be performed in the order shown or in another order.

Figure 15A:
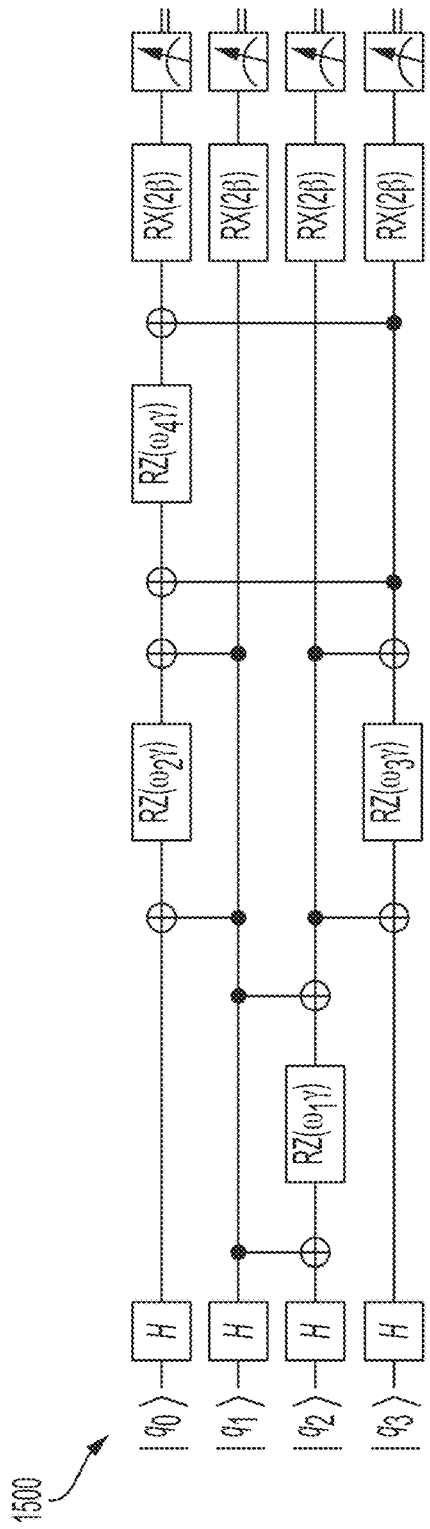
FIG. 15A is a schematic diagram showing aspects of an example circuit mapped from a maximum cut (MaxCut) topology.
Figure 15B:
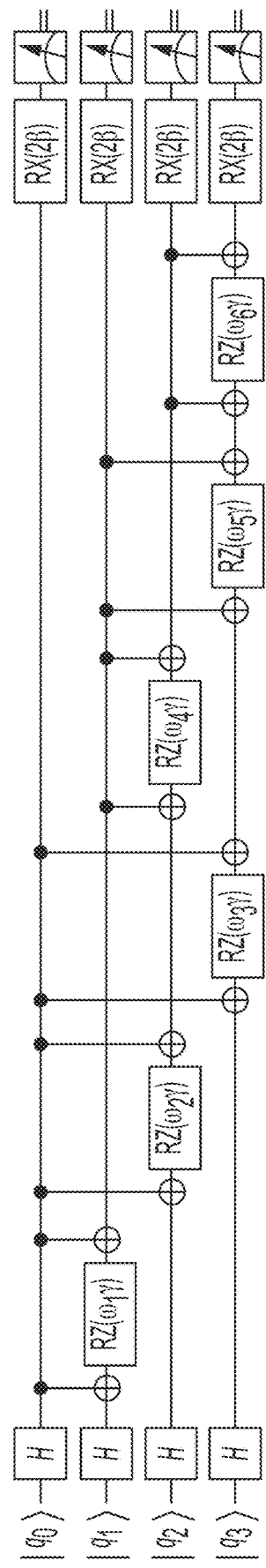
FIG. 15B is a schematic diagram showing aspects of an example circuit mapped from a maximum cut (MaxCut) topology.

In some implementations, the user program 210 can be generated by a user device, e.g., the user device 110 as shown in FIG. 1, another computer resource outside the local environment of the quantum computer system 103, or in another manner. In some implementations, the user program 210 may be an arbitrary program that is formatted as source code in human-readable form (e.g., as text). In some implementations, the user program 210 may be written in arbitrary Quil or another quantum instruction language. The user program 210 is hardware-independent, which may be implemented on a broad range of quantum processing units or quantum virtual machines. In certain implementations, the user program 210 may be a hybrid quantum/classical program. In certain examples, the user program 210 may be a raw program (e.g., the raw MAXCUT program instructions as shown in FIGS. 15A-15B).

In some implementations, the user program 210 includes a first sequence of quantum logic gates. In some implementations, the first sequence of quantum logic gates may not be directly implementable on the quantum processing unit 240. For example, the first sequence of quantum logic gates may include a Hadamard gate (H), a controlled-NOT (CNOT) gate, a parametric single-qubit rotation gate, and another quantum logic gate. In some instances, the first sequence of quantum logic gates further include one or more parametric multi-qubit quantum logic gates, for example, a parametric two-qubit quantum logic gate, a parametric three-qubit quantum logic gate, and another parametric multi-qubit quantum logic gate. In some instances, a parametric multi-qubit quantum logic gate is defined by at least one variable parameter. For example, as shown in the examples discussed below, a two-qubit quantum logic gate (e.g., a XY gate as described in FIGS. 5-16), a Controlled-Phase (CPHASE) gate (e.g., in FIGS. 17A), a Controlled-Controlled Phase (CCPHASE) gate (e.g., in FIGS. 17B-17C) may include at least one variable parameter, e.g., an entangling angle θ or an entangling phase β.

Figure 5:
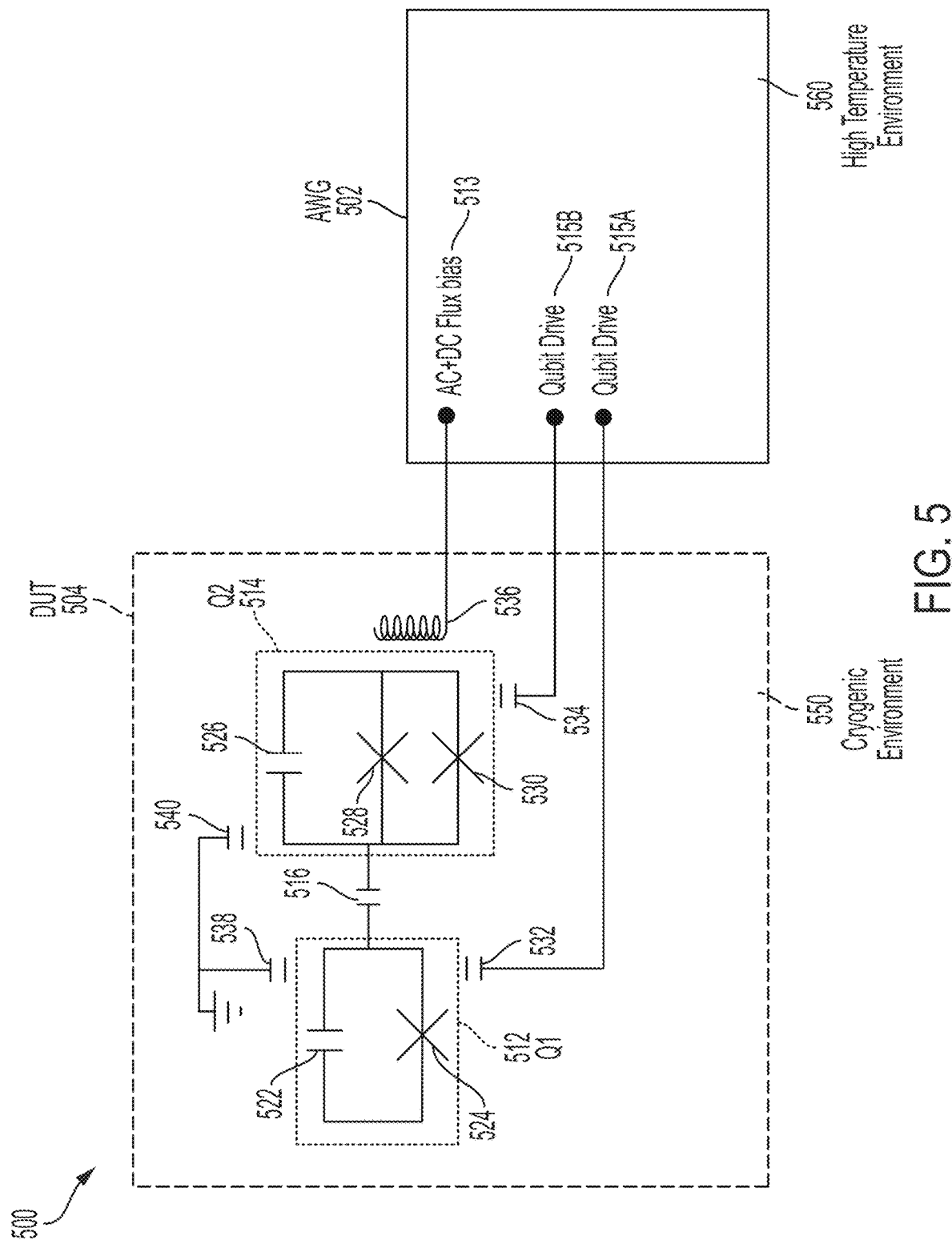
FIG. 5 is a circuit diagram showing aspects of an example quantum processing unit.

In some implementations, the user program 210 may also indicate a parameter value for a variable parameter of a parametric multi-qubit quantum logic gate in the first sequence. In some instances, the parameter value can be specified by the user device or in another manner. In certain instances, the user program 210 can also indicate a set of qubits in the quantum processing unit 240 on which a parametric multi-qubit quantum logic gate in the first sequence are applied. For example, the set of qubits in the quantum processing unit 240 may include a fixed-frequency transmon and a tunable-frequency transmon, which are capacitively coupled together, as shown in FIG. 5 or in another manner. In some implementations, the methods and systems presented here can provide technical advantages. For example, functionalities of the set of qubits in the quantum processing unit 240 can be transparent to users.

In certain instances, the just-in-time compiler 220 may receive the user program 210 directly, via a wide area network (e.g., the wide area network 115 in FIG. 1), or in another manner. As shown in FIG. 2, the user program 210 is further translated and compiled by the just-in-time compiler 220 into a native program. In some implementations, after receiving the user program 210, a native gate set associated with the set of qubits in the quantum processing unit 240 may be identified by the just-in-time compiler 220 or by another component in the quantum computing system. In some instances, the native gate set is identified according to the set of qubits in the quantum processing unit 240 specified in the user program 210 or in another manner. The native gate set includes a set of quantum logic gates which are specifically associated with the quantum processing unit 240. In certain instances, the just-in-time compiler 220 can then identify a second sequence of quantum logic gates selected from the native gate set. The second sequence of quantum logic gates corresponds to or quantum-logically equivalent to a respective parametric multi-qubit quantum logic gate in the first sequence of the user program 210. In some instances, the second sequence of quantum logic gates can be identified according to a parametric circuit database 260. In some instances, the second sequence may include at least one parametric quantum logic gate, e.g., a parametric single-qubit quantum logic gate, a parametric two-qubit quantum logic gate, or another parametric multi-qubit quantum logic gate. In some instances, the second sequence may include one or more non-parametric quantum logic gate. The parameter value for the variable parameter of the parametric multi-qubit quantum logic gate in the first sequence can be assigned to a respective variable parameter of the parametric quantum logic gate in the second sequence by the just-in-time compiler 220 or in another manner.

In some implementations, the parametric circuit database 260 includes a predetermined lookup table including a mapping between each of the one or more parametric multi-qubit quantum logic gates in the first sequence and a corresponding second sequence of quantum logic gates for execution on a respective set of qubits in the quantum processing unit 240. For example, the second sequence of quantum logic gates can be different for the same parametric multi-qubit quantum logic gate when being executed on different sets of qubits. In some instances, the parametric circuit database 260 may be populated with a set of parametric multi-qubit quantum logic gates and their respective equivalent quantum circuits. The parametric circuit database 260 may include equivalent quantum circuits shown, for example, in FIGS. 8A-8D and 17A-17C.

In some implementations, the just-in-time compiler 220 can further generate the native program. The native program includes a third sequence of quantum logic gates corresponding to or quantum-logically equivalent to the first sequence of quantum logic gates in the user program 210. In some instances, the third sequence of quantum logic gates includes the second sequence of quantum logic gates. The third sequence of quantum logic gates may include any type of parametric single-qubit rotation, any type of parametric two-qubit interaction, a parametric controlled (or a controlled-controlled) single-qubit rotation, a parametric controlled (or a controlled-controlled) two-qubit interaction, or another type of parametric quantum logic gate.

Figure 10:
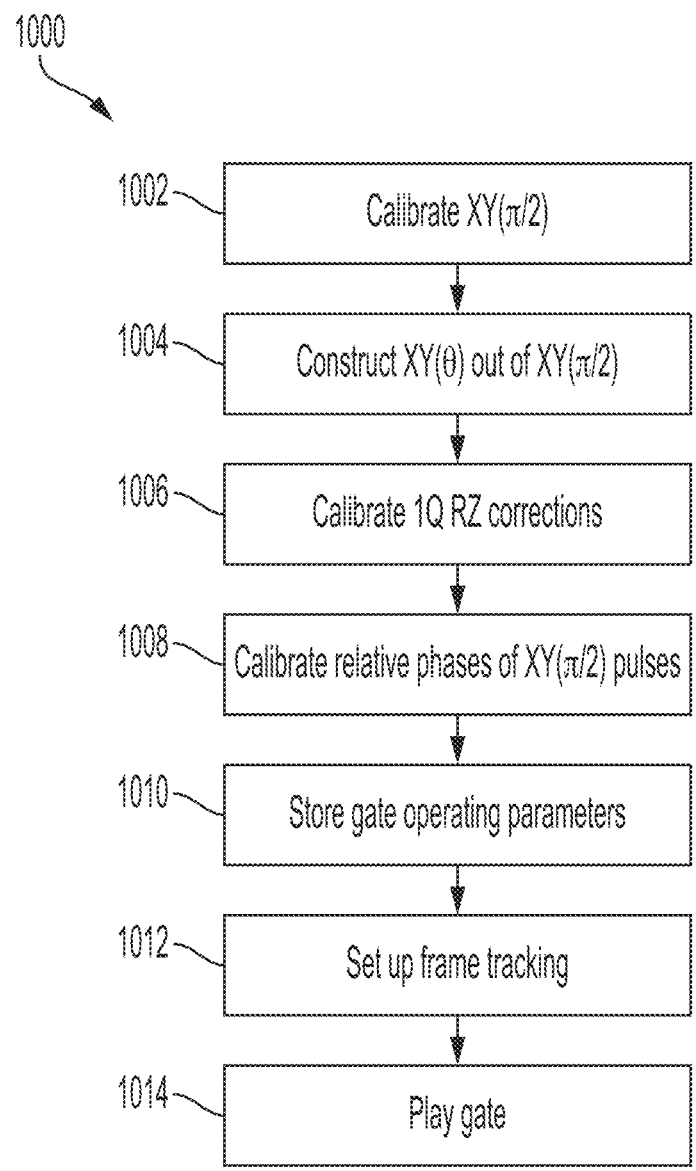
FIG. 10 is a flow diagram showing aspects of an example process.

In some implementations, a pulse calibration database 250 may include parameters that are required to operate quantum logic gates in the third sequence on the set of qubits in the quantum processing unit 240. In some instances, when a different set of qubits is selected, the parameters that are required to operate quantum logic gates in the third sequence can be different. In some examples, the parameters for operating the quantum logic gates in the third sequence in the pulse calibration database 250 may be calibrated with respect to a calibration process, e.g., the example process 1000 as shown in FIG. 10, or in another manner. In some implementations, the pulse calibration database 250 may include at least one of the following parameters, including gate time, gate amplitude, gate frequency, relative phase between two $XY(\pi/2)$ pulses, relative phase between XY frame and single qubit frames, single-qubit RZ corrections, and another parameter. In some implementations, once all parameters needed to operate the quantum logic gates in the third sequence are calibrated, the parameters are stored in the pulse calibration database 250 which can be easily retrieved to perform a calibrated quantum logic gate. In some instances, the just-in-time compiler 220 may apply the pulse calibration to the native program to provide parameters to the third sequence of quantum logic gates. In certain implementations, a calibration process, e.g., the example process 1000 may be required to perform once prior to the example process 200 shown in FIG. 2. In certain instances, the calibration process may be performed again when an event is triggered. For example, when a significant change in a measured fidelity is obtained through a benchmarking process, a recalibration of the flux pulse may be performed. For another example, when a user program includes a request for recalibration, a recalibration of the flux pulse may be also performed.

As shown in FIG. 2, parameter values 270 of variable parameters can be directly provided to control electronics 230 to specify parameter values for the one or more parametric multi-qubit quantum logic gate in the first sequence of the user program 210 (e.g., modify flux pulses). In some instances, the control electronics 230 may be implemented as the controller 106 of the quantum computing system 103. The control electronics 230 may further convert the native program with the third sequence of quantum logic gates to a binary program. In some instances, the parameter values 270 may be used to specify parameter values of the variable parameters in the parametric quantum logic gates of the third sequence in the native program.

Figure 3:
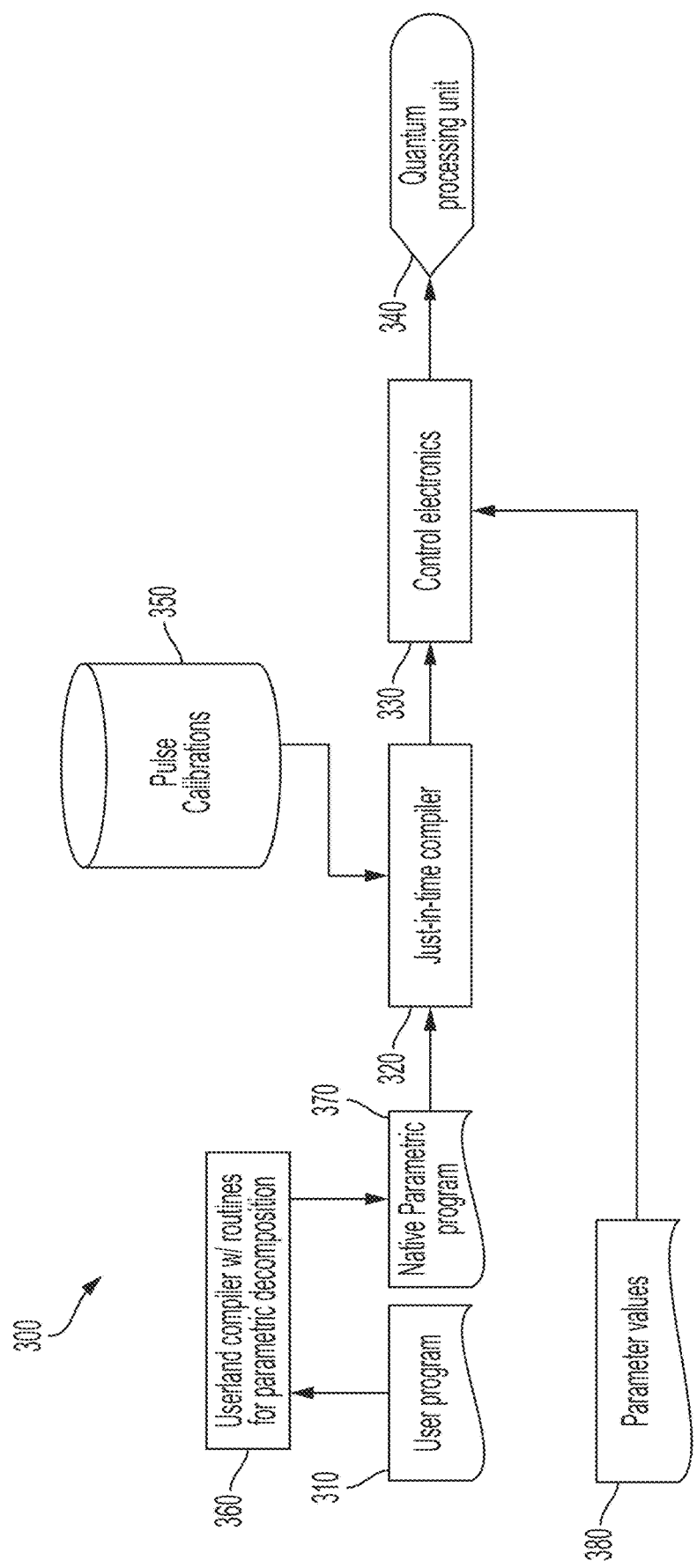
FIG. 3 is a block diagram showing aspects of an example process.

FIG. 3 is a block diagram showing aspects of an example process 300. The example process 300 is used to compile a user program 310 to a binary program which can be directly executed on a set of qubits in a quantum processing unit 340. In some implementations, the example process 300 may be used for gate compilation and gate formation. In some implementations, the quantum processing unit 340 may be implemented as the quantum processing unit 102 in the quantum computing system 103 in FIG. 1. As shown in FIG. 3, the compilation of the user program 310 is performed by a userland compiler 360 and a just-in-time compiler 320. In some implementations, the userland compiler 360 may be operated on a user device 110 or other computer resources outside the local environment of the quantum computer system 103. In some implementations, the just-in-time compiler 320 can be operated on the servers 108, on the quantum computing systems 103, or elsewhere in the computing system 101 as shown in FIG. 1. In some implementations, the just-in-time compiler 320 may be implemented as the just-in-time compiler 220 in FIG. 2 or in another manner. The example process 300 may include additional or different operations, including operations performed by additional or different components, and the operations may be performed in the order shown or in another order.

In some implementations, the user program 310 may be implemented as the user program 210 shown in FIG. 2 or in another manner. In this example, the userland compiler 360 includes routines for parametric decomposition (e.g., Rigetti Computing's quilc compiler) which can translate parametric interactions (e.g., one or more parametric multi-qubit quantum logic gate in a first sequence of quantum logic gates of the user program 310) into a native parametric program 370. As shown in FIG. 3, the user program 310 is received, translated, and compiled by the userland compiler 360 by executing the routines for parametric decomposition to determine a second sequence of quantum logic gates which is corresponding to and quantum-logically equivalent to a respective parametric multi-qubit quantum logic gate in the first sequence of the user program 310. In some implementations, the methods and systems described here for compiling the user program 310 to the native program 370 may be based on an advanced compilation framework and can enable users to describe an arbitrary interaction, rather than based on a predetermined set of parametric quantum logic gates stored in a database (e.g., the parametric circuit database 260 in FIG. 2).

As shown in FIG. 3, parameter values 380 can be provided to the control electronics 330 to specify parameter values for the parametric multi-qubit quantum logic gate in the user program 310. In some implementations, the user program 310, the userland compiler 360 and the parameter values 380 are provided by a user device (e.g., the user device 110 shown in FIG. 1), while the other components shown in FIG. 3 are provided by a quantum computing system or a local environment of the quantum computing system.

In some implementations, the just-in-time compiler 320 can obtain parameters from a pulse calibration database 350, which may be implemented as the pulse calibration database 250 in FIG. 2 or in another manner. The parameters specified in the pulse calibration database 350 shown in FIG. 3 can be applied to the native program 370 by the just-in-time compiler 320 to specify parameters for operating the quantum logic gates in the native program. In some implementations, a pulse calibration database 350 including pulse calibrations may be generated using the example process 1000 described in FIG. 10 or in another manner.

The example described below with respect to FIGS. 5-16 in which $\sqrt{\text{iSWAP}}$ gates are used to construct the entire XY family, is an example parametric decomposition process. These processes produce parametric gate families out of a combination of non-parametric gates, parametric single-qubit quantum logic gates, and enhanced software control. Generally speaking, an arbitrary operation in a form of $U(t) = e^{iHt}$ can be expressed as $U(t) = V^*D(t)V$, where V is a fixed, time-independent quantum logic gate depending only on H, and D is a parametric quantum logic gate which includes a variable parameter, e.g., t. In some instances, the parametric quantum logic gate D(t) belongs to a prescribed (maximal, commuting) family of parametric quantum logic gates, each of which carries a known parametric decomposition in terms of the native gate set. For example, diagonal gates can be parametrically decomposed into a native gate set including CZ gates, $RX(k\pi/2)$ gates, and $RZ(\theta)$ gates, where $\theta$ is a variable parameter and allowed to vary freely (See Theorem 7 in Shende, Bullock, and Markov, Synthesis of Quantum Logic Circuits, available at https://arxiv.org/pdf/quant-ph/0406176.pdf, last viewed Oct. 18, 2019.), and they form such a maximal family. In the following example, a parametric multi-qubit gate (e.g., a $XY(\theta)$ gate in a first sequence of the user program 310) can be decomposed into a second sequency of quantum logic gates in a native program, which can be expressed as:

$RZ(\pi)$ 0
$RX(\pi)$ 0
$RZ(\pi/2)$ 1
$RX(-\pi/2)$ 1
CZ 1 0
$RX(\pi/2)$ 0
$RZ(\pi/4)$ 0
$RX(-\pi/2)$ 0
$RZ(\pi)$ 1
$RX(\pi/2)$ 1
CZ 1 0
$RX(\pi/2)$ 0
$RZ(-\pi/4)$ 0
$RX(\pi/2)$ 0
$RX(\pi/2)$ 1
CZ 1 0
$RZ(\theta+\pi)$ 0
$RZ(-\pi)$ 1
$RX(-\pi/2)$ 1
$RZ(\theta)$ 1
$RX(\pi/2)$ 1
CZ 1 0
$RX(\pi/2)$ 0
$RZ(-3\pi/4)$ 0
$RX(\pi/2)$ 0
$RZ(\pi)$ 1
$RX(-\pi/2)$ 1
CZ 1 0
$RX(\pi/2)$ 0
$RZ(\pi/4)$ 0
$RX(-\pi/2)$ 0
$RZ(\pi)$ 1
$RX(\pi/2)$ 1
CZ 1 0
$RX(-\pi/2)$ 1
$RZ(-\pi/2)$ 1.

In this example the variable parameters in the RZ gate are either $\theta$ or $\theta+\pi$, but in general they may be complicated expressions in terms of the original $\theta$, which places greater arithmetical demands on the execution platform. Additionally, some mechanism is needed to produce such gate decompositions and provide them to the user (e.g., through compilation software) in advance of the translation of a user program to a native program acceptable by the execution platform (e.g., the quantum computing system 103 shown in FIG. 1). In some implementations, the execution platform need not learn how to synthesize and control whole new parametric families. Depending upon the relative execution properties of native programs, the execution platforms may prefer to employ any of these techniques to improve overall program fidelity when deploying the XY gate family—or any other parametric multi-qubit quantum logic gate family. For example, a decomposition of an $XY(\theta)$ gate may generate a native program with 6 invocations of CZ gates in the example sequence shown above. A decomposition of the $XY(\theta)$ gate may generate a native program with a single iSWAP gate or two $\sqrt{\text{iSWAP}}$ gates as described below in FIGS. 8A-8D, which can be executed on the two-qubit quantum processing unit 504 shown in FIG. 5. In some cases, a native program may include the $XY(\theta)$ gate, which can be directly synthesized on a particular quantum processing unit without decomposition.

In general, any rotation about the x-axis of a 3-dimensional unit sphere can be decomposed into 90-degree rotations about the X axis and rotations about the Z axis. More specifically: $X(\theta)=Z(-\pi/2) X(\pi/2) Z(\pi-\theta) X(\pi/2) Z(-\pi/2)$. This identity can be applied to a parametric multi-qubit quantum logic gate scheme to allow one to access a gate that enacts some parameterized rotation about a single axis (e.g., the X axis), in order to realize all degrees of rotation while only having to calibrate a single flux pulse (e.g., a iSWAP pulse), for example, as described in the example flow 1000 in FIG. 10 or in another manner.

Figure 4:
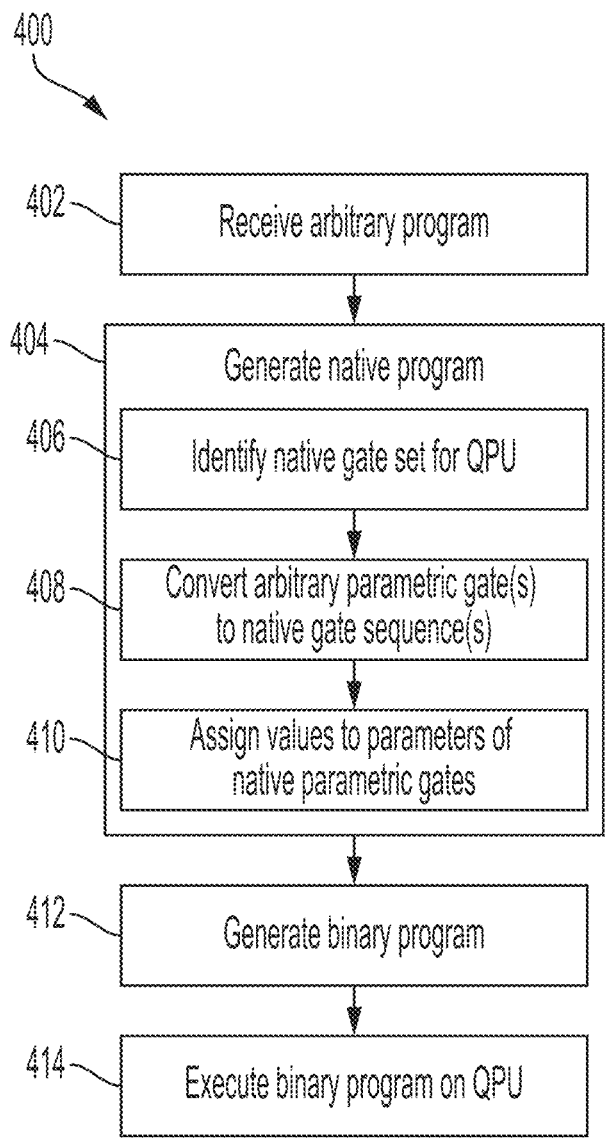
FIG. 4 is a flow diagram showing aspects of an example process.

FIG. 4 is a flow diagram showing aspects of an example process 400. The example process 400 can be implemented for parametric gate compilation and gate formation in frameworks shown in FIGS. 2 and 3. In some implementations, the example process 400 can be used for parametric gate compilation by generating a binary program (e.g., an output sequence of quantum logic gates) from an arbitrary user program (e.g., an input sequence of quantum logic gates). The example process 400 may include additional or different operations, including operations performed by additional or different components, and the operations may be performed in the order shown or in another order.

At 402, an arbitrary program is received. In some instances, an arbitrary program may be generated by a user device, e.g., the user device 110 as shown in FIG. 1, another computer resource outside the local environment of the quantum computer system 103, or in another manner. In certain instances, the arbitrary program is an arbitrary Quil program. For example, the arbitrary program can be the user programs 210, 310 shown in FIGS. 2 and 3. The arbitrary program includes one or more arbitrary parametric multi-qubit quantum logic gates. In some instances, an arbitrary program may be received by a just-in-compiler (e.g., the just-in-compiler 220 shown in FIG. 2), which is used to translate source code in the arbitrary program to bytecode in a native program, which can be further converted to machine code in a binary program by operation of control electronics (e.g., the control electronics 230, 330 shown in FIGS. 2 and 3). In certain instances, an arbitrary program may be received by a userland compiler (e.g., the userland compiler 360 shown in FIG. 3), which can be used to translate source code in the arbitrary program to bytecode in a native program. In some instances, the arbitrary program can be received by another compiler (e.g., the just-in-time compiler 320 in FIG. 3) and further processed by control electronics (e.g., the control electronics 330 in FIG. 3) to be converted to machine code in a binary program.

At 404, a native program is generated. For example, the arbitrary Quil program may be compiled to a native program, which is specific to the quantum logic operations that can be executed on a set of qubits in a quantum processing unit. In some implementations, the native program can be generated by a just-in-time compiler located in the local environment of a quantum computing system (e.g., discussed above in FIG. 2) or by a userland compiler located outside the local environment of the quantum computing system (e.g., discussed above in FIG. 3). In some instances, the native program may include one or more native gate sets which are quantum-logically equivalent to the respective one or more arbitrary parametric multi-qubit quantum logic gates in the arbitrary program. As shown in FIG. 4, operation 404 includes sub-steps 406, 408 and 410. In some instances, the operation 404 may include additional or different substeps, including operations performed by additional or different components, and the operations may be performed in the order shown or in another order.

At 406, a native gate set is identified for the quantum processing unit. The native gate set includes a set of quantum logic gates associated with the quantum processing unit. In some implementations, the native gate set may be identified according to the arbitrary program which may include an indication of a set of qubits in a quantum processing unit on which the arbitrary program can be executed. In some examples, the native gate set can be identified by a compiler (e.g., the just-in-time compiler 220 in FIG. 2 or the userland compiler 360 in FIG. 3).

At 408, an arbitrary parametric multi-qubit quantum logic gate is converted to a native gate sequence. In some instances, the native gate sequence includes a second sequence of quantum logic gates, which includes native parametric gates. In some implementations, when the arbitrary program includes more than one arbitrary parametric multi-qubit gates, more than one respective native gate sequences can be generated. In some instances, a native gate sequence for an arbitrary parametric multi-qubit quantum logic gate can be generated according to a database with a predetermined library, for example the parametric circuit database 260 on the just-in-time compiler 220 as shown in FIG. 2. In some instances, a native gate sequence for an arbitrary parametric multi-qubit quantum logic gate can also be generated by performing a parametric decomposition routine, for example on the userland compiler 360. In certain instances, a native gate sequence for a parametric multi-qubit quantum logic gate can also be generated in another manner. In some implementations, the native gate set may be identified by the userland compiler 360 according to the set of qubits specified in the user program 310 as shown in FIG. 3. In some instances, the native gate sequence includes one or more parametric native gates. Each of the parametric native gates may be a parametric single-qubit rotation gate, a parametric two-qubit quantum logic gates, a parametric three-qubit quantum logic gate, or another parametric quantum logic gate. In addition to the parametric quantum logic gates, the native gate sequence includes one or more non-parametric quantum logic gates.

In some instances, the native program with a second sequence of quantum logic gates representing the first sequence of quantum logic gates in the arbitrary program can be generated. The second sequence in the native program includes quantum logic gates which belong to the native gate set and further includes one or more native gate sequences corresponding to the one or more arbitrary parametric multi-qubit quantum logic gates in the arbitrary program.

At 410, parameter values are assigned to parameters of the native parametric gates. In some instances, the parametric values may be identified based on the arbitrary parametric multi-qubit quantum logic gate in the first sequence in the arbitrary program. For example, the arbitrary parametric multi-qubit quantum logic gate in the arbitrary program and the parametric native gate in the native gate sequence of the native program include a parametric two-qubit XY gate with two variable parameters. In some instances, parameter values for the variable parameters can be assigned by the arbitrary program and parameter values for the variable parameters can be modified or updated by the native program. In some instances, parameter values can be retrieved from a database, e.g., the pulse calibration database 250, 350 shown in FIGS. 2 and 3 or in another manner. For example, when the parametric native gate includes parametric single-qubit rotation gates, rotation angles of the parametric single-qubit rotation gates can be determined based on the pulse calibration database 250.

At 412, a binary program is generated. Once the native program is generated, the native program can be further compiled to a binary program including machine-level instructions, which can be executed directly by the set of qubits in the quantum processing unit. In some instances, the binary program may include a binary gate sequence corresponding to the second sequence of the native program that, when performed by an appropriate computing resource, generate output data based on input data. The binary gate sequence includes a sequence of quantum logic gates corresponding to the quantum logic gates in the second sequence of the native program.

At 414, the binary program is executed on the quantum processing unit. In some implementations, the set of qubits in the quantum processing unit (e.g., two-qubit system 500 shown in FIG. 5) can perform quantum computation represented by the binary gate sequence. For example, the qubits can be initialized in an initial state, and the binary gate sequence can be applied by applying control signals to the set of qubits to transform the qubits and extract measurements representing the output of the quantum computation. Individual qubits may be controlled by single-qubit quantum logic gates, and pairs of qubits may be controlled by two-qubit quantum logic gates (e.g., XY gates that are capable of generating entanglement between the pair of qubits). In some instances, information can be read out from the set of qubits by measuring quantum states of the qubits.

An iSWAP gate is a member of a family of XY gates. In some implementations, a XY gate is a coherent rotation by some angle between the |01⟩ and |10⟩ states. In some instances, a XY gate, $XY(\beta, \theta)$, can be defined as:

$$XY(\beta, \theta) = \begin{pmatrix} 1 & 0 & 0 & 0 \\ 0 & \cos\left(\frac{\theta}{2}\right) & i\sin\left(\frac{\theta}{2}\right)e^{i\beta} & 0 \\ 0 & i\sin\left(\frac{\theta}{2}\right)e^{-i\beta} & \cos\left(\frac{\theta}{2}\right) & 0 \\ 0 & 0 & 0 & 1 \end{pmatrix}, \quad (1)$$

where $\beta$ is the entangling phase of the interaction which may be controllable depending on the implementation, and $\theta$ is the rotation angle which depends on the time and entangling strength of the interaction. In some instances, when the entangling phase equals zero, e.g., $\beta=0$, the XY gate $XY(\theta)=XY(0, \theta)$. In certain instances, when the entangling phase equals zero and the entangling angle equals $\pi$, e.g., $\beta=0$ and $\theta=\pi$, $XY(\pi)=$iSWAP. Similarly, when the entangling phase equals zero and the entangling angle equals $$\frac{\pi}{2},$$

e.g., $\beta=0$ and $$\theta = \frac{\pi}{2}, XY\left(\frac{\pi}{2}\right) = \sqrt{iSWAP}.$$

In some implementations, when access to a full family of variable strength XY gates is given, average gate depth can be reduced by ~30% for generic circuits, counting only two-qubit entangling gates. The advantages of particular entangling gates become even clearer when they are well mapped to the problem structure. For example, excitation-preserving operations, such as the XY family—including iSWAP—are of particular interest for Variational Quantum Eigenvalue (VQE), for example, for directly emulating dipole-dipole interactions between orbitals. Similarly, excitation-preserving operations also ensure searches for the solution of some combinatorial problems remain in the feasible space.

FIG. 5 is a circuit diagram showing aspects of an example quantum computing system 500. The example quantum computing system 500 can be used to implement a quantum program. In some instances, the example quantum computing system 500 may receive and execute the binary program generated by the control electronics 230, 330 shown in FIGS. 2 and 3 and to perform the operation 414 shown in FIG. 4. The example quantum computing system 500 includes an arbitrary waveform generator (AWG) 502 that generate electromagnetic waveforms and a device under test (DUT) 504. The DUT 504 is a quantum processing unit including two qubits, e.g., a first qubit (Q1) 512 and a second qubit (Q2) 514. In some implementations, the first and second qubits 512, 514 may be part of a multi-qubit (e.g., 16 qubits) lattice of superconducting qubits in the quantum processing unit 504.

As shown in FIG. 5, the first qubit 512 and the second qubit 514 are transmons and they are capacitively coupled together via a capacitor 516. The first qubit 512 has a fixed frequency ($\omega_{F_{01}}$), and the second qubit 514 has a tunable frequency ($\omega_{T_{01}}$). In some implementations, each of the first and second qubits 512, 514 can have a respective coplanar waveguide readout resonator coupled to a common readout line. In the example quantum computing system 500 shown in FIG. 5, the first and second qubits 512, 514 are controlled by respective qubit drive lines 515A, 515B from the AWG 504, which are capacitively coupled the first and second qubits 512, 514 via respective capacitors 532, 534. The second qubit 514 is inductively tuned by an AC/DC flux bias line 513 of the AWG 504 via an inductor 536, which is also used to activate the XY interaction (e.g., to apply the XY gate, $XY(\beta, \theta)$). The first and second qubits 512, 514 shown in the example quantum computing system 500 are capacitively coupled to the ground plane via respective capacitors 538, 540. Parameters of the first and second qubits 512, 514 are listed in FIG. 6.

FIG. 6 is a table 600 showing example parameters for two qubits 512, 514 in the quantum computing system 500 of FIG. 5. The parameters shown in FIG. 6 include relevant parameters such as qubit transition frequency ($f_{01}$) in Giga Hertz (GHz), tunability in GHz, qubit relaxation time and qubit coherence time, readout fidelity in percentage (%) and single-qubit (1Q) gate fidelity in %. The qubit transition frequency ($f_{01}$) of the second qubit 514 is measured without applied flux pulses. 1Q gate fidelity is measured using randomized benchmarking with the first and second qubits 512, 514 in parallel, and the error bars are 1σ errors on the fit to the decay curve. An average value of the error probabilities for the 0 and 1 states measured individually is used to extract a readout fidelity. In some implementations, error bars for coherence measurements as well as the readout fidelity may reflect the standard error of the mean over several individual measurements.

The qubit transition frequencies ($f_{oi}$) of the first and second qubits 512, 514 are 3.821 and 4.759 GHz, respectively. Without flux pulses applied to the second qubit 514 via the AC/DC flux bias line 513, the relaxation time ($T_1$) and the qubit coherence time ($T_2^*$) of the first qubit 512 is 27±2 microsecond (µs) and 11±1 µs; and the relaxation time ($T_1$) and the qubit coherence time ($T_2^*$) of the second qubit 514 is 7±4 µs and 8±1 µs. With flux pulses applied to the second qubit 514 via the AC/DC flux bias line 513, the qubit relaxation time ($\tilde{T}_1$) and the qubit coherence time ($\tilde{T}_2^*$) of the first qubit 512 is 24±2 µs and 13±1 µs; and the qubit relaxation time ($\tilde{T}_1$) and the qubit coherence time ($\tilde{T}_2^*$) of the first qubit 512 is 26±4 µs and 14±1 µs. Non-simultaneous readout fidelities of the first and second qubit 512, 514 are 93.8±0.1% and 96.3±0.1%, respectively. The simultaneous single qubit gate fidelities of the first and second qubits 512, 514 as measured by interleaved randomized benchmarking (iRB) are 99.83±0.01% and 99.84±0.02%, respectively.

As shown in FIG. 5, the AWG 502, which may be placed in a high-temperature environment 560 (e.g., room-temperature environment), has dedicated qubit drive lines 515A, 515B for the first and second qubits 512, 514 that transmit microwave pulses in order to enact single-qubit gates. The AWG 502 also has a dedicated channel that combines DC and AC current sources (e.g., AC/DC flux bias 513) in order to tune the second qubit 514, and to enact parametric entangling gates (e.g., the XY gate) between the first and second qubits 512, 514. In some implementations, in order to operate the XY gate, the AWG 502 maintains phase coherence across all channels shot-to-shot. The DUT 504 is placed in a cryogenic environment 550, for example, at the bottom of a dilution refrigerator or the lowest-temperature thermal stage of the cryogenic environment 550. In some implementations, the quantum processing unit 504 may be coupled to the AWG 502 via additional components, including attenuators and filters.

In some implementations, the family of parametric entangling gates (e.g., the XY gate) can be obtained from the capacitive coupling between a fixed-frequency transmon, F, and a tunable transmon, T. For example, the XY gate can be obtained from the first and second qubits 512, 514 which are capacitively coupled together. Expressed in the transmon eigenbasis (notation $|F, T\rangle = |F\rangle \otimes |T\rangle$), the Hamiltonian can be expressed as $$H(t) = \omega_{F_{01}}|1\rangle\langle 1| \otimes [+\omega_{T_{01}}(t)]|1\rangle\langle 1| + g(|1\rangle\langle 0| + |0\rangle\langle 1|) \otimes (|1\rangle\langle 0| + |0\rangle \quad (2)$$

$$\langle 1|).$$

In some implementations, the tunable transmon frequency, $\omega_{T_{01}}(t)$ can be modulated by applying a flux bias $\Phi(t)$, e.g., from the AC+DC flux bias line 513 of the AWG 502 to the second qubit 514 via the inductor 536. In some implementations, the flux bias $\Phi(t)$ applied on the second qubit 514 can be expressed as:

$$\Phi(t) = \Phi_{dc} + \Phi_{ac} u(t)\cos(\omega_p t + \phi_p), \quad (3)$$

where $\Phi_{dc}$ is the DC bias, $\Phi_{ac}$ is the modulation amplitude of the flux bias $\Phi(t)$, u(t) is the modulation envelope, $\omega_p$ is the modulation angular frequency, and $\phi_p$ is the modulation phase. In some implementations, the modulation envelope u(t) may be characterized by a rise time, a fall time, and an interaction time $t_{rice} < t < t_{rise} + \tau$ in between the rise and fall times during which u(t)=1. In some implementations, the modulation frequency $f_p$ (e.g., $f_p = \omega_p/2\pi$), may be selected to compensate the detuning between the first and second qubits 512, 514. In some instances, the modulation frequency $f_p$ may depend on the modulation amplitude $\Phi_{ac}$.

In some implementations, a parametric entangling gate may be activated during the interaction time, e.g., $t_{rise} < t < t_{rise} + \tau$, and the first and second qubits 512, 514 can be considered uncoupled during the rise and fall times. The entangling angle θ and the entangling phase of the XY gate can be defined by the parameters of the effective Hamiltonian which can be expressed as:

$$H_{int}(t) = g e^{i\Delta(t)}|01\rangle\langle 10| + H.c., \quad (4)$$

where g is the coupling strength and δ(t) is the dynamical phase, $$\delta(t) = \int_0^t dt'[\omega_{T_{01}}(t') - \omega_{F_{01}}], \quad (5)$$

when the rotating wave approximation is used (e.g., the $|00\rangle \leftrightarrow |11\rangle$ transition is highly detuned relative to the coupling strength). The tunable transmon frequency $\omega_{T_{01}}$ can be Fourier expanded and expressed as below, $$\omega_{T_{01}}(t) = \omega_0(t) + 2\sum_{k=1}^{\infty} \omega_k(t)\cos[k(\omega_p t + \phi_p)], \quad (6)$$

$$\omega_k(t) = \sum_{n \in \mathbb{N}} v_n \cos\left(n\phi_{dc} + k\frac{\pi}{2}\right) J_k[n\phi_{ac} u(t)], \quad (7)$$

where $\phi_{dc,ac} = 2\pi\Phi_{dc,ac}/\Phi_0$, $\Phi_0$ is the constant phase offset, $J_k(x)$ is the Bessel function, and $v_n$ is the Fourier coefficients of the tunable transmon frequency $\omega_{T_{01}}$ with respect to the DC flux bias $\Phi_{dc}$.

To get a qualitative understanding of the effect of the rise time on the entangling phase β, the transient dynamics is simplified by assuming that the harmonics are switched on with the modulation envelope u(t). A symmetric modulation envelope (e.g., $t_{fall} = t_{rise}$) is assumed based on the error function, e.g., $u(t) = \{\text{erf}[(t-t_1)/(\sigma t_{rise})] - \text{erf}[(t-t_2)/(\sigma t_{rise})]\}/2$, with $t_1 = t_{rise}/2$, $t_2 = \tau + 3t_{rise}/2$, σ is a constant, and $\sigma = 1/\sqrt{32\log 2}$. During the interaction time, $t \in [t_{rise}, t_{rise} + \tau]$, the dynamical phase (δ(t)) can be approximated by:

$$\delta(t) = (\omega_0 - \omega_{F_{01}})t + \sum_{k=1}^{\infty}\left\{\frac{2\omega_k}{k\omega_p}\sin[k(\omega_p t + \phi_p)] + \alpha\right\}, \quad (8)$$

$$\alpha = \frac{1}{2}(\omega_{T_{01}} - \omega_0)t_{rise} - \sum_{k=1}^{\infty} e^{-(\frac{\sigma}{2}k\omega_p t_{rise})^2}\frac{2\omega_k}{k\omega_p}\sin\left[k\left(\frac{1}{2}\omega_p t_{rise} + \phi_p\right)\right], \quad (9)$$

where α is the dynamical phase coming from the initial conditions and the rise time.

The Hamiltonian $H_{int}(t)$ can then be Fourier expanded, which can be expressed as:

$$H_{int}(t) = g\Sigma_{n \in \mathbb{Z}} \varepsilon_n e^{i(\omega_0 + n\omega_p - \omega_{F_{01}})t + i(n\phi_p + \alpha)}|01\rangle\langle 10| + H.c., \quad (10)$$

where $\varepsilon_n$ is a sideband weight for a respective sideband n, e.g., $\varepsilon_n \in \mathbb{R}$. An XY gate is activated when a sideband $n_0$ is at resonance with the fixed transmon frequency, e.g., $\omega_0 + n_0 \omega_p = \omega_{F_{01}}$. When parking at a DC sweet spot (e.g., $\Phi_{dc} = 0$ and $\Phi_{dc} = \Phi_0/2$ for asymmetric SQUIDs), the sideband weight of odd sidebands vanishes, and when the first qubit 512 (e.g., the fixed transmon) is below the tunability band, the chosen sideband is usually $n_0 = -2$. In some instance, the effective Hamiltonian can be expressed as:

$$H_{eff} = -g_{eff}[e^{i\beta}|01\rangle\langle 10| + e^{-i\beta}|10\rangle\langle 01|], \quad (11)$$

where $g_{eff}$ is the effective coupling strength which is defined by the coupling strength renormalized by the sideband weight, e.g., $g_{eff} = g|\varepsilon_{n_0}|$, the entangling phase $\beta = -2\phi_p + \alpha + \pi$, when $\varepsilon_{n_0} > 0$; and the entangling phase $\beta = -2\phi_p + \alpha$, when $\varepsilon_{n_0} < 0$. The corresponding evolution operator, e.g., $e^{-H_{eff} t}$, is equal to the XY gate defined in Equation (1), up to a sign convention for the entangling angle θ, with $\theta = g_{eff}(t-t_{rise})$.

Because the sideband weight $\varepsilon_n$ is independent of the modulation phase $\phi_p$, the entangling angle θ is independent of the modulation phase $\phi_p$. The dependence of the angle α on the modulation phase $\phi_p$ as shown in Equation (9) is suppressed by $e^{-(\omega_p t_{rise}\sigma)^2}$, which is below $10^{-3}$ for $t_{rise} > 2/f_p$. For a typical modulation frequency $f_p$ of 200 MHz, this term is negligible for rise times above 10 ns. Up to a constant offset, the dependence of the entangling phase β on the modulation phase $\phi_p$ is then well approximated by $\beta \equiv \mp 2\phi_p$, depending on the sign of $\omega_0 - \omega_{F_{01}}$.

In some implementations, the XY gate corresponds to coherent population exchange between the |01⟩ and |10⟩ states, and thus can be directly generated in systems where a particular form of the anisotropic exchange Hamiltonian is naturally available. A particular system exhibiting the requisite Hamiltonian is that of superconducting qubits with flux tunability, for example, the DUT 504 shown in FIG. 5 or in another manner. For example, directly bringing two coupled qubits into resonance turns on this interaction. It is also possible to effectively bring the coupled qubits into resonance using a modulation sideband from frequency modulating a flux-tunable qubit. In particular, for the setting of a fixed-frequency qubit coupled to a tunable-frequency qubit parked at a DC sweet spot and flux-modulated at frequency $\omega_p$, the effective Hamiltonian in the appropriate interaction picture can be expressed as, $$\hat{H}_{int} = g_{eff} e^{i(2\omega_p - \Delta)t} e^{i\beta} |01\rangle\langle 10| + h.c., \quad (12)$$

where $g_{eff}$ is the effective coupling strength between the two qubits (e.g., the first and second qubits 512, 514) during modulation, Δ is the frequency difference between the two qubits 512, 514 showing average detuning, e.g., $\Delta = \omega_{F_{01}} - \omega_{T_{01}}$, and β is the entangling phase of the XY gate, e.g., $\beta \approx 2\phi_p$, where $\phi_p$ is the modulation phase of the flux pulse used to activate the XY gate. In some implementations, the modulation phase $\phi_p$ may be defined with respect to the phases of the individual qubit frames. The notation |FT⟩ includes the state F of the first qubit 512, and the state T of the second qubit 514. When the modulation angular frequency $\omega_p$ matches the resonance condition (e.g., as shown in FIG. 7), the desired Hamiltonian that can drive the XY gate can be achieved, up to a sign convention for the entangling angle θ.

Figure 9:
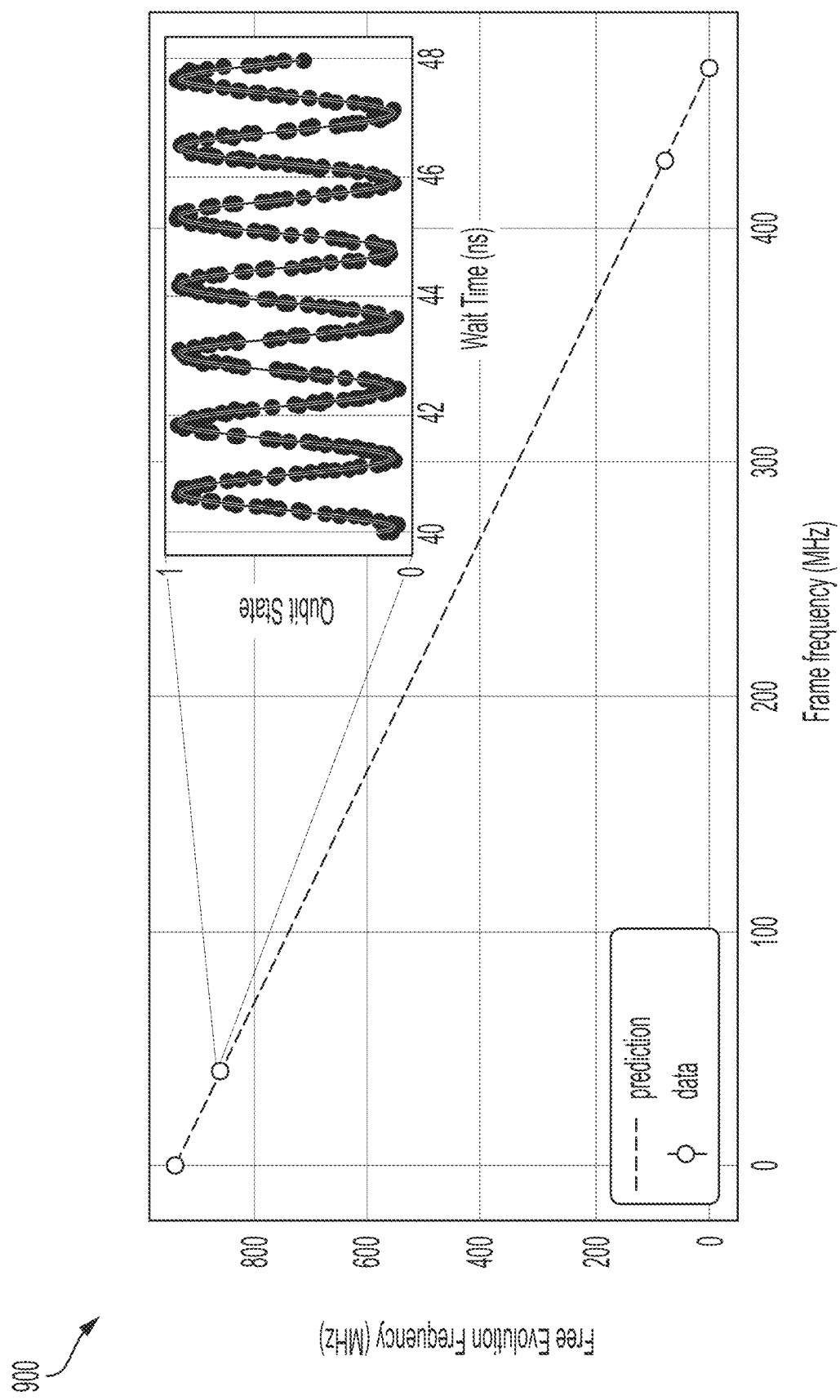
FIG. 9 is a plot showing a free evolution frequency as a function of frame frequency.

In some implementations, the entangling phase β of the XY gate can be determined by the modulation phase $\phi_p$ of the flux pulse applied on the second qubit 514. In some instances, the entangling phase of the XY interaction is defined in an abstract rotating frame which has a frequency set by the frequency of the rotating frame in which the Hamiltonian is defined by Equation (12). The frequency of the rotating frame is the frequency difference between the qubit frequencies, e.g., Δ. The free evolution frequency can be tracked with the abstract rotating frame, for example, using a Ramsey style experiment in the 01/10 manifold (as shown in FIG. 9).

Figure 7:
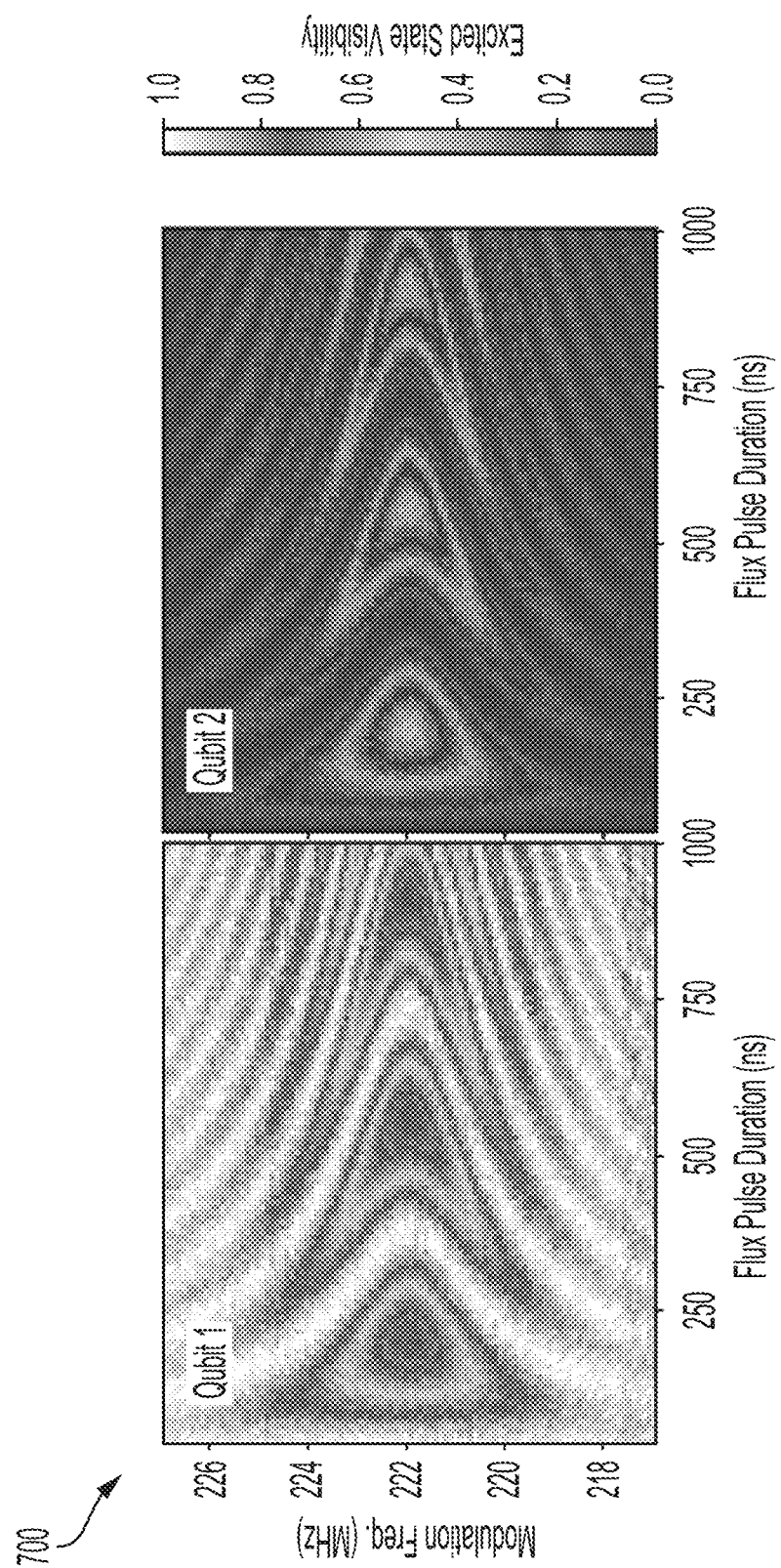
FIG. 7 is a plot showing excited state visibility as a function of modulation frequency and flux pulse duration on two example qubits.

FIG. 7 is a plot 700 showing population transfer occurs between the first qubit 512 and the second qubit 514 in the DUT 504 of the example quantum computing system 500 in FIG. 5. The population transfer is represented by excited state visibility as a function of modulation frequency ($f_p$) and duration of a modulation flux pulse applied on the two qubits 512, 512 shown in FIG. 5. The modulated flux pulse is applied to the second qubit 514 once the state |10⟩ has been prepared. As shown in the plot 700, experimentally measured chevrons are associated with the XY interaction.

In some implementations, single-qubit gates can be applied on the first and second qubits 512, 514 and activated by shaped microwave control pulses received from the respective qubit drive lines 515A, 515B. In some implementations, two-qubit entangling gates can be applied on the second qubits 514 and activated by shaped the radio-frequency control pulses received from the AC+DC flux bias line 513. In some instances, a single-qubit operation is defined in a single-qubit rotating frame oscillating at the mean qubit frequency, and a Z rotation is implemented as updates to the frame definition affecting the phase of subsequent microwave control pulses. In some implementations, an equivalent abstract reference frame can be defined for the radio-frequency control pulse that drives the XY gate, oscillating at a frequency which equals the frequency difference between the two single-qubit rotating frames.

In some implementations, the reference phase of any given frame can be arbitrarily set to zero when taken in isolation, since a measurement operation measures along the Z-axis and is therefore agnostic to overall Z rotations. However, the relative phase between frames can have a measurable effect when the corresponding qubits undergo an interaction that does not commute with Z rotations, and must be accounted for in those cases.

Figure 8A:
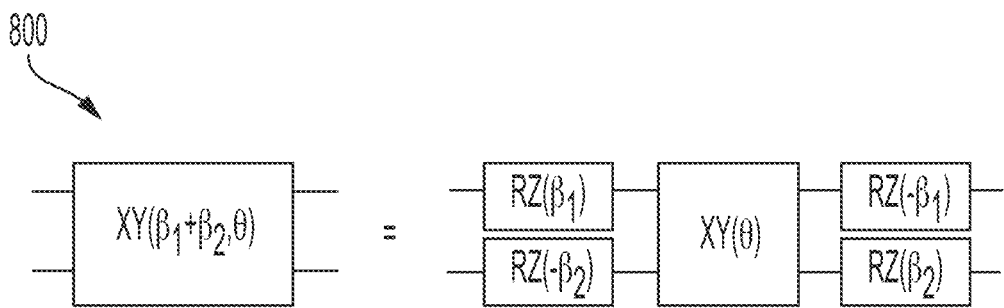
FIG. 8A is a schematic diagram showing an example equivalent circuit representation of a $XY(\beta_1+\beta_2, \theta)$ unitary using single qubit Z rotations (RZ) and a $XY(\theta)$ unitary.

In some implementations, the XY(β, θ) gates do not commute with single-qubit Z rotations, and thus the relative phase between the single-qubit frames and the two-qubit frame must be accounted for. The entangling phase β in Hamiltonian is defined in an interaction frame given by the doubly rotating frame at the qubit frequencies, and so picks up a linear time dependence on the difference in single-qubit frame frequencies. In some implementations, the modulation phase $\phi_p$ in the lab frame may track this time dependence to ensure the same gate is effected no matter when in the pulse sequence it is executed. If there are single-qubit gates (e.g., single-qubit Z rotations about the Z axis) applied as frame updates, the definition of the entangling phase β can also be updated. This dependence takes the form of an equivalence between the entangling phase β and equal and opposite local single-qubit gates (e.g., Z rotations) applied before and after the XY gate. This results in a decomposition of an XY(β, θ) gate shown in FIG. 8A. FIG. 8A is a schematic diagram showing an example equivalent circuit representation 800 of a XY($\beta_1 + \beta_2$, θ) gate using single-qubit Z rotations (RZ) and a XY(θ) gate.

Figure 8B:
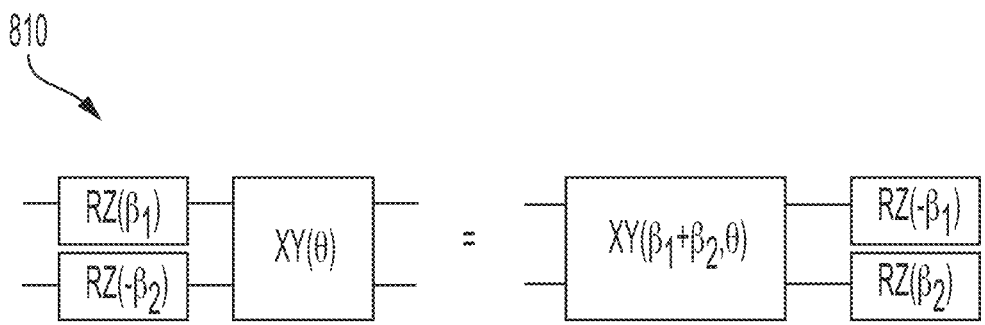
FIG. 8B is a schematic diagram showing an example equivalent circuit representation of a $XY(\beta_1+\beta_2, \theta)$ unitary using single qubit Z rotations (RZ) and a $XY(\theta)$ unitary.

In some implementations, the convention that time flows from left to right (e.g., leftmost gates are applied first) can be used. This results in a transformation of the equivalent circuit representation 800 to the equivalent circuit representation 810 shown FIG. 8B. FIG. 8B is a schematic diagram showing an example equivalent circuit representation 810. The modulation phase $\phi_p$ of the flux pulse is used to leave the single-qubit frames untouched after the application of the XY(θ) gate.

In some implementations, the XY(θ) gates can be tuned by varying the interaction time or strength in order to achieve different entangling angles θ. In some instances, each XY gate may require a different calibration and/or duration of the flux pulse. In some examples, the duration of the flux pulse is equal to a summation of interaction time, rise time and fall time. When varying duration of the flux pulse is used to tune the XY gate, very small rotations by creating extremely short pulses may be difficult to achieve given the hardware limitations. Calibrations of such XY gate may be further complicated by nonlinear effects due to hardware constraints when dealing with short pulses, or nonlinear relationships in tunable coupler schemes.

It is noted that the XY($\beta$, $\theta$) gate acts non-trivially only in the 2-dimensional subspace spanned by $|01\rangle$ and $|10\rangle$ (e.g., the 01/10 subspace). In a two-dimensional subspace, any unitary can be obtained via rotations around two orthogonal axes in the equivalent Bloch sphere. For example, an Euler decomposition of the unitary is used. For an arbitrary single-qubit X rotation in the Bloch sphere equivalent for a two-dimensional space, the entangling phase $\beta$ can be absorbed in an RZ sandwich, e.g., RX($\beta$, $\theta$)=RZ($-\beta$)RX($\theta$)RZ($\beta$); and the variable entangling angle $\theta$ can then be decomposed as two X rotations of $$\frac{\pi}{2}$$

with different phases and a frame update, $$RX(\theta) = RX\left(-\frac{\pi}{2}, \frac{\pi}{2}\right)RX\left(\frac{\pi}{2} - \theta, \frac{\pi}{2}\right)RZ(\theta). \text{ An } RX\left(\beta, \frac{\pi}{2}\right)$$

rotation in the 01/10 subspace corresponds to $$XY\left(\beta, \frac{\pi}{2}\right)$$

in the full four-dimensional space, while an RZ($\theta$) rotation in the 01/10 subspace corresponds to $$RZ\left(\frac{\theta}{2}\right) \otimes RZ\left(\frac{-\theta}{2}\right)$$

in the full four-dimensional space. This results in a decomposition of an the XY($\beta$, $\theta$) gate shown in FIG. 8C.

Figure 8C:
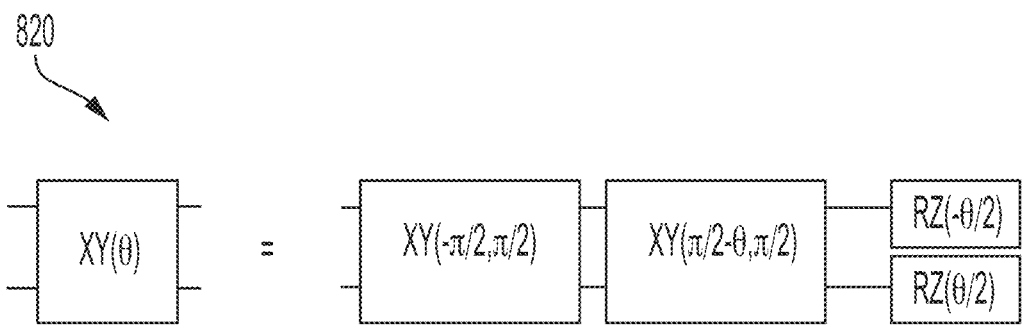
FIG. 8C is a schematic diagram showing an example equivalent circuit representation of a $XY(\theta)$ unitary using two $XY(\theta)$ gates and single-qubit Z rotations (RZ).

FIG. 8C a schematic diagram showing an example equivalent circuit representation 820 of a XY($\theta$) gate using two XY($\beta$, $\theta$) gates and single-qubit Z rotations (RZ). The equivalent circuit representation 820 can be used to enact arbitrary XY($\theta$) using only $\sqrt{\text{iSWAP}}$ pulses of controllable phases and single-qubit Z rotations in the single-qubit frames. The methods presented here can provide technical advantages including constant gate time as well as a single pulse for calibration, making it reasonable to fine-tune parameters using coherent error amplification techniques. As shown in FIG. 820C, the only parameter changing between different XY($\beta$, $\theta$) gates is the entangling phase $\beta$ of the flux pulse, which allows for a fixed error rate over all entangling angles $\theta$ in systems where the errors are dominated by a constant decoherence time scale.

It is important to note that in order to make use of the equivalent circuit representation 820, the XY($\beta$, $\theta$) gates can be applied at a specific entangling phase $\beta$ in order to perform the intended rotation. In some instances, the phase difference between the two-qubit frame and the single-qubit frames is known. The reason for this becomes clear when thinking of the XY($\beta$, $\theta$) gates as rotations about a Bloch sphere in the 01/10 subspace. RX($\theta$) rotations in the single-qubit Bloch sphere can be visualized as rotations about an equatorial axis of azimuthal angle $\theta$, by some amount $\theta$. In the decomposition for the XY($\beta$, $\theta$) gate, the XY($\beta$, $\theta$) gate may be treated as an X rotation in the 01/10 sphere about an equatorial axis by some amount $\theta$. However, in the case of the XY gate, the azimuthal angle of the equatorial axis about which it rotates is set by the entangling phase $\beta$. Since the $$XY\left(\beta, \frac{\pi}{2}\right)$$

gate is used, for which offsets in the entangling phase $\beta$ cannot be corrected by single-qubit frame updates applied only after the gate as shown in FIG. 8A, the entangling phase $\beta$ can be set to 0 to complete the analogy between the single-qubit X rotations RX($\theta$) and the two-qubit entangling gate XY($\beta$, $\theta$), which enables the use of the Euler decomposition.

Figure 8D:
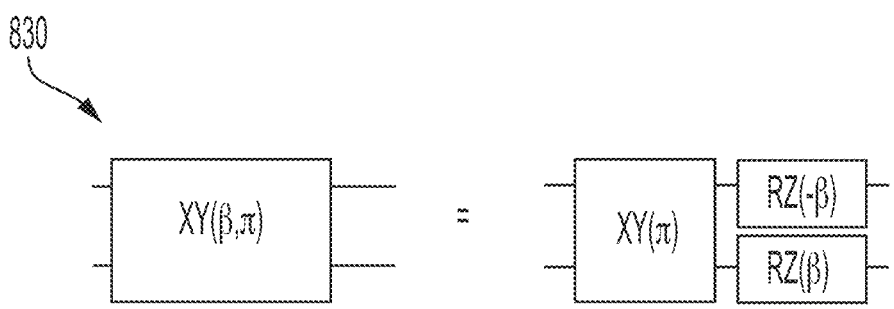
FIG. 8D is a schematic diagram showing an example equivalent circuit representation of $XY(\beta, \theta)$ unitary using a single $XY(\theta)$ gate and single-qubit Z rotations (RZ)

FIG. 8D is a schematic diagram showing an example equivalent circuit representation 830 of an XY($\beta$, $\theta$) unitary using a single XY($\theta$) gate and single-qubit Z rotations (RZ). The equivalent circuit representation 830 shows that the entangling phase $\beta$ can be corrected using post-gate single-qubit frame corrections.

In some instances, the $|01\rangle$ state is prepared and a first parametric gate, e.g., XY($\beta_0$, $\pi/2$) pulse (which is equivalent to the $\sqrt{\text{iSWAP}}$ gate with a first entangling phase $\beta_0$) is applied to place the state on the equator of a Bloch sphere whose poles are the $|01\rangle$ and $|10\rangle$ states. The state can evolve and accumulate phase for a predetermined time, and then a second parametric gate, e.g., XY($\beta_0+\beta_1$, $\pi/2$) pulse to rotate back onto the pole can be applied, where a second entangling phase $\beta_1$ is a product of the frame frequency and the delay between the two pulses. FIG. 9 demonstrates that by changing the frame frequency for the flux pulse, the dynamical phase $\delta(t)$ accumulated between the $|01\rangle$ and $|10\rangle$ states can be canceled out at the free evolution frequency.

FIG. 9 is a plot 900 showing free evolution frequency as a function of two-qubit frame frequency ($f_f$) of the reference frame of the flux pulse. As shown in FIG. 9, at each data point, the two-qubit frame frequency $f_f$ is set to a different value and the modulation frequency $f_p$ of the flux pulse is kept as a constant. In order to measure the free evolution frequency of the equal superposition (with arbitrary phases) of $|01\rangle$ and $|10\rangle$, a Ramsey-like experiment is performed when the second qubit 514 is excited to the $|1\rangle$ state; then two XY($\beta_0$, $\pi/2$) flux pulses (e.g., two XY gates) are applied, with a variable wait time between the two flux pulses; then the state of the second qubit 514 is measured. The difference between the qubit transition frequencies of the two qubits 512, 514 is 937.76 MHz, and the evolution of the phase of the superposition relative to the two-qubit frame frequency $f_f$ can occur at a frequency having a value defined by the difference in the qubit transition frequencies of the two qubits 512, 514. Since the entangling phase $\beta$ is about twice of the modulation phase $\phi_p$ of the flux pulse (e.g., $\beta \approx 2\phi_p$), as discussed above, the evolution frequency of the relative phase of the superposition can be determined as 937.76–2$f_f$. The inset of FIG. 9 shows the state of the second qubit 514 as a function of the wait time between the two XY($\beta_0$, $\pi/2$) flux pulses when the two-qubit frame frequency $f_f$ is set to 40 MHz. The free evolution frequency can be extracted by fitting a sinusoidal function to the evolution of the second qubit 514. When the two-qubit frame frequency is 40 MHz, the free evolution frequency can be measured as 857.79±0.27 MHz, which agrees with the predicted frequency of 857.76 MHz.

FIG. 10 is a flow diagram showing aspects of an example process 1000. The example process 1000 can be implemented in parametric gate compilation frameworks, e.g., the frameworks 200, 300 shown in FIGS. 2 and 3, or in another manner. In some implementations, the example process 1000 can be used for pulse calibration and to obtain parameters for operating quantum logic gates. In some implementations, the parameters obtained from the example process 1000 may be stored in a database, for example, the pulse calibration database 250, 350 as shown in FIGS. 2 and 3, which may be used by a respective compiler (e.g., the just-in-time compilers 220, 320) to perform calibrated quantum logic gates. In some implementations, the example process 1000 can be used for compiling an arbitrary $XY(\theta)$ gate by performing a calibration of a first flux pulse and configuring a phase ($\theta$) on a second flux pulse. The example process 1000 may include additional or different operations, including operations performed by additional or different components, and the operations may be performed in the order shown or in another order.

At 1002, a $XY(\pi/2)$ gate is calibrated. In some instances, when a XY gate can be compiled using two $\sqrt{\text{iSWAP}}$ pulses, only one of the $\sqrt{\text{iSWAP}}$ pulses can be calibrated. In some implementations, an $XY(\pi/2)$ gate (e.g., a $\sqrt{\text{iSWAP}}$ pulse) on the quantum processing unit 500 (e.g., the first and second qubits 512, 514) can be calibrated by applying a flux pulse to the second qubit 514 and sweeping the modulation frequency, modulation amplitude, and duration of the flux pulse to determine the resonance condition for the $XY(\pi/2)$ gate. A combination of time, frequency, and amplitude of the flux pulse that enacts the desired gate can be determined.

In some implementations, when a XY gate can be compiled using a single iSWAP pulse, the iSWAP pulse on the quantum processing unit 500 (e.g., the first and second qubits 512, 514) can be calibrated by applying a flux pulse to the second qubit 514 and sweeping the modulation frequency, modulation amplitude, and duration of the flux pulse to determine the resonance condition for the iSWAP gate (as shown FIG. 7). In some implementations, the pulse time for an iSWAP gate is half of a period of oscillation. In some implementations, the pulse time can be with some offset from non-zero rise and fall times of the flux pulse.

In some instances, a single calibration of a flux pulse, e.g., the iSWAP pulse or the $\sqrt{\text{iSWAP}}$ pulse depending on the compilation of the XY gate, can be performed prior to the gate formation or compilation process (e.g., the example process 400 in FIG. 4). In some instances, the single calibration of the flux pulse is not required to be performed during the gate formation or compilation process, and a recalibration of the flux pulse is not required. In certain examples, recalibration of the iSWAP pulse or the $\sqrt{\text{iSWAP}}$ pulse may be performed according to predetermined criteria, for example when a significant change in gate fidelity is observed, when a user program specifies a recalibration of the flux pulse on a specific quantum processing unit, or in another manner.

In some implementations, single-qubit Z rotation (RZ) operations that are applied after the flux pulses can be also calibrated. Calibration of the single-qubit rotations allows the correction of the uncalibrated (but constant) relative phase between the single-qubit gate and the two-qubit gate at the quantum processing unit 504 shown in FIG. 5, as well as the mean shift of the tunable qubit frequency under flux modulation. In certain examples, correction of the uncalibrated relative phase using the single-qubit RZ operations are enacted by shifting a register in an FPGA for each qubit or in another manner.

In some implementations, the iSWAP pulse or the $\sqrt{\text{iSWAP}}$ pulse after being calibrated can be benchmarked using interleaved Randomized Benchmarking (iRB). In some implementations, the iRB can be used to measure the average gate fidelity. In some instances, random gate sequences with sequence lengths of 2, 4, 8, 16, 32, and 64 Cliffords may be constructed. At each sequence length, 32 random circuits may be generated for a reference curve, and another 32 random circuits with an interleaved operation for an interleaved curve, for a total of 32×6×2=384 different circuits. In some implementations, each of these 384 circuits is applied and measured multiple times (e.g., 500 times), and results obtained on one circuit are then averaged over the multiple times of measurement. For a given iRB experiment, the 384 circuits are applied in a random order to prevent temporal fluctuations from introducing bias when comparing the reference and interleaved curves, e.g., shown in FIG. 11.

Figure 11:
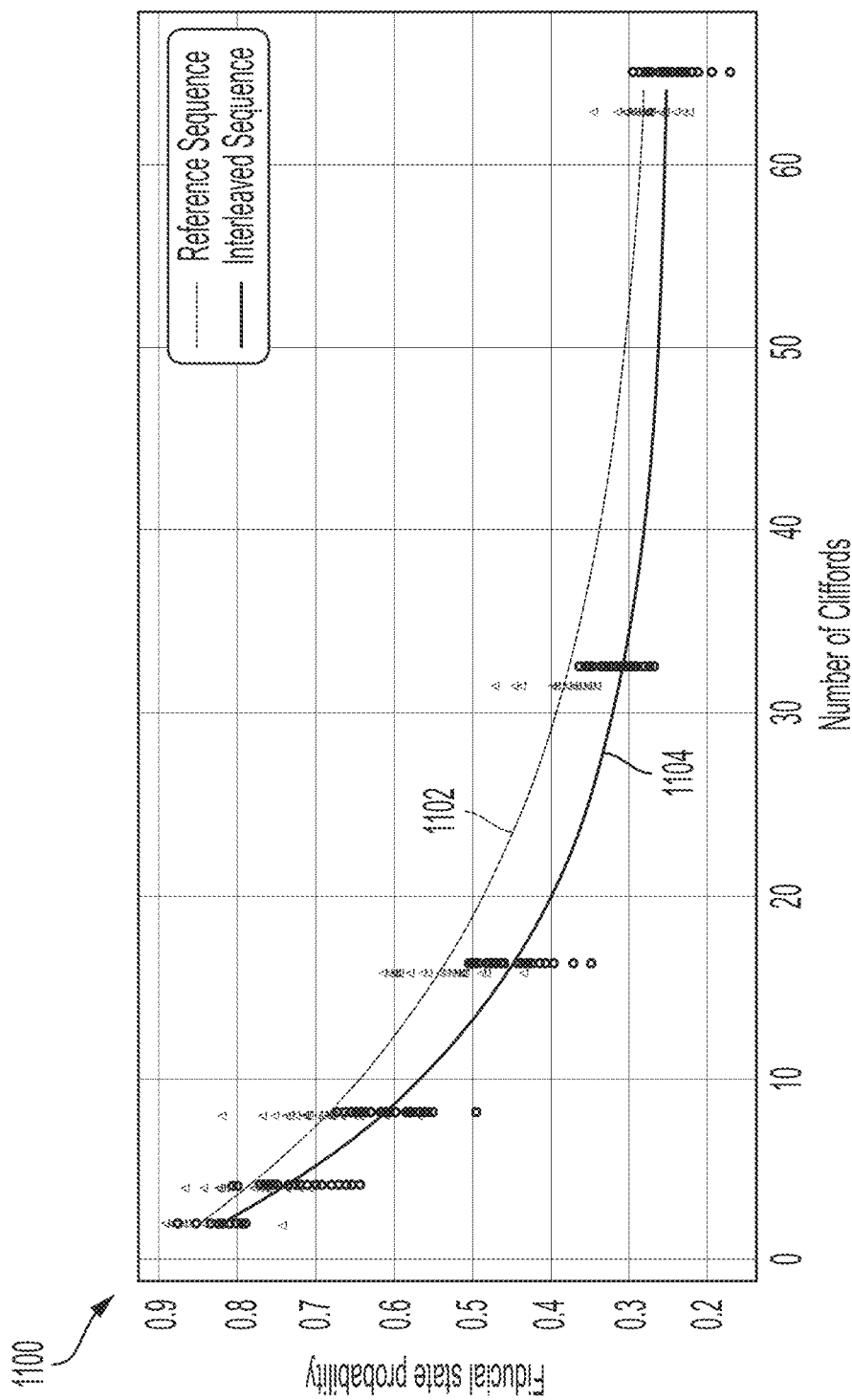
FIG. 11 is a plot of a fiducial state probability as a function of a number of Cliffords in an example implementation of an interleaved randomized benchmarking (iRB)

FIG. 11 is a plot 1100 showing fiducial state probability as a function of the number of Cliffords. The plot 1100 include a reference curve 1102 and an interleaved curve 1104. Data points in the plot 1100 correspond to results of each individual trial. The reference and interleaved curves 1102, 1104 are fitted to an exponential decay. The iRB measurement shown in FIG. 11 is performed on the iSWAP gate constructed from a single flux pulse.

As the circuit depth L grows, (e.g., the number of Cliffords increases), the probability of measuring the expected two-qubit state decays exponentially as $B+A\ p^L$ for some baseline B, amplitude A, and decay rate p. The average fidelity of the interleaved circuit 1−r can be inferred from the ratio of the decay constants for the reference curve p and interleaved curve $p_{il}$ as $$r = \frac{d-1}{d}\left(1 - \frac{p_{il}}{p}\right),$$

where $d=2^n$, and n is the number of qubits (e.g., n=2 for the two qubits shown in FIG. 5).

In some implementations, as the number of XY gates used to compose an iSWAP gate scales in the iRB experiments, a ratio of the decay rates may scale proportionally (e.g., the errors are assumed as incoherent). For example, given an iSWAP gate composed of a first number (n) of XY gates compared to an iSWAP gate composed of a second number (m) of XY gates, the ratio of the decay rates scales, which can be expressed as $$\left(\frac{p_{il,n}}{p_n}\right)^{\frac{1}{n}} = \left(\frac{p_{il,m}}{p_m}\right)^{\frac{1}{m}},$$

when the errors are due to a depolarizing channel. Both the reference and interleaved curves have an m, n dependence because the scaled number of gates is used for both. In some implementations, coherent errors may not follow this simple relationship.

In the example shown in FIG. 11, the ratio of the decay rates was scaled rather than the fidelity itself in order to handle the dimensional factors. For example, a large number of single-qubit gates may decay to a 50% fidelity, while a large number of two-qubit gates may decay to a 25% fidelity, which scaling the ratio of the decay rates preserves.

Figure 12:
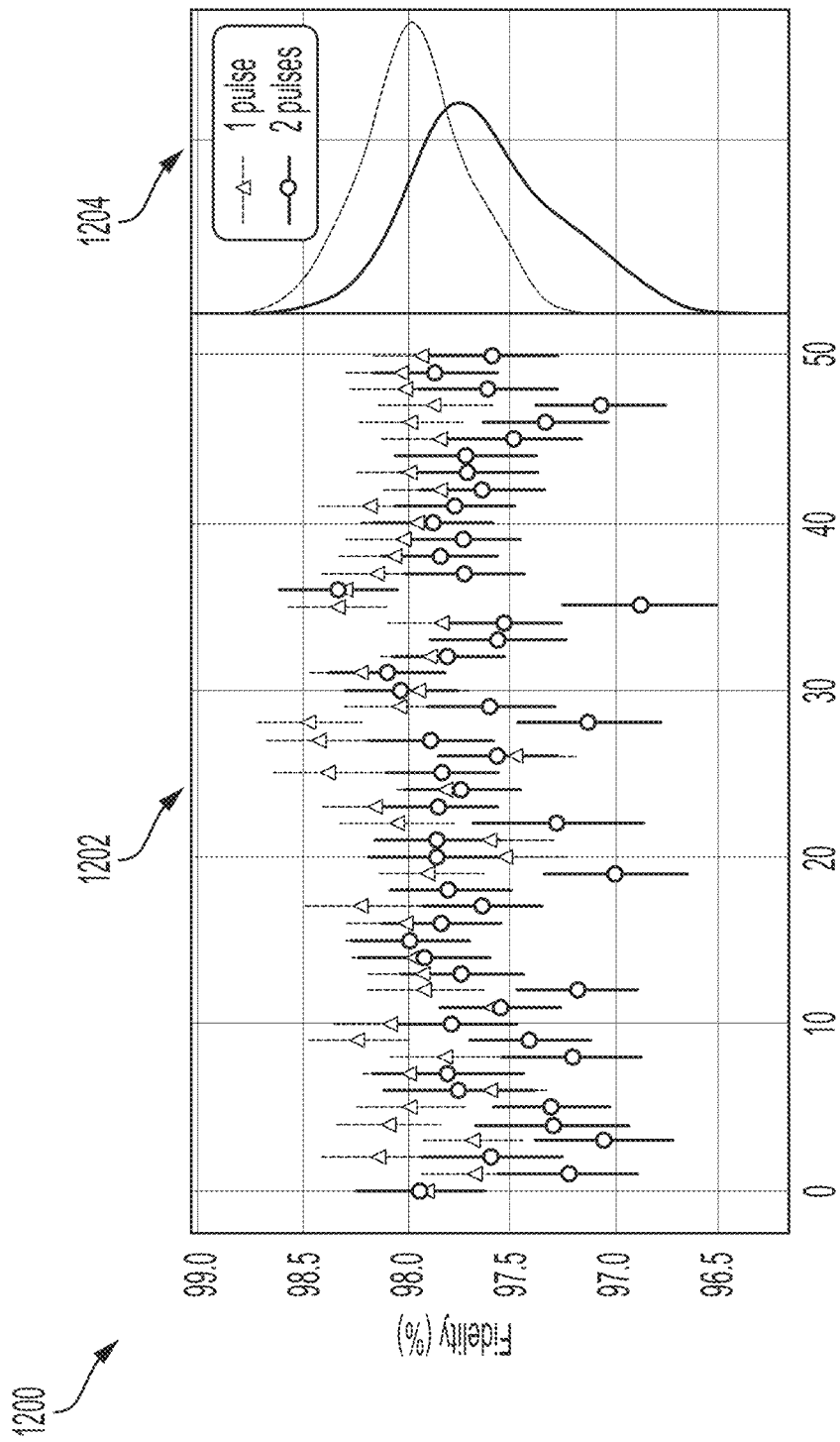
FIG. 12 is a plot showing fidelities of 50 trials of interleaved randomized benchmarking (iRB) measurements interleaving iSWAP gates with a single iSWAP pulse and two $\sqrt{\text{iSWAP}}$ pulses, respectively.

In some implementations, in order to gather statistics on the gate fidelity and confirm its stability, the iRB experiment may be performed multiple times, e.g., 50 times. As shown in FIG. 12, a median iSWAP average gate fidelity of 97.98±0.11% is measured, where errors on the median are derived from the Dvoretzky-Kiefer-Wolfowitz inequality, which gives a 95% confidence band of the empirical Cumulative Distribution Function (CDF). In order to test that splitting a single iSWAP pulse into two $\sqrt{\text{iSWAP}}$ pulses as described in FIG. 8C has no adverse effect on gate fidelity, a $\sqrt{\text{iSWAP}}$ gate can be tuned by choosing a gate time of a quarter period. In some implementations, when expanding from an iSWAP gate to a XY gate, the constant phase offset between the single-qubit drive and the modulated flux drive can no longer be absorbed in single qubit frame updates, as FIG. 8D no longer holds. In some implementations, the more general equivalent circuit representation 800 shown in FIG. 8A may be used. In some instances, a suite of phase calibration sequences may be required.

In some implementations, a relative phase between the flux pulses and single qubit drives is also calibrated. Operations, including preparing a state, performing a single XY gate; and performing a measurement, can be performed to do the calibration. For example, a state $$\frac{1}{2}(|00\rangle + |01\rangle + i|10\rangle + i|11\rangle)$$

can be prepared; a single $XY(2(\phi_p+\phi_0), \pi/2)$ gate is performed; and $\langle (ZI\langle - \rangle IZ \rangle$ can be measured, which is defined by $\cos(2(\phi_p+\phi_0))$ where $\phi_p$ is the phase of the flux pulse, and $\phi_0$ is the constant phase offset between the single-qubit drives and flux pulse. In some instances, by sweeping $\phi_p$, the measured expectation value can be fit to a cosine function, and $\phi_0$ can be extracted in order to correct for it and perform a true $\sqrt{\text{iSWAP}}$ gate. In some implementations, these reference frames may be tracked in software, and the calibrations are done using the control system and reading out signals from the QPU (e.g., the DUT 504).

Additionally, each flux pulse causes the qubits to incur RZs due to the mean shift of the qubit frequency under flux modulation. The RZs induced by the first flux pulse can be absorbed into the phase of the second flux pulse using FIG. 8B. The phase of the second flux pulse relative to the first flux pulse is calibrated by preparing the $|01\rangle$ state, applying two $$XY\left(\beta, \frac{\pi}{2}\right)$$

flux pulses, sweeping me modulation phase $\phi_p$ of the second flux pulse, and maximizing the overlap on $|01\rangle$ such that the entangling phases $\beta$ of the two flux pulses have a difference of $\pi$, and the two $$XY\left(\beta, \frac{\pi}{2}\right)$$

coherently cancel to implement an $XY(\theta)$ operation.

At 1004, a $XY(\theta)$ gate is constructed out of the $XY(\pi/2)$ gate. In some implementations, the $XY(\theta)$ gate may be constructed using a database, which contains equivalent circuits that can be specific to the quantum processing unit. For example, the database may be implemented as the parametric circuit database 260 in FIG. 2 or in another manner. In some implementations, the database may include equivalent circuit representation of parametric two-qubit gates shown in FIGS. 8A-8D. In some implementations, a $XY(\theta)$ gate, for example in the user program 310, may be decomposed into a sequence of quantum logic gates in the native program by the userland compiler 360 according to routines for parametric decomposition, or in another manner. In some implementations, a $XY(\theta)$ gate may be decomposed into a sequence of quantum logic gates including two $XY(\pi/2)$ gates and can be expressed as $$XY(\theta) = \left[RZ\left(-\frac{\theta}{2}\right) \otimes RZ\left(\frac{\theta}{2}\right)\right]XY\left(\frac{\pi}{2}-\theta, \frac{\pi}{2}\right)XY\left(-\frac{\pi}{2}, \frac{\pi}{2}\right)$$

as shown in FIG. 8C.

At 1006, single-qubit RZ corrections are calibrated. Additional single-qubit phases accumulated due to the modulation of the tunable qubit incurred during the flux pulse used to activate the gate are calibrated. The sum of the RZs carried forward from the first flux pulse and those incurred during the second flux pulse can be corrected with final single-qubit Z rotations (RZs) chosen to zero the phase accumulated on single-qubit superposition input states after application of a nominal $XY(\theta)$ gate. The single-qubit RZs calibrated in this way are constant with respect to the entangling angle $\theta$ because of the constant gate time. These calibrations are done by performing experiments on the qubits using the hardware control system and measurement software stack.

FIG. 12 is a plot showing fidelities of 50 trials of interleaved randomized benchmarking (iRB) measurements interleaving XY gates with a single iSWAP pulse and two $\sqrt{\text{iSWAP}}$ pulses, respectively. Data shown in FIG. 12 were obtained by performing measurements using the single iSWAP pulse first followed by performing measurements using the two $\sqrt{\text{iSWAP}}$ pulses. The 50 trials include gate sequences with sequence lengths of 2, 4, 8, 16, 32, and 64 Cliffords. In some implementations, when multiple iRB experiments are performed, the order of the trials may be randomized within each individual iRB experiment. FIG. 12 includes a first panel 1202 and a second panel 1204. The first panel 1202 in FIG. 12 shows the fidelities of the 50 trials. As shown in the first panel 1202 of FIG. 12, error bars represent propagated $1\sigma$ errors from the fit of the two decay constants, for example, as shown in FIG. 11. The second panel 1204 of FIG. 12 shows a kernel density estimate of each distribution. The gate fidelity of the XY gate with two $\sqrt{\text{iSWAP}}$ pulses is lower than that of the XY gate with the single iSWAP pulse. The lower gate fidelity obtained on the XY gate composed of two $\sqrt{\text{iSWAP}}$ pulses may be caused by coherence limitations given that the total gate time is slightly longer when using the two $\sqrt{\text{iSWAP}}$ pulses. For example, the total rise and fall time (e.g., 304 nanosecond (ns) including the rise time of 152 ns and the fall time of 152 ns) for two pulses can be longer than the total rise and fall time (e.g., 240 ns) for a single pulse.

Given the measured coherence times, e.g., shown in FIG. 6, for the first and second qubits 512, 514 under modulation conditions similar to those experienced during the iSWAP gate, the coherence-limited theoretical gate fidelities for each gate time can be calculated. For an iSWAP gate enacted with a single flux pulse, the coherence-limited theoretical gate fidelity is 98.15±0.08%, and for an iSWAP gate composed of two flux pulses, the coherence-limited theoretical fidelity is 97.65±0.1%, whereas gate fidelites of 97.98±0.11% and 97.72±0.16% are measured for an iSWAP gate composed of a single flux pulse and two flux pulses, respectively. The errors on the coherence-limited fidelity calculations are propagated from the uncertainties in coherence times under modulation. In some instances, optimal control approaches may be used to enable a gate time for the two-pulse technique equal to the gate time for the single-pulse technique, eliminating this small drop in fidelity.

At 1008, relative phases of XY(π/2) pulses are calibrated. Due to various commutation relationships regarding the gates used to enact an XY gate, the relative phase between the two XY(π/2) pulses used to enact arbitrary XY(θ) are also calibrated. This calibration is done by performing experiments on the qubits using the hardware control system and measurement software stack.

In some implementations, after the $\sqrt{iSWAP}$ gate is calibrated, the relative phase of the second $\sqrt{iSWAP}$ pulse can be controlled to achieve any gate in the XY(θ) family as discussed in FIGS. 8A-8D. In some instances, the XY(θ) gate can be benchmarked by building iRB sequences for the iSWAP gate (a Clifford group operation), and then decomposing the iSWAP gate into pairs of XY(θ), XY(π−θ), or triples of $XY\left(\frac{\theta}{2}\right)$, XY(π−θ), and $XY\left(\frac{\theta}{2}\right)$, or in another manner. In this case, state preparation and measurement errors endemic to process tomography can be avoided. The average fidelity of the interleaved operation can be measured, which in these cases is one, two, or three XY(θ) gates. These can be related to the fidelity of a single XY(θ), under the assumption that fidelity is independent of θ, e.g., that there are no coherent errors, via the appropriate root of the ratios of the reference decay rate p and interleaved decay rate $p_{il}$, for example, as discussed in FIG. 11.

Figure 13A:
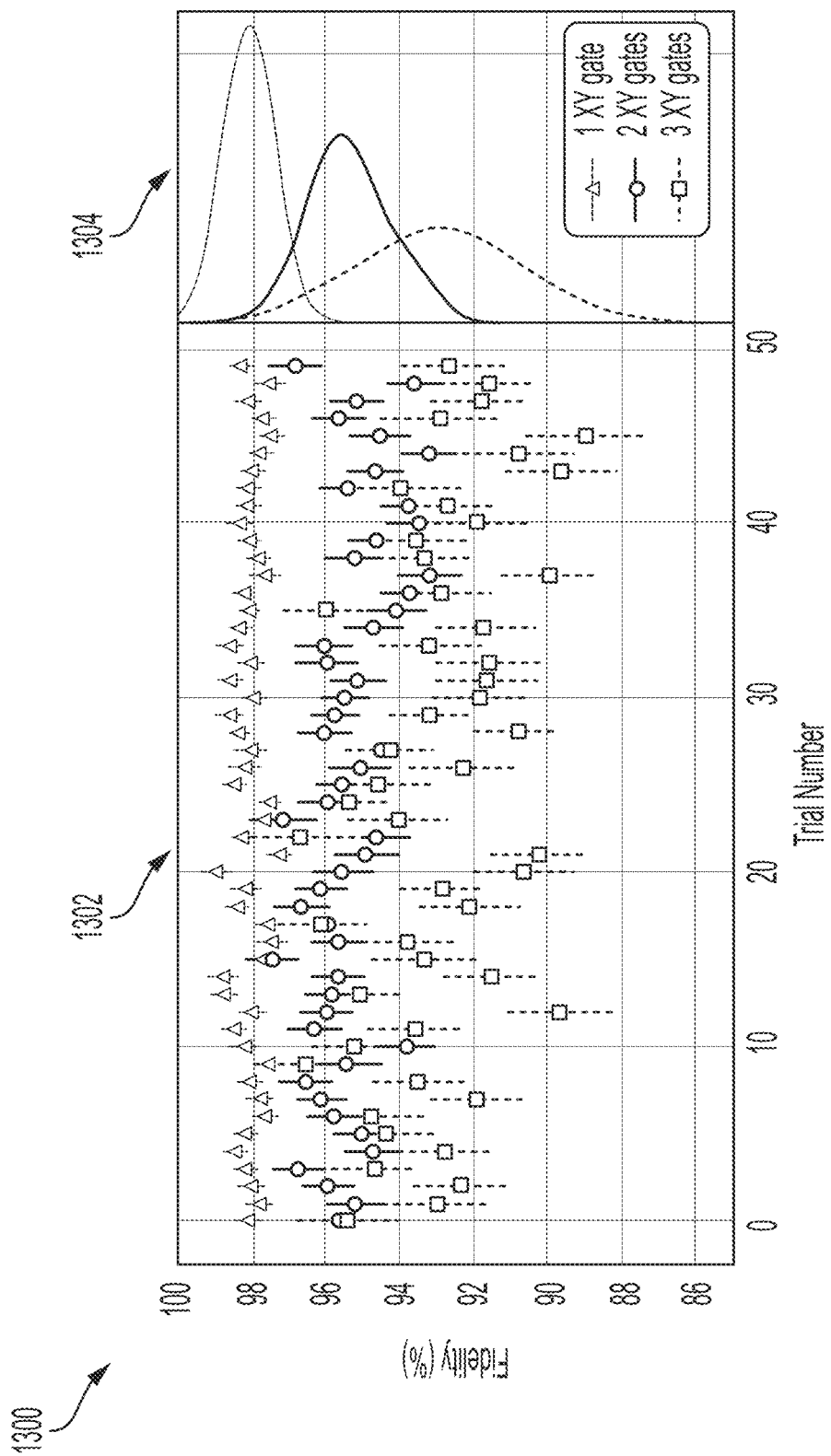
FIG. 13A is a plot showing fidelities of 50 trials of interleaved randomized benchmarking (iRB) measurements interleaving three iSWAP gates with a single $XY(\theta)$ gate, two $XY(\theta)$ gates and 3 $XY(\theta)$ gates, respectively.

FIG. 13A is a plot 1300 showing fidelities of 50 trials of interleaved randomized benchmarking (iRB) measurements by interleaving three example iSWAP gates. A first iSWAP gate includes a single XY(θ) gate, e.g., XY(π); a second iSWAP gate can be decomposed into an equivalent quantum circuit including two XY(θ) gates, e.g., XY(θ)XY(π−θ); and a third iSWAP gate can be decomposed into an equivalent quantum circuit including 3 XY(θ) gates, e.g., XY(θ/2)XY(π−θ)XY(θ/2). In some instances, the entangling angle θ may be selected randomly when an iSWAP gate with different numbers of XY gates are performed in each trial. FIG. 13A includes a first panel 1302 and a second panel 1304. The first panel 1302 shows measured fidelities of respective iSWAP gates during the 50 trials of the iRB measurements. Error bars represent the propagated 1σ errors from the fit of the two decay constants of the respective iSWAP gates. The second panel 1304 shows kernel density estimates of the respective iSWAP gates. A median value of the fidelity for an iSWAP gate represented by the peak position of the kernel density estimates in the second panel 1304 scales with the number of XY gates used to compose an iSWAP gate. As shown in FIG. 13A, the median value of the fidelity of the first iSWAP gate with a single XY(θ) gate is greater than the median value of the fidelity of the second iSWAP gate with two XY(θ) gates; and the median value of the fidelity of the second iSWAP gate with two XY(θ) gates is greater than the median value of the fidelity of the third iSWAP gate with three XY(θ) gates. In some instances, scaling of the fidelity as a function of the number of XY pulses may be used to infer the fidelity of XY(θ) by performing the iRB measurement on XY(θ), XY(π−θ).

Figure 13B:
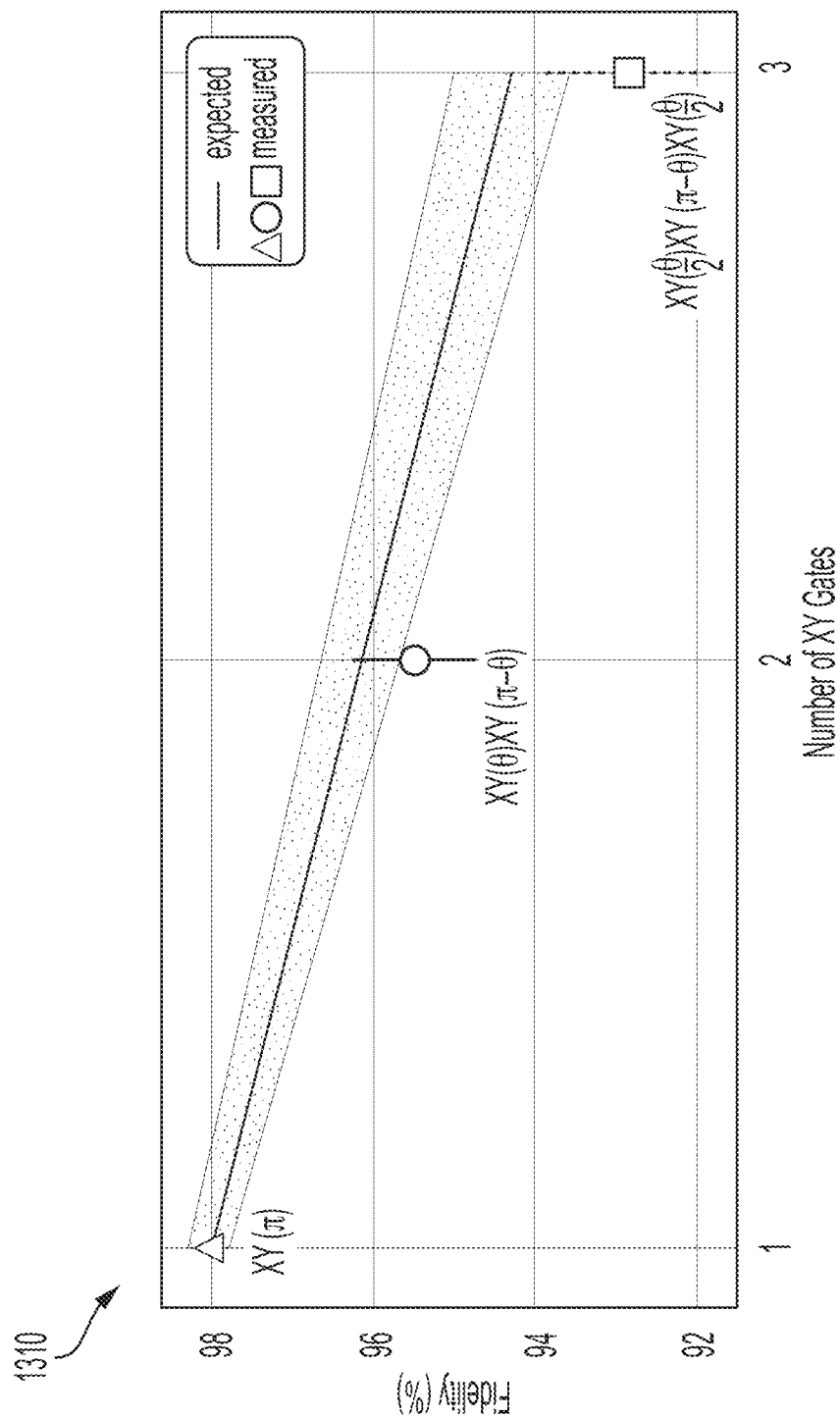
FIG. 13B is a plot showing median fidelities of the three iSWAP gates with a single $XY(\theta)$ gate, two $XY(\theta)$ gates and 3 $XY(\theta)$ gates, respectively.

FIG. 13B is a plot 1310 showing median fidelities of the three example iSWAP gates shown in FIG. 13A compared to expected values. The expected values are calculated by scaling the fidelity of a single iSWAP gate. Error bars show the 95% confidence interval of the empirical cumulative distribution function (ECDF). The median fidelity of the first iSWAP gate with a single XY(θ) gate is 98.04±0.25%. The median fidelity of the second iSWAP gate with two XY(θ) gates is 95.49±0.75%. The median fidelity of the third iSWAP gate with three XY(θ) gates is 92.85±1.02%. The expected fidelities are of 98.04% for the first iSWAP gate with one XY gate, 96.13% for the second iSWAP gate with two XY gates, and 94.27% for the third iSWAP gate with three XY gates which is within the spread of the 95% confidence interval of the expected values.

As shown in FIGS. 13A, 13B, the trend between the fidelity and the number of XY(θ) gates used to enact an iSWAP gate, confirms that the fidelity of a single XY(θ) gate from an iRB measurement can be estimated, where the iSWAP gate can be constructed using XY(θ)XY(π−θ). As the measured scaling is slightly worse than the expected scaling, the inferred fidelity from a single XY gate may unlikely be overestimated.

Figure 14:
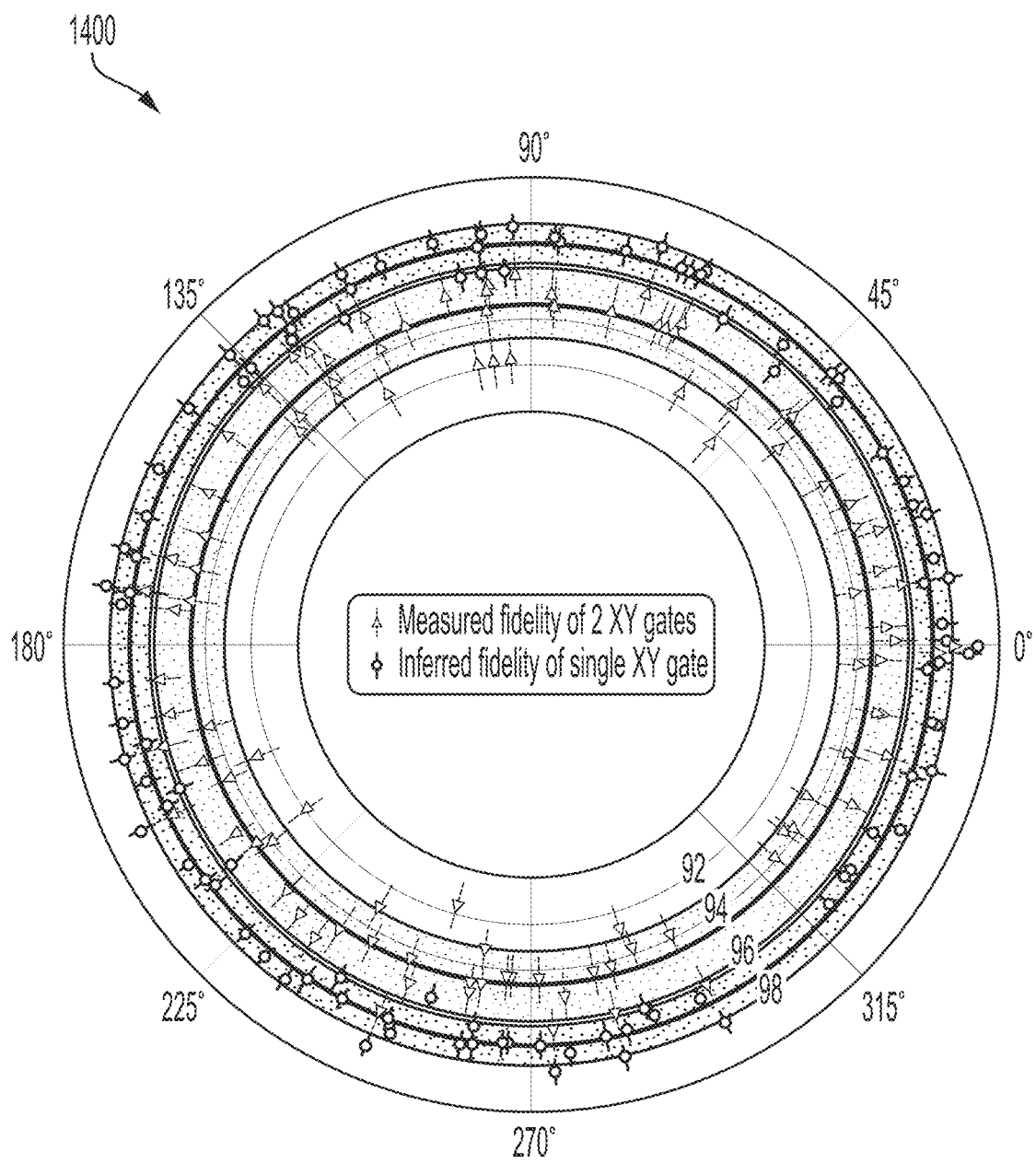
FIG. 14 is a polar plot showing fidelities of $XY(\theta)$ $XY(\pi-\theta)$ as a function of $\theta$ from interleaved randomized benchmarking (iRB) measurements interleaving two iSWAP gates with a single $XY(\theta)$ gate, and two $XY(\theta)$ gates, respectively.

FIG. 14 is a polar plot showing measured fidelities and inferred fidelities of an iSWAP gate with two XY(θ) gates as a function of the entangling angle θ. The measured fidelities are obtained from interleaved randomized benchmarking (iRB) measurements as discussed above in FIGS. 13A-13B. The inferred fidelities are obtained according to fidelities of each single XY(θ) gate. In some implementations, to verify that the two XY(θ) gates can be performed for arbitrary θ with a constant fidelity, iRB measurements can be performed on XY(θ)XY(π−θ) or in another manner. Data shown in FIG. 14 shows measured and inferred fidelities at multiple (e.g., 102) randomly chosen θ in a range of 0 and 2π. The inferred fidelities of a single XY(θ) gate is extracted by taking the square-root of the decay ratios $$\frac{p_{il}}{p}$$

(as described in FIG. 11). In some instances, errors in the inferred fidelities are associated with some average of the XY(θ) and XY(π−θ) errors. Guiding lines are plotted at the median of each distribution, with shaded regions representing the interquartile range. As shown in FIG. 14, the measured fidelities of the iSWAP gate with two XY(θ) gates are in a range of 95.70±0.59% to 99.01±0.15% and a median value of the measured fidelities is 97.36±0.17%. As shown in FIG. 14, there is no obvious correlation between the entangling angle θ and the fidelity. This observation confirms a constant gate fidelity independent of the entangling angle θ. In some implementations, the methods and systems presented here can be used for unlocking a full family of parametrically controllable entangling gates. In some implementations, the methods and systems presented here can hide cancelling coherent errors between the two XY gates, e.g., XY(θ) and XY(π−θ) gates.

At 1010, gate operating parameters are stored. Once all parameters needed to operate the gate are calibrated, including gate time, gate amplitude, gate frequency, relative phase between XY(π/2) pulses, relative phase between XY frame and single-qubit frames, and single-qubit RZ corrections, all the parameters are stored in a database in order to quickly retrieve them to perform a calibrated gate. For example, all the parameters can be stored in the pulse calibration database 250, 350 shown in FIGS. 2 and 3 which can be applied by the just-in-time compiler 220, 320 to provide parameters to operate the quantum logic gates in the native program.

At 1012, frame tracking is configured. Due to the physical nature of the XY interaction, in order to actually have the gate work as expected, the phases accumulated on each single-qubit reference frame are tracked and the phase of the XY pulse is updated to account for those single qubit phases. This is called frame tracking. In some instances, the frame tracking may be performed by a complier, a scheduler, or both. During frame tracking, relative timings of the flux pulses may be provided and a shift on all the relevant frames may be determined according to the relative timings. Frame tracking is done in software, but the result of this tracking is real updates of the entangling phases of the second flux pulse used to play the XY gate in hardware.

At 1014, the parametric XY gate only is played. In some implementations, the parametric two-qubit quantum logic gate, e.g., the XY gate, that can be decomposed into a sequence of quantum logic gates and implemented to a specific quantum processing unit, can be implemented on the qubits in the quantum processor before it can be accessed and used in compiling a quantum program. In some instances, some fixed parametric flux pulses can be played during operation 1014 relative to the frames calculated in the operation 1012.

In some implementations, when both the $XY(\theta)$ and CZ gates are available, it is possible to run algorithms such as Quantum Approximation Optimization Algorithm (QAOA) with a reduced number of gates. As a demonstration, both $XY(\theta)$ and CZ gates are calibrated between the pairs 0-1, 1-2, and 2-3, which are connected in a line and additionally take into account phase corrections that must be applied to spectator qubits for each gate due to crosstalk. The qubits can be used to map out a series of weighted MaxCut QAOA landscapes. A MaxCut problem seeks to partition a graph of vertices and edges into two sets such that the number of edges in each set is maximized. The encoding of the problem is given by a cost Hamiltonian. A QAOA seeks to find the ground state of the cost Hamiltonian by first preparing an equal superposition of all bit strings, and then evolving the system with the cost Hamiltonian followed by a driver Hamiltonian, which are parameterized by some angles $\gamma$ and $\beta$, respectively. Note that this $\beta$ is unrelated to the entangling phase of the XY gate discussed above. For the optimal choice of angles, the probability of sampling the bit string which corresponds to the ground state of the cost Hamiltonian increases with the number of alternating applications of the cost and driver Hamiltonians. In weighted MaxCut, each edge of the cost Hamiltonian is assigned a randomly chosen weight, making the QAOA landscape dependent on the choice of weights. In some implementation, the MaxCut landscape may be mapped out by sweeping the angles $\beta$ and $\gamma$ uniformly. Furthermore, the cost and driver Hamiltonians are applied a single time, a scenario for which the optimal angles are known.

In some implementations, two different weighted MaxCut graph topologies may be measured including one with four vertices connected in a ring (e.g., 4 edges) and one with four vertices all-to-all connectivity (e.g., 6 edges). The two different weighted MaxCut graph topologies are different from the actual connectivity of the four qubits that are used to perform the calculations, which are only connected in a line (0-1-2-3). When mapping the MaxCut graph topology onto the actual device topology, it becomes necessary to introduce SWAPs in the circuit in order to effectively achieve the connectivity required by the MaxCut problem FIG. 15A is a schematic diagram showing aspects of an example circuit mapped from a maximum cut (MaxCut) topology. As shown in FIG. 15A, the example circuit includes a QAOA circuit written in an arbitrary Quil program which is represented using controlled NOT (CNOT) gates. $w_i$ (i=1, 2, 3, 4) is the weight of the associated edge, and is chosen randomly when generating the example circuit. Due to the underlying mathematical nature of quantum programs, the arbitrary Quil program can be compiled into a much smaller set of quantum instructions, referred to as native Quil. As discussed in FIG. 2, when the arbitrary Quil program is received at the just-in-time compiler 220, it may use the parametric circuits database 260 to construct a native Quil program. When compiling the example circuit shown in FIG. 15A to reflect the actual gates available and the actual connectivity of the device, SWAPs can be added to account for the limited connectivity of the qubits, specifically for the final phase-gadget. When only CZ gates are available, the circuit can be compiled to a native Quil program using 10 CZ gates. However, when both the $XY(\theta)$ and CZ gates are available, the circuit can be compiled to a native Quil program using only 6 CZ gates and 2 $XY(\pi)$ gates, resulting in a gate count reduction of 20%.

FIG. 15B is a schematic diagram showing aspects of an example circuit mapped from a maximum cut (MaxCut) topology. As shown in FIG. 15B, the example circuit includes a QAOA circuit written in an arbitrary Quil program, which is represented using CNOT gates. $w_i$ (i=1, 2, 3, 4, 5, 6) is the weight of the associated edge, and is chosen randomly when generating the example circuit. In some implementations, since the connectivity of the actual qubits being used to run the circuit is more restricted than the MaxCut graph, SWAP gates may be introduced into the circuit in order to actually implement all of the required operations. When only CZ gates are available, FIG. 15B can be compiled to use 17 CZ gates. However, when both the $XY(\theta)$ and CZ gates are available, the circuit can be compiled to use only 7 CZ gates and 5 $XY(\pi)$ gates, giving a gate depth reduction of ~30%.

Figure 16:
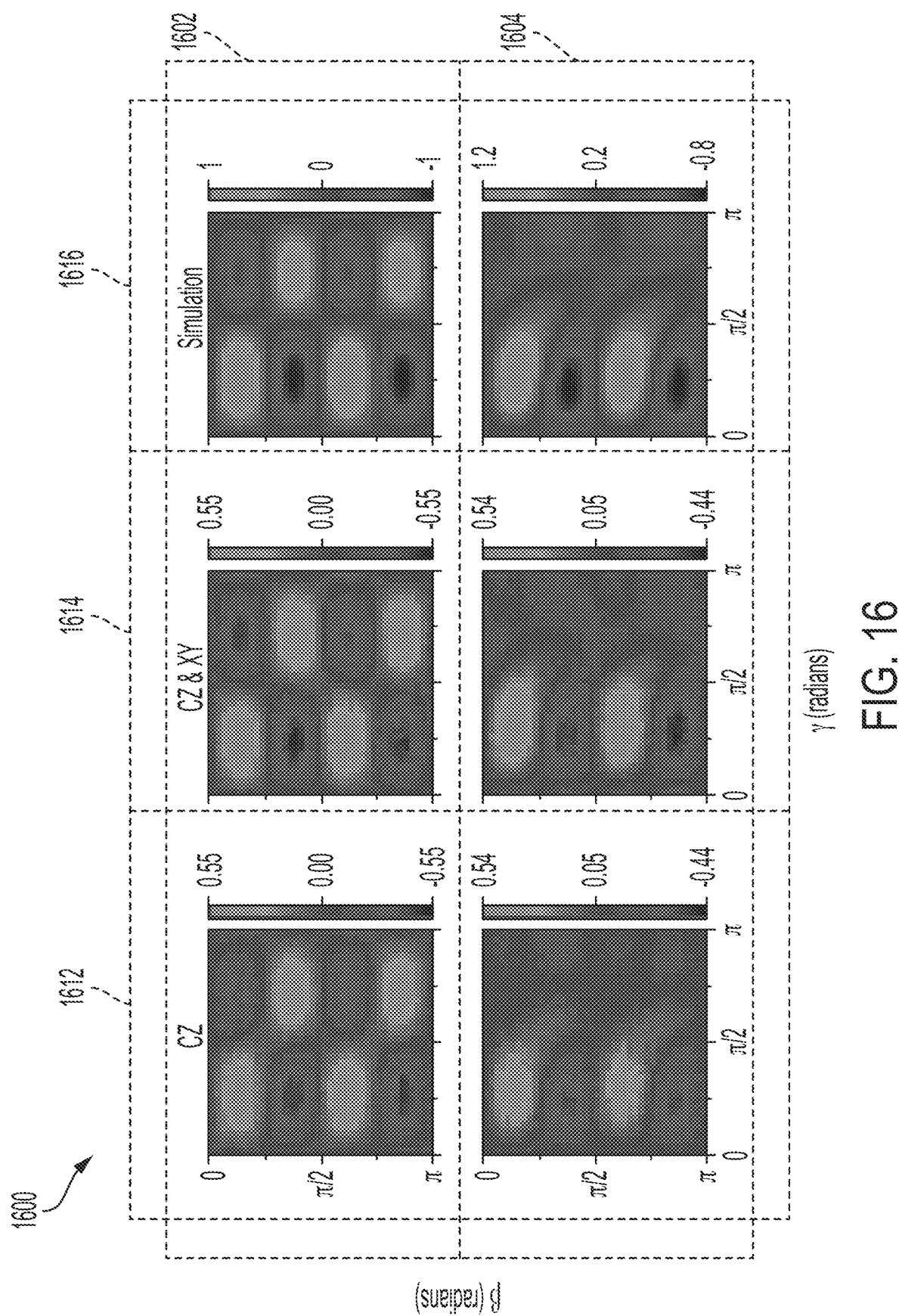
FIG. 16 is a plot showing bitstring cut weight as a function of respective phases ($\beta$, $\gamma$) of a single-qubit X rotation (RX) gate and a single-qubit Z rotation (RZ) on two example maximum cut (MaxCut) topologies.

FIG. 16 is weighted MaxCut QAOA landscapes showing bitstring cut weight as a function of respective angles ($\beta$, $\gamma$) on two example circuits shown in FIGS. 15A, 15B. The two example circuits are mapped from two maximum cut (MaxCut) topologies. Top row 1602 is the QAOA landscape on a graph of four edges connected in a ring. Bottom row 1604 is the QAOA landscape on a graph of four edges with all-to-all connectivity. The two example circuits may be compiled with both CZ and XY gates or with only CZ gates. Simulation results are also shown for comparison purposes. In both instances the problem is mapped to four qubits with line connectivity. Leftmost column 1612 is experimental data using only CZ gates. Middle column 1614 is experimental data using both CZ and XY gates. Rightmost column 1616 shows simulation data on noiseless qubits. All four experimental landscapes were taken with 5000 shots per angle pair.

The bitstring cut weight from the circuit compiled with both CZ and XY gates are similar to that from the circuit compiled using only the CZ gates in both the ring and the fully-connected problems (e.g., the top and bottom rows 1602, 1604). The circuit compiled with both CZ and XY gates has a lower gate depth, which may yield improvements in algorithm performance.

It is interesting to note that for the special case of combinatorial problems that can be mapped to a cost Hamiltonian consisting of a sum of two body terms (such as MaxCut), the availability of iSWAP in addition to CZ allows one to maintain the same two-qubit-gate count and circuit depth on qubits connected in a line as would be possible with the availability of all-to-all connectivity.

In some implementations, the decomposition methods presented here may be extended to other parametric multi-qubit quantum logic gate families, e.g., the CPHASE($\theta$) family, in which the excitation is exchanged between the $|11\rangle$ and $|02\rangle$ states of a pair of transmons. Similar results hold for the exchange between $|11\rangle$ and $|20\rangle$. This interaction is detailed in the Hamiltonian, which can be expressed as:

$$H_{XY,02}(\beta) = e^{i\beta}|11\rangle\langle 02| + e^{-i\beta}|02\rangle\langle 11|, \quad (13)$$

which allows for the unitary operation $$XY_{02}(\beta, \theta) = \exp\left[-i\frac{\theta}{2}H_{XY,02}(\beta)\right] \text{ and } XY_{02}(\theta) = XY_{02}(0, \theta).$$

In some implementations, a CZ gate can then be implemented as a $2\pi$ rotation in the $|11\rangle/|02\rangle$ subspace. A general CPHASE($\theta$) gate can be implemented as shown in FIG. 16A.

Figure 17A:
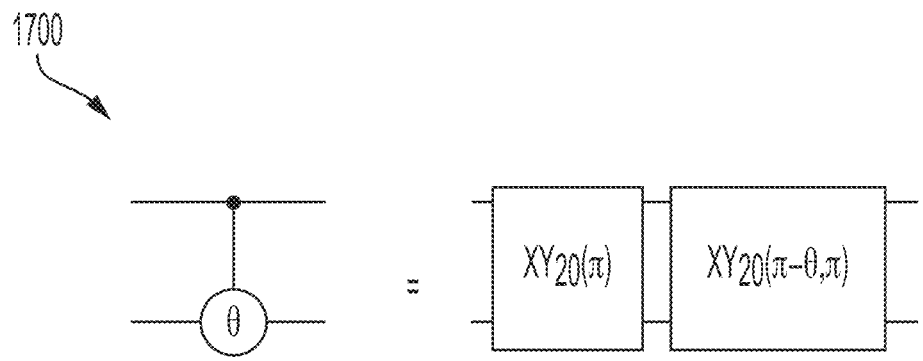
FIG. 17A is a schematic diagram showing an example equivalent circuit representation of CPHASE($\theta$) unitary using $XY(\theta)$ unitaries.

FIG. 17A is a schematic diagram showing an example equivalent circuit representation 1700 of a parametric two-qubit quantum logic gate, e.g., CPHASE($\theta$) gate using XY($\theta$) unitaries. The $\pi$–$\theta$ phase shift can be realized by changing the relative phase between the two flux pulses used to enact the $XY_{02}(\pi)$. Similar to the entire XY($\theta$) family can be implemented by calibrating a single $$XY\left(\frac{\pi}{2}\right)$$

gate and changing phases as discussed above in FIGS. 8A-8D, the entire CPHASE($\theta$) family can be implemented by calibrating a single $XY_{02}(\pi)$ gate and changing phases.

The combination of XY($\beta$, $\theta_1$) and CPHASE($\theta_2$), which can be implemented by tuning only $$XY\left(\frac{\pi}{2}\right)$$

and $XY_{02}(\pi)$, leads to the fSim ("fermionic simulation") family of gates, which are particularly useful in electronic structure calculations.

Figure 17B:
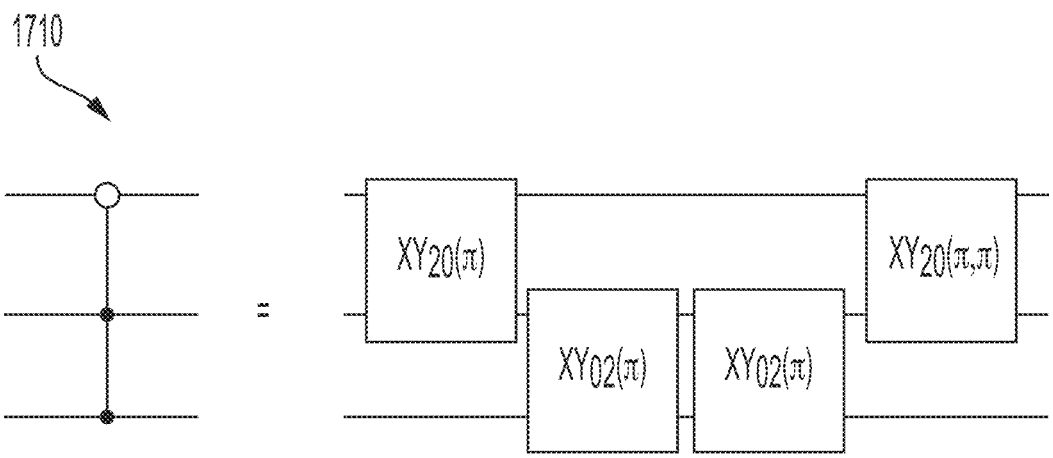
FIG. 17B is a schematic diagram showing an example equivalent circuit representation of CCPHASE($\pi$) unitary using $XY(\pi)$ unitaries.

FIG. 17B is a schematic diagram showing an example equivalent circuit representation 1710 of a parametric three-qubit quantum logic gate, e.g., a CCPHASE($\pi$) gate using XY($\pi$) gates. As shown in FIG. 17B, a Toffoli gate can also be implemented via a CCPHASE($\pi$) gate with only 4 applications of $XY_{02}(\beta,\pi)$ and/or $XY_{20}(\beta,\pi)$ interactions between three neighbouring transmons (in fact, three transmons arranged in a line) as shown in FIG. 17B. This allows us to use only three XY pulses with a constant entangling angle of $\pi$, instead of needing pulses with entanlging angles of $\pi$ and $3\pi$.

Figure 17C:
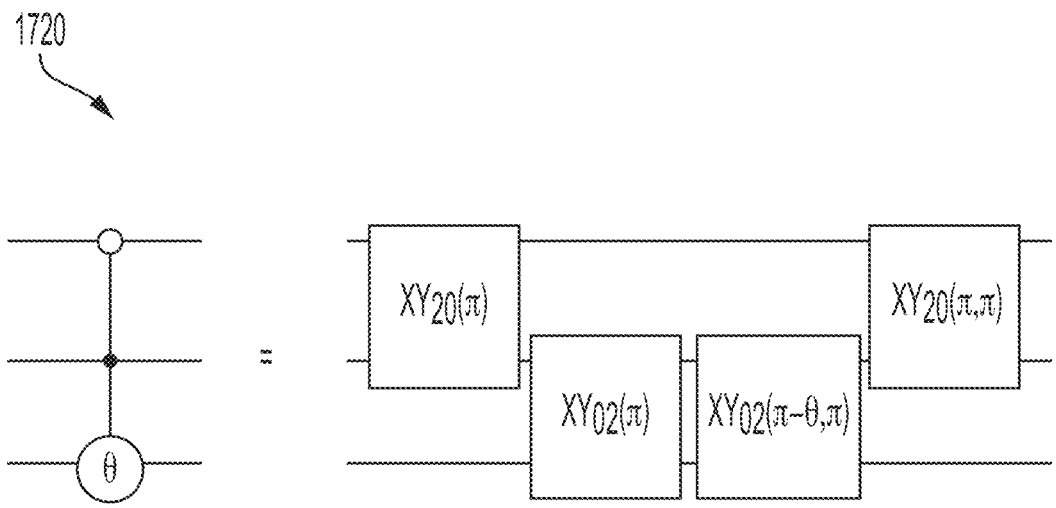
FIG. 17C is a schematic diagram showing an example equivalent circuit representation of CCPHASE($\theta$) unitary using $XY(\theta)$ unitaries.

FIG. 17C is a schematic diagram showing an example equivalent circuit representation 1720 of a parametric three-qubit quantum logic gate, e.g., a CCPHASE($\theta$) gate using XY($\theta$) gates. As shown in FIG. 17C, the whole CCPHASE ($\theta$) gate can be implemented with only 4 applications of $XY_{02}(\beta,\pi)$ and/or $XY_{20}(\beta, \pi)$.

These constructions generalize straightforwardly to more control qubits. The fidelity is expected to degrade due to enhanced relaxation and dephasing rates of the second excited state of the transmon, as well as due to additional error mechanisms (such as state population remaining outside the qubit manifold after an imperfect gate operation). These can be addressed by applying additional pulses to the transmons that may contain higher excitations. In some instances, a trade-off between the reduced circuit depth and the newly introduced error mechanisms can be considered. For example, a Toffoli gate requires as many as 6 CZ gates to be implemented on 3 qubits arranged in a triangle, and as many as 2 CZ gates and 6 iSWAP gates to be implemented on 3 qubits arranged in a line. In some implementations, the methods and systems described here can result in a 2-3 times reduction in the circuit depth for a Toffoli gate, and likely larger improvements for the more general CCPHASE (e.g., as high as 4-6 times). CCPHASE($\theta$) gates have been shown to be useful in proposed "quantum supremacy" demonstrations, and are also useful in quantum error correction in the absence of measurement.

These results further illustrate that an expressive gate set can have a significant impact on circuit depth, while remaining grounded in an implementation that allows for access to these continuous gate families by tuning up a very small number of actual pulses. The calibration of X($\beta$, $\pi/2$), XY($\beta$, $\pi/2$), $XY_{02}$ ($\beta$, $\pi$), and $X_{Y20}$ ($\beta$, $\pi$) (where the calibration is independent of the entangling phase $\beta$) gives access to all single-qubit rotations, the entire XY($\beta$, $\theta$) family, and the entire CPHASE($\theta$) family, with only two pulses each. These pulses further allow implementations of the entire CCPHASE($\theta$) family (including CCPHASE($\pi$), which is equivalent to a Toffoli gate) in only 4 pulses.

Some of the subject matter and operations described in this specification can be implemented in circuitry, computer software, firmware, or hardware, including the structures disclosed in this specification and their structural equivalents, or in combinations of one or more of them. Some of the subject matter described in this specification can be implemented as one or more computer programs, i.e., one or more modules of computer program instructions, encoded on a computer storage medium for execution by, or to control the operation of, a data-processing apparatus. A computer storage medium can be, or can be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially generated propagated signal. The computer storage medium can also be, or be included in, one or more separate physical components or media (e.g., multiple CDs, disks, or other storage devices).

Some of the operations described in this specification can be implemented as operations performed by a data processing apparatus on data stored on one or more computer-readable storage devices or received from other sources.

The term "data-processing apparatus" encompasses all kinds of apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them.

Some of the processes and logic flows described in this specification can be performed by one or more programmable processors executing one or more computer programs to perform actions by operating on input data and generating output. The processes and logic flows can also be performed by, and apparatus can also be implemented as, special purpose logic circuitry, e.g., an FPGA (field programmable gate array) or an ASIC (application specific integrated circuit).

In a general aspect, gates are formed for a quantum processor.

In a first example, an arbitrary program is received. The arbitrary program includes a first sequence of quantum logic gates, which includes a first parametric multi-qubit quantum logic gate. A native gate set is identified. The native gate set includes a set of quantum logic gates associated with a quantum processing unit. A second sequence of quantum logic gates corresponding to the first parametric multi-qubit quantum logic gate is identified. Each of the quantum logic gates in the second sequence is selected from the native gate set. The second sequence includes a second parametric quantum logic gate. A native program is generated. The native program includes a third sequence of quantum logic gates, which corresponds to the first sequence of quantum logic gates and includes the second sequence of quantum logic gates. The native program is provided for execution by the quantum processing unit.

Implementations of the first example may include one or more of the following features. When the second sequence is identified, a value based on the first parametric multi-qubit quantum logic gate is identified, and the value is assigned to a variable parameter of one or more of the quantum logic gates in the second sequence. Each of the first parametric multi-qubit quantum logic gate and the second parametric quantum logic gate is a first type of parametric multi-qubit quantum logic gate. The first type of parametric multi-qubit quantum logic gate includes a first variable parameter. The arbitrary program assigns a first value to the first variable parameter, and the native program assigns a second, different value to the first variable parameter. The first type of multi-qubit quantum logic gate includes the first variable parameter and a second variable parameter. The arbitrary program assigns a third value to the second variable parameter, and the native program assigns the third value to the second variable parameter. The second sequence of quantum logic gates further includes a parametric single-qubit quantum logic gate.

Implementations of the first example may include one or more of the following features. The second sequence of quantum logic gates includes a parametric multi-qubit quantum logic gate and parametric single-qubit rotation gates. When the second sequence of quantum logic gates is identified, rotation angles for the parametric single-qubit rotation gates are determined. The rotation angles for the parametric single-qubit rotation gates are determined by retrieving the rotation angles from a database. The quantum processing unit is configured to execute the parametric single-qubit rotation gates as frame adjustments. The second sequence of quantum logic gates is identified by decomposing, by operation of a just-in-time compiler, the first parametric multi-qubit quantum logic gate into the second sequence of quantum logic gates based on a predetermined parametric circuit database and a predetermined pulse calibration database.

Implementations of the first example may include one or more of the following features. The second sequence of quantum logic gates is identified by decomposing, by operation of a userland compiler, the first parametric multi-qubit quantum logic gate into the second sequence of quantum logic gates by executing a parametric decomposition process. When the native program is provided for execution by the quantum processing unit, the native program is sent to a computing environment that includes the quantum processing unit, and the computing environment includes a just-in-time compiler configured to apply a pulse calibration to the native program.

Implementations of the first example may include one or more of the following features. A binary program is generated based on the native program, and executed on the quantum processing unit. The quantum processing unit includes a superconducting quantum processor circuit, which includes a plurality of qubit devices. The second parametric quantum logic gate includes a two-qubit quantum logic gate applied to a pair of qubits defined by a tunable-frequency qubit device and a fixed-frequency qubit device. The second sequence of quantum logic gates includes at least one of: a single-qubit parametric rotation gate, a two-qubit parametric interaction gate, a controlled parametric rotation gate, or a controlled two-qubit parametric interaction. The second sequence of quantum logic gates further includes a non-parametric quantum logic gate. The first parametric multi-qubit quantum logic gate includes a first parametric two-qubit quantum logic gate, and the second parametric quantum logic gate includes a second parametric two-qubit quantum logic gate. The first parametric multi-qubit quantum logic gate includes an XY gate. The first parametric multi-qubit quantum logic gate includes a Controlled-Phase (CPHASE) gate. The first parametric multi-qubit quantum logic gate includes a Toffoli gate. The first parametric multi-qubit quantum logic gate includes a first parametric three-qubit quantum logic gate. The first parametric three-qubit quantum logic gate includes a Controlled-Controlled-Phase (CCPHASE) gate. The second sequence of quantum logic gates includes a plurality of parametric two-qubit quantum logic gates. The first parametric multi-qubit quantum logic gate includes a first parametric two-qubit quantum logic gate, and the second parametric quantum logic gate includes a parametric single-qubit quantum logic gate.

In a second example, a computing system includes a quantum processing unit and a compiler. The compiler is configured to receive an arbitrary program. The arbitrary program includes a first sequence of quantum logic gates, which includes a first parametric multi-qubit quantum logic gate. The compiler is configured to identify a native gate set including a set of quantum logic gates associated with the quantum processing unit. The compiler is configured to identify a second sequence of quantum logic gates corresponding to the first parametric multi-qubit quantum logic gate. Each of the quantum logic gates in the second sequence is selected from the native gate set, and the second sequence includes a second parametric quantum logic gate. The compiler is configured to generate a native program including a third sequence of quantum logic gates. The third sequence of quantum logic gates corresponds to the first sequence of quantum logic gates and includes the second sequence of quantum logic gates. The compiler is configured to provide the native program for execution by the quantum processing unit.

Implementations of the second example may include one or more of the following features. Each of the first parametric multi-qubit quantum logic gate and the second parametric quantum logic gate is a first type of parametric multi-qubit quantum logic gate. The first type of parametric multi-qubit quantum logic gate includes a first variable parameter. The arbitrary program assigns a first value to the first variable parameter, and the native program assigns a second, different value to the first variable parameter. The first type of multi-qubit quantum logic gate includes the first variable parameter and a second variable parameter. The arbitrary program assigns a third value to the second variable parameter, and the native program assigns the third value to the second variable parameter. The second sequence of quantum logic gates further includes a parametric single-qubit quantum logic gate. The second sequence of quantum logic gates includes a parametric multi-qubit quantum logic gate and parametric single-qubit rotation gates, and the compiler is configured to determine rotation angles for the parametric single-qubit rotation gates. The rotation angles are retrieved from a database. The quantum processing unit is configured to execute the parametric single-qubit rotation gates as frame adjustments.

Implementations of the second example may include one or more of the following features. The second sequence of quantum logic gates is identified by decomposing the first parametric multi-qubit quantum logic gate into the second sequence of quantum logic gates based on a predetermined parametric circuit database and a predetermined pulse calibration database. The computing system includes a control system, which is configured to generate a binary program based on the native program and execute the binary program on the quantum processing unit. The quantum processing unit includes a superconducting quantum processor circuit comprising a plurality of qubit devices. The second parametric quantum logic gate includes a two-qubit quantum logic gate applied to a pair of qubits, which are defined by a tunable-frequency qubit device and a fixed-frequency qubit device. The second sequence of quantum logic gates includes at least one of: a single-qubit parametric rotation gate, a two-qubit parametric interaction gate, a controlled parametric rotation gate, a controlled two-qubit parametric interaction gate.

Implementations of the second example may include one or more of the following features. The second sequence of quantum logic gates further includes a non-parametric quantum logic gate. The first parametric multi-qubit quantum logic gate includes a first parametric two-qubit quantum logic gate, and the second parametric quantum logic gate includes a second parametric two-qubit quantum logic gate. The first parametric multi-qubit quantum logic gate includes an XY gate. The first parametric multi-qubit quantum logic gate includes a Controlled-Phase (CPHASE) gate. The first parametric multi-qubit quantum logic gate includes a Toffoli gate. The first parametric multi-qubit quantum logic gate includes a first parametric three-qubit quantum logic gate. The first parametric three-qubit quantum logic gate includes a Controlled-Controlled-Phase (CCPHASE) gate. The second sequence of quantum logic gates includes a plurality of parametric two-qubit quantum logic gates. The first parametric multi-qubit quantum logic gate includes a first parametric two-qubit quantum logic gate, and the second parametric quantum logic gate includes a parametric single-qubit quantum logic gate.

In a third example, an arbitrary program is received. The arbitrary program includes a first sequence of quantum logic gates, which includes a parametric XY gate. A native gate set is identified. The native gate set includes a set of quantum logic gates associated with a quantum processing unit. A second sequence of quantum logic gates corresponding to the parametric XY gate is identified. Each of the quantum logic gates in the second sequence is selected from the native gate set. The second sequence includes a parametric quantum logic gate. A native program is generated. The native program includes a third sequence of quantum logic gates. The third sequence of quantum logic gates corresponds to the first sequence of quantum logic gates and includes the second sequence of quantum logic gates. The native program is provided for execution by the quantum processing unit.

Implementations of the third example may include one or more of the following features. When the second sequence is identified, a value of a variable parameter specified by the parametric XY gate is determined; and the value is assigned to a variable parameter of one or more of the quantum logic gates in the second sequence. When the second sequence of quantum logic gates is identified, the parametric XY gate is decomposed, by operation of a just-in-time compiler, into the second sequence of quantum logic gates based on a predetermined parametric circuit database and a predetermined pulse calibration database. The second sequence of quantum logic gates includes two $\sqrt{iSWAP}$ gates and parametric single-qubit rotation gates, and identifying the second sequence of quantum logic gates includes determining rotation angles for the parametric single-qubit rotation gates. Each of the two $\sqrt{iSWAP}$ gates is applied on a pair of qubits defined by a tunable-frequency qubit device and a fixed-frequency qubit device in the quantum processor unit.

Implementations of the third example may include one or more of the following features. The two $\sqrt{iSWAP}$ gates include a first $\sqrt{iSWAP}$ gate and a second $\sqrt{iSWAP}$ gate, and the predetermined calibration database includes values determined by performing a calibration process. In the calibration process, the first $\sqrt{iSWAP}$ gate is calibrated. The second sequence of quantum logic gates corresponding to the parametric XY gate is identified. Corrections for the parametric single-qubit rotation gates are calibrated. Relative phases of the two $\sqrt{iSWAP}$ gates are calibrated. The corrections and the relative phases are stored in the predetermined pulse calibration database. To calibrate the relative phases of the two $\sqrt{iSWAP}$ gates, first relative phases of the two $\sqrt{iSWAP}$ gates are calibrated; and second relative phases between each of the two $\sqrt{iSWAP}$ gates and each of the parametric single-qubit rotation gates are calibrated. To calibrate the first $\sqrt{iSWAP}$ gate, a flux pulse to the tunable-frequency qubit device is applied; and a resonance condition is determined by sweeping at least one of frequency, amplitude or duration of the flux pulse applied on the tunable-frequency qubit device. Frame tracking is performed by determining accumulated phases on reference frames of the parametric single-qubit rotation gates. To generate the native program, an entangling phase of the second $\sqrt{iSWAP}$ gate is updated according to the accumulated phases.

Implementations of the third example may include one or more of the following features. A binary program is generated based on the native program, and the binary program is executed on the quantum processor unit. The quantum processor unit includes a superconducting quantum processor circuit, which includes a plurality of qubit devices. The second sequence of quantum logic gates further includes a non-parametric quantum logic gate. The second sequence of quantum logic gates includes a plurality of parametric two-qubit quantum logic gates.

In a fourth example, a computing system includes a quantum processing unit and one or more computing devices. The one or more computing devices are configured to receive an arbitrary program including a first sequence of quantum logic gates. The first sequence includes a parametric XY gate. A native gate set is identified, which includes a set of quantum logic gates associated with the quantum processing unit. A second sequence of quantum logic gates corresponding to the parametric XY gate is identified. Each of the quantum logic gates in the second sequence is selected from the native gate set. The second sequence includes a parametric quantum logic gate. A native program is generated, which includes a third sequence of quantum logic gates. The third sequence of quantum logic gates corresponds to the first sequence of quantum logic gates and includes the second sequence of quantum logic gates. The native program is provided for execution by the quantum processing unit.

Implementations of the fourth example may include one or more of the following features. The one or more computing devices are configured to determine a value of a variable parameter specified by the parametric XY gate; and to assign the value to a variable parameter of one or more of the quantum logic gates in the second sequence. The one or more computing devices include a just-in-time compiler which is configured to decompose the parametric XY gate into the second sequence of quantum logic gates based on a predetermined parametric circuit database and a predetermined pulse calibration database. The second sequence of quantum logic gates includes two $\sqrt{\text{iSWAP}}$ gates and parametric single-qubit rotation gates. To identify the second sequence of quantum logic gates, rotation angles are determined for the parametric single-qubit rotation gates. Each of the two $\sqrt{\text{iSWAP}}$ gates is applied on a pair of qubits defined by a tunable-frequency qubit device and a fixed-frequency qubit device in the quantum processor unit.

Implementations of the fourth example may include one or more of the following features. The two $\sqrt{\text{iSWAP}}$ gates include a first $\sqrt{\text{iSWAP}}$ gate and a second $\sqrt{\text{iSWAP}}$ gate. The one or more computing devices are configured to perform a calibration process to determine values in the predetermined calibration database. To perform the calibration process, the first $\sqrt{\text{iSWAP}}$ gate is calibrated; the second sequence of quantum logic gates corresponding to the parametric XY gate is identified; corrections for the parametric single-qubit rotation gates are calibrated; relative phases of the two $\sqrt{\text{iSWAP}}$ gates are calibrated; and the corrections and the relative phases are stored in the predetermined pulse calibration database. The one or more computing devices are configured to calibrate first relative phases of the two $\sqrt{\text{iSWAP}}$ gates; and calibrate second relative phases between each of the two $\sqrt{\text{iSWAP}}$ gates and each of the parametric single-qubit rotation gates. The one or more computing devices are configured to apply a flux pulse to the tunable-frequency qubit device; and determine a resonance condition by sweeping at least one of frequency, amplitude, or duration of the flux pulse applied on the tunable-frequency qubit device. The one or more computing devices are configured to perform frame tracking by determining accumulated phases on reference frames of the parametric single-qubit rotation gates. The one or more computing devices are configured to update an entangling phase of the second $\sqrt{\text{iSWAP}}$ gate according to the accumulated phases.

Implementations of the fourth example may include one or more of the following features. The one or more computing devices are configured to generate a binary program based on the native program and execute the binary program on the quantum processor unit. The quantum processor unit includes a superconducting quantum processor circuit which includes a plurality of qubit devices. The second sequence of quantum logic gates further includes a non-parametric quantum logic gate. The second sequence of quantum logic gates includes a plurality of parametric two-qubit quantum logic gates.

In a fifth example, a first flux pulse is calibrated. A sequence of quantum logic gates corresponding to a parametric XY gate is identified. The sequence includes the first flux pulse, a second flux pulse, and parametric single-qubit rotation gates. Corrections for the parametric single-qubit rotation gates are calibrated. Relative phases of the first and second flux pulses are calibrated. The corrections and the relative phases are stored in a database. Frame tracking is performed by determining accumulated phases on reference frames of the parametric single-qubit rotation gates.

Implementations of the fifth example may include one or more of the following features. Each of the first and second flux pulses includes an $\sqrt{\text{iSWAP}}$ gate. When calibrating the relative phases of the first and second flux pulses, first relative phases of the first and second flux pulses are calibrated. Second relative phases between each of the first and second flux pulses and each of the parametric single-qubit rotation gates are calibrated. When the first flux pulse is calibrated, the first flux pulse is applied to the tunable-frequency qubit device; and a resonance condition is determined by sweeping at least one of frequency, amplitude, or duration of the first flux pulse applied on the tunable-frequency qubit device. An entangling phase of the second flux pulse is updated according to the accumulated phases.

While this specification contains many details, these should not be understood as limitations on the scope of what may be claimed, but rather as descriptions of features specific to particular examples. Certain features that are described in this specification or shown in the drawings in the context of separate implementations can also be combined. Conversely, various features that are described or shown in the context of a single implementation can also be implemented in multiple embodiments separately or in any suitable sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single product or packaged into multiple products.

A number of embodiments have been described. Nevertheless, it will be understood that various modifications can be made. Accordingly, other embodiments are within the scope of the following claims.

What is claimed is:

1. A computing method comprising:
  receiving an arbitrary program comprising a first sequence of quantum logic gates, the first sequence comprising a parametric XY gate;
  identifying a native gate set comprising a set of quantum logic gates associated with a quantum processor unit;

identifying a second sequence of quantum logic gates corresponding to the parametric XY gate, each of the quantum logic gates in the second sequence being selected from the native gate set, the second sequence comprising a parametric quantum logic gate;

generating a native program comprising a third sequence of quantum logic gates, the third sequence of quantum logic gates corresponding to the first sequence of quantum logic gates and comprising the second sequence of quantum logic gates; and providing the native program for execution by the quantum processor unit.

2. The method of claim 1, wherein identifying the second sequence comprises:

determining a value of a variable parameter specified by the parametric XY gate; and assigning the value to a variable parameter of one or more of the quantum logic gates in the second sequence.

3. The method of claim 1, wherein identifying the second sequence of quantum logic gates comprises:

decomposing, by operation of a just-in-time compiler, the parametric XY gate into the second sequence of quantum logic gates based on a predetermined parametric circuit database and a predetermined pulse calibration database.

4. The method of claim 3, wherein the second sequence of quantum logic gates comprises two $\sqrt{iSWAP}$ gates and parametric single-qubit rotation gates, and identifying the second sequence of quantum logic gates comprises determining rotation angles for the parametric single-qubit rotation gates.

5. The method of claim 4, wherein each of the two $\sqrt{iSWAP}$ gates is applied on a pair of qubits defined by a tunable-frequency qubit device and a fixed-frequency qubit device in the quantum processor unit.

6. The method of claim 4, wherein the two $\sqrt{iSWAP}$ gates comprise a first $\sqrt{iSWAP}$ gate and a second $\sqrt{iSWAP}$ gate, and the predetermined calibration database comprises values determined by performing a calibration process comprising:

calibrating the first $\sqrt{iSWAP}$ gate;

identifying the second sequence of quantum logic gates corresponding to the parametric XY gate;

calibrating corrections for the parametric single-qubit rotation gates;

calibrating relative phases of the two $\sqrt{iSWAP}$ gates; and storing the corrections and the relative phases in the predetermined pulse calibration database.

7. The method of claim 6, wherein calibrating the relative phases of the two $\sqrt{iSWAP}$ gates comprises calibrating first relative phases of the two $\sqrt{iSWAP}$ gates, and the calibration process further comprises:

calibrating second relative phases between each of the two $\sqrt{iSWAP}$ gates and each of the parametric single-qubit rotation gates.

8. The method of claim 6, wherein calibrating the first $\sqrt{iSWAP}$ gate comprises:

applying a flux pulse to the tunable-frequency qubit device; and determining a resonance condition by sweeping at least one of frequency, amplitude or duration of the flux pulse applied on the tunable-frequency qubit device.

9. The method of claim 6, comprising:

performing frame tracking by determining accumulated phases on reference frames of the parametric single-qubit rotation gates.

10. The method of claim 9, wherein generating the native program comprises:

updating an entangling phase of the second $\sqrt{iSWAP}$ gate according to the accumulated phases.

11. The method of claim 1, further comprising generating a binary program based on the native program, and executing the binary program on the quantum processor unit.

12. The method of claim 1, wherein the quantum processor unit comprises a superconducting quantum processor circuit comprising a plurality of qubit devices.

13. The method of claim 1, wherein the second sequence of quantum logic gates further comprises a non-parametric quantum logic gate.

14. The method of claim 1, wherein the second sequence of quantum logic gates comprises a plurality of parametric two-qubit quantum logic gates.

15. A computing system comprising:

a quantum processor unit; and one or more computing devices configured to:

receive an arbitrary program comprising a first sequence of quantum logic gates, the first sequence comprising a parametric XY gate;

identify a native gate set comprising a set of quantum logic gates associated with the quantum processor unit;

identify a second sequence of quantum logic gates corresponding to the parametric XY gate, each of the quantum logic gates in the second sequence being selected from the native gate set, the second sequence comprising a parametric quantum logic gate;

generate a native program comprising a third sequence of quantum logic gates, the third sequence of quantum logic gates corresponding to the first sequence of quantum logic gates and comprising the second sequence of quantum logic gates; and provide the native program for execution by the quantum processor unit.

16. The system of claim 15, wherein the one or more computing devices are configured to:

determine a value of a variable parameter specified by the parametric XY gate; and assign the value to a variable parameter of one or more of the quantum logic gates in the second sequence.

17. The system of claim 15, wherein the one or more computing devices comprise a just-in-time compiler configured to:

decompose the parametric XY gate into the second sequence of quantum logic gates based on a predetermined parametric circuit database and a predetermined pulse calibration database.

18. The system of claim 17, wherein the second sequence of quantum logic gates comprises two $\sqrt{iSWAP}$ gates and parametric single-qubit rotation gates, and identifying the second sequence of quantum logic gates comprises determining rotation angles for the parametric single-qubit rotation gates.

19. The system of claim 18, wherein each of the two $\sqrt{iSWAP}$ gates is applied on a pair of qubits defined by a tunable-frequency qubit device and a fixed-frequency qubit device in the quantum processor unit.

20. The system of claim 18, wherein the two $\sqrt{iSWAP}$ gates comprise a first $\sqrt{iSWAP}$ gate and a second $\sqrt{iSWAP}$ gate, and the one or more computing devices are configured to perform a calibration process to determine values in the predetermined calibration database, the calibration process comprising:

calibrating the first $\sqrt{\mathrm{iSWAP}}$ gate;
identifying the second sequence of quantum logic gates corresponding to the parametric XY gate;
calibrating corrections for the parametric single-qubit rotation gates;
calibrating relative phases of the two $\sqrt{\mathrm{iSWAP}}$ gates; and
storing the corrections and the relative phases in the predetermined pulse calibration database.

21. The system of claim 20, wherein the one or more computing devices are configured to:
   calibrate first relative phases of the two $\sqrt{\mathrm{iSWAP}}$ gates; and
   calibrate second relative phases between each of the two $\sqrt{\mathrm{iSWAP}}$ gates and each of the parametric single-qubit rotation gates.

22. The system of claim 20, wherein the one or more computing devices are configured to:
   apply a flux pulse to the tunable-frequency qubit device; and
   determine a resonance condition by sweeping at least one of frequency, amplitude or duration of the flux pulse applied on the tunable-frequency qubit device.

23. The system of claim 20, wherein the one or more computing devices are configured to:
   perform frame tracking by determining accumulated phases on reference frames of the parametric single-qubit rotation gates.

24. The system of claim 23, wherein the one or more computing devices are configured to:
   update an entangling phase of the second $\sqrt{\mathrm{iSWAP}}$ gate according to the accumulated phases.

25. The system of claim 15, wherein the one or more computing devices are configured to:
   generate a binary program based on the native program, and execute the binary program on the quantum processor unit.

26. The system of claim 15, wherein the quantum processor unit comprises a superconducting quantum processor circuit comprising a plurality of qubit devices.

27. The system of claim 15, wherein the second sequence of quantum logic gates further comprises a non-parametric quantum logic gate.

28. The system of claim 15, wherein the second sequence of quantum logic gates comprises a plurality of parametric two-qubit quantum logic gates.

29. A method comprising:
   calibrating a first flux pulse;
   identifying a sequence of quantum logic gates corresponding to a parametric XY gate, the sequence comprising the first flux pulse, a second flux pulse, and parametric single-qubit rotation gates;
   calibrating corrections for the parametric single-qubit rotation gates;
   calibrating relative phases of the first and second flux pulses;
   storing the corrections and the relative phases in a database; and
   performing frame tracking by determining accumulated phases on reference frames of the parametric single-qubit rotation gates.

30. The method of claim 29, wherein each of the first and second flux pulses comprises a $\sqrt{\mathrm{iSWAP}}$ gate.

31. The method of claim 29, wherein calibrating the relative phases of the first and second flux pulses comprises calibrating first relative phases of the first and second flux pulses, and the calibration process further comprises:
   calibrating second relative phases between each of the first and second flux pulses and each of the parametric single-qubit rotation gates.

32. The method of claim 29, wherein calibrating the first flux pulse comprises:
   applying the first flux pulse to the tunable-frequency qubit device; and
   determining a resonance condition by sweeping at least one of frequency, amplitude, or duration of the first flux pulse applied on the tunable-frequency qubit device.

33. The method of claim 29, comprising:
   updating an entangling phase of the second flux pulse according to the accumulated phases.

* * * * *

UNITED STATES PATENT AND TRADEMARK OFFICE
CERTIFICATE OF CORRECTION

PATENT NO. : 11,562,284 B1
APPLICATION NO. : 17/074124
DATED : January 24, 2023
INVENTOR(S) : Ryan et al.

It is certified that error appears in the above-identified patent and that said Letters Patent is hereby corrected as shown below:

On the Title Page

Page 2, Column 1, item (56) Lines 11-12, delete "alectrodynamics"." and insert -- electrodynamics", -- therefor.

Page 2, Column 2, item (56) Line 51, delete "conficence" and insert -- confidence -- therefor.

Page 3, Column 2, item (56) Line 8, delete "uniersal" and insert -- universal -- therefor.

In the Specification

Column 1, Line 56, after "(RZ)", insert -- . --.

Column 1, Line 63, after "(iRB)", insert -- . --.

Column 22, Line 61, delete "504" and insert -- 500 -- therefor.

Column 23, Line 6, delete "iSWAP" and insert -- $\sqrt{\text{iSWAP}}$ -- therefor.

Column 26, Line 19, delete "504." and insert -- 500. -- therefor.

Column 26, Line 30, delete "504." and insert -- 502. -- therefor.

Column 26, Line 33, delete "504" and insert -- 502 -- therefor.

Column 26, Line 57, delete "(f$_{oi}$)" and insert -- $(f_{01})$ -- therefor.

Column 27, Line 23, delete "504" and insert -- 500 -- therefor.

Signed and Sealed this
Eleventh Day of April, 2023

Katherine Kelly Vidal
*Director of the United States Patent and Trademark Office*

CERTIFICATE OF CORRECTION (continued)

Column 27, Line 43, delete "quibit" and insert -- qubit -- therefor.

Column 27, Line 53, delete "$t_{rice}<t<t_{rise}+\tau$" and insert -- $t_{rise} < t < t_{rise} + \tau$ -- therefor.

Column 27, Line 63, after "phase", insert -- β -- therefor.

Column 27, Lines 66-67, delete "$H_{int}(t)=ge^{i\Delta(t)}|01\rangle\rangle|01|+H.c.,$" and insert -- $H_{\text{int}}(t) = ge^{i\Delta(t)}|01\rangle\langle 10| + \text{H.c.},$ -- therefor.

Column 28, Line 9, delete "$|00\rangle \leftrightarrows |11\rangle$" and insert -- $|00\rangle \leftrightarrow |11\rangle$ -- therefor.

Column 28, Line 67, delete "$e^{-H_{eff}t}$" and insert -- $e^{-iH_{\text{eff}}t}$ -- therefor.

Column 29, Line 49, after "phase", insert -- β -- therefor.

Column 29, Line 64, delete "512, 512" and insert -- 512, 514 -- therefor.

Column 31, Line 49, delete "FIG. 820C," and insert -- FIG. 8C, -- therefor.

Column 33, Line 58, delete "504" and insert -- 500 -- therefor.

Column 35, Line 26, delete "$\langle (ZI\langle -\rangle IZ\rangle$" and insert -- $\langle ZI\rangle - \langle IZ\rangle$ -- therefor.

Column 36, Line 63, delete "fidelites" and insert -- fidelities -- therefor.

Column 40, Line 4, after "problem", insert -- . --.

Column 41, Line 16, delete "$H_{XY,02}(\beta)=e^{i\beta}|11\rangle\langle 02|+e^{-i\beta}|02\rangle\langle 11|,$" and insert -- $H_{XY,02}(\beta) = e^{i\beta}|11\rangle\langle 02| + e^{-i\beta}|02\rangle\langle 11|$ -- therefor.

Column 41, Line 62, delete "entanlging" and insert -- entangling -- therefor.

Column 42, Line 29, delete "$X_{Y20}$" and insert -- $XY_{20}$ -- therefor.